(12) United States Patent
Mori et al.

(10) Patent No.: US 7,690,109 B2
(45) Date of Patent: Apr. 6, 2010

(54) METHOD OF MANUFACTURING A MULTILAYER WIRING BOARD

(75) Inventors: Toshiaki Mori, Shinjuku-ku (JP);
Kazunori Nakamura, Shinjuku-ku (JP);
Satoru Kuramochi, Shinjuku-ku (JP);
Miyuki Akazawa, Shinjuku-ku (JP);
Koichi Nakayama, Shinjuku-ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 422 days.

(21) Appl. No.: 11/410,984

(22) Filed: Apr. 26, 2006

(65) Prior Publication Data
US 2006/0185141 A1 Aug. 24, 2006

Related U.S. Application Data

(62) Division of application No. 10/497,536, filed as application No. PCT/JP03/15777 on Dec. 10, 2003, now Pat. No. 7,091,589.

(30) Foreign Application Priority Data

Dec. 11, 2002 (JP) ............................ 2002-358844
Jun. 10, 2003 (JP) ............................ 2003-165066

(51) Int. Cl.
*H01K 3/10* (2006.01)

(52) U.S. Cl. ............................ 29/852; 29/825; 29/829; 29/830; 29/846; 257/E23.062; 257/E23.067; 427/99.3

(58) Field of Classification Search .................. 29/852, 29/825, 829, 830, 846, 877, 878; 174/261, 174/262, 264; 257/686, 703, E23.062, E23.067; 427/98.2, 99.3
See application file for complete search history.

(56) References Cited

U.S. PATENT DOCUMENTS

| | | | | |
|---|---|---|---|---|
| 4,323,593 A | * | 4/1982 | Tsunashima | ............... 427/98.3 |
| 4,446,188 A | | 5/1984 | Patel et al. | |
| 5,268,194 A | * | 12/1993 | Kawakami et al. | ......... 427/98.2 |
| 6,388,202 B1 | * | 5/2002 | Swirbel et al. | ............... 174/261 |

(Continued)

FOREIGN PATENT DOCUMENTS

JP 7-030225 1/1995

(Continued)

OTHER PUBLICATIONS

U.S. Appl. No. 11/837,763, filed Aug. 13, 2007, Kuramochi, et al.

*Primary Examiner*—Thiem Phan
(74) *Attorney, Agent, or Firm*—Oblon, Spivak, McClelland, Maier & Neustadt, L.L.P.

(57) ABSTRACT

In a multilayer wiring board comprising a core board, and a wiring layer and an electrically insulating layer that are stacked on one surface of said core board, a thermal expansion coefficient of said core board in XY directions falls within a range of 2 to 20 ppm, a core member for said core board is a core member selected from silicon, ceramics, glass, a glass-epoxy composite, and metal, said core board is provided with a plurality of through holes that are made conductive between the front and the back by a conductive material, and a capacitor is provided on one surface of said core board, wherein said capacitor comprises an upper electrode being the conductive material in said through hole, and a lower electrode disposed so as to confront said upper electrode via a dielectric layer.

9 Claims, 32 Drawing Sheets

U.S. PATENT DOCUMENTS

| | | |
|---|---|---|
| 6,465,084 B1 | 10/2002 | Curcio et al. |
| 2001/0032700 A1 | 10/2001 | Nishii et al. |
| 2002/0159243 A1 | 10/2002 | Ogawa et al. |

FOREIGN PATENT DOCUMENTS

| | | |
|---|---|---|
| JP | 9-283884 | 10/1997 |
| JP | 11-340226 | 12/1999 |
| JP | 2000-165052 | 6/2000 |
| JP | 2001-015928 | 1/2001 |
| JP | 2001-257474 | 9/2001 |
| JP | 2002-141626 | 5/2002 |

\* cited by examiner

METHOD OF MANUFACTURING A MULTILAYER WIRING BOARD

CROSS-REFERENCE TO RELATED APPLICATIONS

The present application is a divisional of U.S. application Ser. No. 10/497,536 now U.S. Pat. No. 7,091,589, filed Jun. 10, 2004, which is a 371 of PCT/JP03/15777 filed on Dec. 10, 2003, and in turn claims priority to JP 2002-358844 filed in the Japan Patent Office on Dec. 11, 2002 and JP 2003-165066 filed in the Japan Patent Office on Jun. 10, 2003, the entire contents of each of which are hereby incorporated herein by reference.

TECHNICAL FIELD

The present invention relates to a multilayer wiring board and a manufacture method thereof and, in particular, relates to a multilayer wiring board formed with high density wiring for mounting a semiconductor chip, and a manufacture method for manufacturing such a multilayer wiring board. Further, the present invention relates to a capacitor built-in multilayer wiring board, particularly a multilayer wiring board that can optionally set a position and a size of a capacitor, and a manufacture method thereof.

BACKGROUND ART

In recent years, in the progress toward higher functions, reduction in size, and reduction in weight of electronic devices, there have been requests for reduction in size, increase in number of pins, and finer pitches of external terminals, with respect to semiconductor packages, so that demands for high density wiring boards have been increasing more and more. To this end, LSIs have been directly mounted on printed wiring boards, or CSP (Chip Size Package) or BGA (Ball Grid Array) has been mounted on printed wiring boards. And, for coping with higher densification, multilayer wiring boards produced by a buildup wiring technique wherein wiring layers and vias are stacked in multilayers on a board, serving as a core, via electrically insulating layers one by one, have been used as printed wiring boards.

The multilayer wiring board is provided with through holes each electrically connecting between conductors on upper and lower sides of the board, and uses, as a core board, a double-sided board having low density wiring produced by the subtractive method or the additive method and then multilayered. However, the conventional through hole is formed by drilling so that there is limitation about a hole diameter in view of dimensional minimization, and further, it is a penetrating hole, and therefore, there has been a problem that, in the multilayer board, the hole not only connects between the desired two conductors, but also perforates a conductor layer of another portion, which is primarily unrequited, and therefore, wiring can not be formed at that portion to limit the degree of freedom for wiring design. Further, the electrical connection by means of plating inside the through hole has raised a problem in reliability following reduction in conductor line width.

In view of this, various wiring methods have been proposed and carried out as manufacture methods of core boards, and multilayer wiring boards obtained by forming wiring layers on these core boards have been used (e.g. Laid-open Unexamined Patent Publication No. H5-144978, and Laid-open Unexamined Patent Publication No. H11-345933).

However, along with the dimensional minimization and the narrowing of pitches of wiring of the core boards, finer line widths have been required also for wiring of multilayer wiring layers provided on the core boards by the buildup method, so that demands for the narrowing of pitches and the high density wiring have been increasing more and more. Consequently, there has been a problem that the multilayer wiring boards formed with the wiring layers on the known conventional core boards by the conventional process can not cope with the demands for dimensional minimization for required electrical properties and high density wiring.

Further, following the high density mounting caused by the narrowing of pitches and the increase in number of pins, for electrical connection between wiring boards and semiconductor chips or the like, the flip chip technique for face-down mounting the semiconductor chip, or the like has been used instead of the conventional wire bonding technique. In the multilayer wiring boards using the flip chip technique, there has been a problem that if void portions remain at through holes connecting between boards, occurrence of cracks or disconnection due to thermal shock is liable to be induced, thereby to lower the reliability.

Further, there has been a problem that, following reduction in hole diameter of the through holes for the high density mounting, a diameter of a land provided at an opening portion of the through hole is also reduced, so that wiring connection between wiring boards becomes difficult. Further, there has also been a problem that, upon semiconductor chip mounting where solder bumps are formed on the board, since mounting pads are small, it becomes difficult to supply solder to the small-diameter pads.

On the other hand, in recent years, with respect to semiconductor chips, in the progress of higher densification of integrated circuit elements such as ICs and LSIs (hereinafter, collectively referred to as LSI), the operation speeds thereof have been increasing every year. There is a problem that when the operation speed of LSI increases, switching noise generated inside the semiconductor chip causes an operation failure of LSI. For reducing the switching noise, it is effective to dispose a capacitor between a power bus line and a grounding bus line.

If capacitors are disposed on a wiring board as external components, connection distances between these components and a semiconductor chip become long to cause a large wiring inductance, so that the effect of the capacitors becomes insufficient. Therefore, the capacitor is required to be located as close to LSI as possible, and is desired to be directly formed on the semiconductor chip. However, in this case, an area of the semiconductor chip increases to raise cost. Further, since the manufacturing process becomes complicated and long, there has been a problem that the yield of semiconductor chips themselves is lowered due to failure of capacitors.

For coping with these problems, it has been proposed to incorporate capacitors in an intermediate board (interposer or semiconductor chip carrier) that is used when mounting a semiconductor chip onto a wiring board (e.g. Laid-open Unexamined Patent Publication No. H8-148595 or Laid-open Unexamined Patent Publication No. 2001-326298).

Alternatively, there has been proposed a method of incorporating capacitors in a multilayer wiring layer stacked on a core board (e.g. Laid-open Unexamined Patent Publication No. H7-30258).

However, a semiconductor device shown in Laid-open Unexamined Patent Publication No. H8-148595 is configured that a chip carrier made of glass ceramic and having thick film capacitors is connected to a base board. Therefore, it is difficult to thin a dielectric layer so that there is a limit in property of the capacitor. Laid-open Unexamined Patent Publication No. 2001-326298 shows a structure provided with an interposer made of ceramic and having capacitors. However, there has been a problem in the method employing the interposer that a material and a thickness of a dielectric layer of the capacitor, and a position, a size, and the like of the capacitor should be determined in advance.

With respect to a circuit board with built-in capacitors described in Laid-open Unexamined Patent Publication No. H7-30258, there has been a problem that since the built-in capacitors are buried in a multilayer wiring layer, sizes of electrodes are also fixed, and a position, a size, and the like of the capacitor should be determined in advance, so that it is not possible to flexibly cope with a change in specification. Further, there has been a problem that the manufacturing process of the conventional circuit board having the multilayer wiring with the built-in capacitors is long to thereby lower the manufacturing yield.

DISCLOSURE OF THE INVENTION

Therefore, the present invention has been made for solving the foregoing problems. Its object is to provide a multilayer wiring board that is excellent in electrical property, that copes with dimensional minimization and narrowing of a pitch, and that ensures a region of a conductor portion of a penetrating through hole, and a manufacture method thereof.

For accomplishing such an object, the present invention is configured that a multilayer wiring board comprises a core board, and a wiring layer and an electrically insulating layer that are stacked on one surface or both surfaces of said core board, wherein a thermal expansion coefficient, in XY directions, of a core member used for said core board falls within a range of 2 to 20 ppm, said core member is a core member selected from silicon, ceramics, glass, and a glass-epoxy composite, said core board has its front and back that are electrically connected by a plurality of through holes filled with a conductive material, and said conductive material protrudes from a surface of said core member at least on one side thereof.

Further, the present invention is configured that a manufacture method of a multilayer wiring board comprising a core board, and a wiring layer and an electrically insulating layer that are stacked on one surface or both surfaces of said core board, comprises a step of forming through holes in a core member used for said core board, said core member having a thermal expansion coefficient in XY directions that falls within a range of 2 to 20 ppm, and selected from silicon, ceramics, glass, and a glass-epoxy composite; a step of masking both surfaces of said core member other than said through holes and land forming regions using resists; a step of filling a conductive material into said through holes and said land forming regions, then polishing both surfaces of said core member, and then peeling off said resists to form said core board; a step of forming an electrically insulating layer at predetermined portions of said core board; and forming wiring layers on one surface or both surfaces of said core board via said electrically insulating layer.

Further, the present invention is configured that a manufacture method of a multilayer wiring board comprising a core board, and a wiring layer and an electrically insulating layer that are stacked on one surface or both surfaces of said core board, comprises a step of forming insulating layers on both surfaces of a core member other than through hole forming regions, said core member used for said core board, having a thermal expansion coefficient in XY directions that falls within a range of 2 to 20 ppm, and selected from silicon, ceramics, glass, and a glass-epoxy composite; a step of masking said insulating layers using resists; a step of applying sandblasting to the core member using said resists as masks, to thereby form through holes in the core member; a step of filling a conductive material into said through hole, peeling off said resists, then polishing both sides of the core member to form the core board; and a step of forming a wiring layer on one surface or both surfaces of said core board via an electrically insulating layer.

Another object of the present invention is to provide a capacitor built-in multilayer wiring board that can flexibly change a position, a size, and the like of a capacitor depending on a change in specification, that can broaden the width of selection of a material of a dielectric layer of the capacitor, and that shortens the manufacturing process of a circuit board having the capacitor built-in, to improve the manufacturing yield, and a manufacture method thereof.

For accomplishing such an object, the present invention is configured that a multilayer wiring board comprises a core board, and a wiring layer and an electrically insulating layer that are stacked on said core board, wherein a thermal expansion coefficient of said core board in XY directions falls within a range of 2 to 20 ppm, a core member for said core board is a core member selected from silicon, ceramics, glass, a glass-epoxy composite, and metal, said core board is provided with a plurality of through holes that are made conductive between the front and the back by a conductive material, and a capacitor is provided on one surface of said core board.

Further, the present invention is configured that a manufacture method of a multilayer wiring board comprising a core board, and a wiring layer and an electrically insulating layer that are stacked on said core board, comprises a step of forming a plurality of fine holes in a core member, wherein a thermal expansion coefficient of said core board in XY directions falls within a range of 2 to 20 ppm, and said core member is selected from silicon, ceramics, glass, a glass-epoxy composite, and metal; a step of causing said fine holes to be conductive by a conductive material; a step of stacking a wiring layer and an electrically insulating layer on the core board on the fine hole perforation side to form a multilayer wiring layer; a step of polishing a surface of the core board other than a surface where said fine holes are formed, and exposing said fine holes caused to be conductive by said conductive material, thereby to form a plurality of through holes electrically connecting between the front and the back of the core board; and a step of forming a capacitor on said polished surface of the core board.

Further, the present invention is configured that a manufacture method of a multilayer wiring board comprising a core board, and a wiring layer and an electrically insulating layer that are stacked on said core board, comprises a step of forming a plurality of through holes in a core member, wherein a thermal expansion coefficient of said core board in XY directions falls within a range of 2 to 20 ppm, and said core member is selected from silicon, ceramics, glass, a glass-epoxy composite, and metal; a step of causing said through holes to be conductive by a conductive material thereby to electrically connect between the front and the back of the core board; a step of stacking a wiring layer and an electrically insulating layer on one surface of said core board to form a multilayer wiring layer; and a step of forming a capacitor on the other surface of said core board.

BEST MODE FOR CARRYING OUT THE INVENTION

Hereinbelow, embodiments of the present invention will be described with reference to the drawings.

[Multilayer Wiring Board]

First, multilayer wiring boards of the present invention will be described.

First Embodiment of Multilayer Wiring Board

Figure 1:
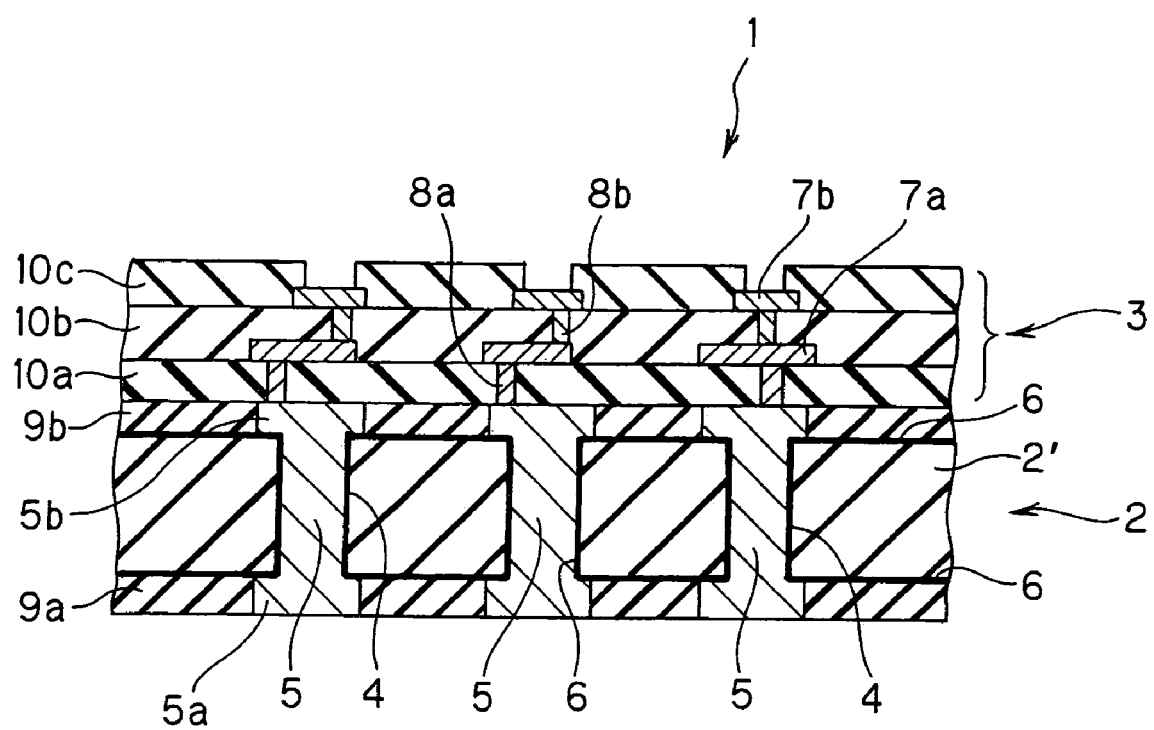
FIG. 1 is a partial longitudinal sectional view exemplarily showing one embodiment of a multilayer wiring board of the present invention.

FIG. 1 is a partial longitudinal sectional view exemplarily showing one embodiment of the multilayer wiring board of the present invention. In FIG. 1, the multilayer wiring board 1 comprises a core board 2 and a buildup wiring layer 3 formed on one surface of the core board 2 via an insulating layer. The buildup wiring layer 3 comprises wiring layers and electrically insulating layers that are stacked, and the wiring layer is a concept including wiring and vias.

The core board 2 constituting the multilayer wiring board 1 is provided with through holes 4, and each through hole 4 is filled with a conductive material 5 so that electrical connection is established between the front and the back of the core board 2. The conductive material 5 filled in the through hole 4 protrudes from the surfaces of a core member 2' to form lands 5a, 5b. The buildup wiring layer 3 is provided on one surface of the core board 2. Incidentally, depending on necessity, desired wiring (not shown) may be provided on one surface or both surfaces of the core board 2.

In the buildup wiring layer 3 provided on one surface of the core board 2, wirings 7a, 7b and conductive vias 8a, 8b are stacked via electrically insulating layers 10a, 10b. The wirings 7a, 7b are connected, through the vias 8a, 8b, to the conductive material 5 filled in the predetermined through holes 4 of the core board 2, or wiring portions (not shown) on the core board 2.

In the multilayer wiring board 1 of the present invention, for ensuring positional accuracy of the fine wiring layers forming the buildup wiring layer 3 provided on the core board 2, the core board 2 uses the core member 2' of which a thermal expansion coefficient in XY directions (the plane parallel to the surface of the core board 2) falls within a range of 2 to 20 ppm. For the core member 2', it is possible to select from silicon, ceramics, glass, and a glass-epoxy composite.

With respect to the foregoing core member 2' of the core board 2, silicon has a merit that it is preferable for fine processing and suitable for precise through-hole processing, ceramics and glass have a merit that they are relatively low in price, excellent in dimensional stability, and subjected to less deformation in the manufacture processing, and the glass-epoxy composite has a merit that it is low in price, so that it is possible to select the foregoing material depending on a desired property. With respect to the foregoing silicon, a resistance value can be changed by doping boron (B) or phosphorus (P). However, if the resistance value is small, an impedance of the through hole increases. Therefore, a larger resistance value is desirable, i.e. for example, 10 Ω·cm or more is desirable. Further, when silicon is used, wirings, elements, devices, etc. may be provided on a silicon wafer in advance, and it is possible to connect the devices and the elements to the conductive material after the conductive material is filled in the through holes.

Further, the core board 2 is provided with an insulating layer 6 on both surfaces of the core member 2' formed with the through holes 4, and on inner wall surfaces of the through holes. When, for example, the core member 2' is silicon, the insulating layer 6 can be provided by applying, after forming the through holes 4, thermal oxidation to the front and the back of the core member 2' including the through holes 4 to form silicon oxide or the like. On the other hand, the insulating layer 6 of silicon oxide, silicon nitride, or the like may be provided on the front and the back of the core member 2' including the through holes 4 by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the front and the back of the core member 2' including the through holes 4 and heat-curing it.

A thickness of the foregoing core member 2' is preferably within a range of 50 to 500 μm. If the thickness of the core member 2' is less than 50 μm, handling of the board is impeded in terms of strength as a support. On the other hand, if the thickness exceeds 500 μm, there rises a problem that it becomes difficult to dry a resin solvent of conductive paste filled in the through hole as the conductive material 5, and further, it is not suitable for reduction in thickness of a semiconductor device.

In the present invention, opening diameters of the through hole 4 are such that, for example, the opening diameter falls within a range of 10 to 200 μm on the front side of the core member 2' being the side of the through hole 4 on which a semiconductor chip is mounted (the land 5a side), and the opening diameter falls within a range of 10 to 175 μm on the back side of the core member 2'. In each through hole 4, the opening diameter on the back side can be set equal to or less than the opening diameter on the front side. In the present invention, by configuring that the opening diameter on the back side is equal to or less than the opening diameter on the front side in the through hole 4, it is possible to enhance the degree of freedom in designing internal wiring to thereby further increase the wiring density.

Figure 2:
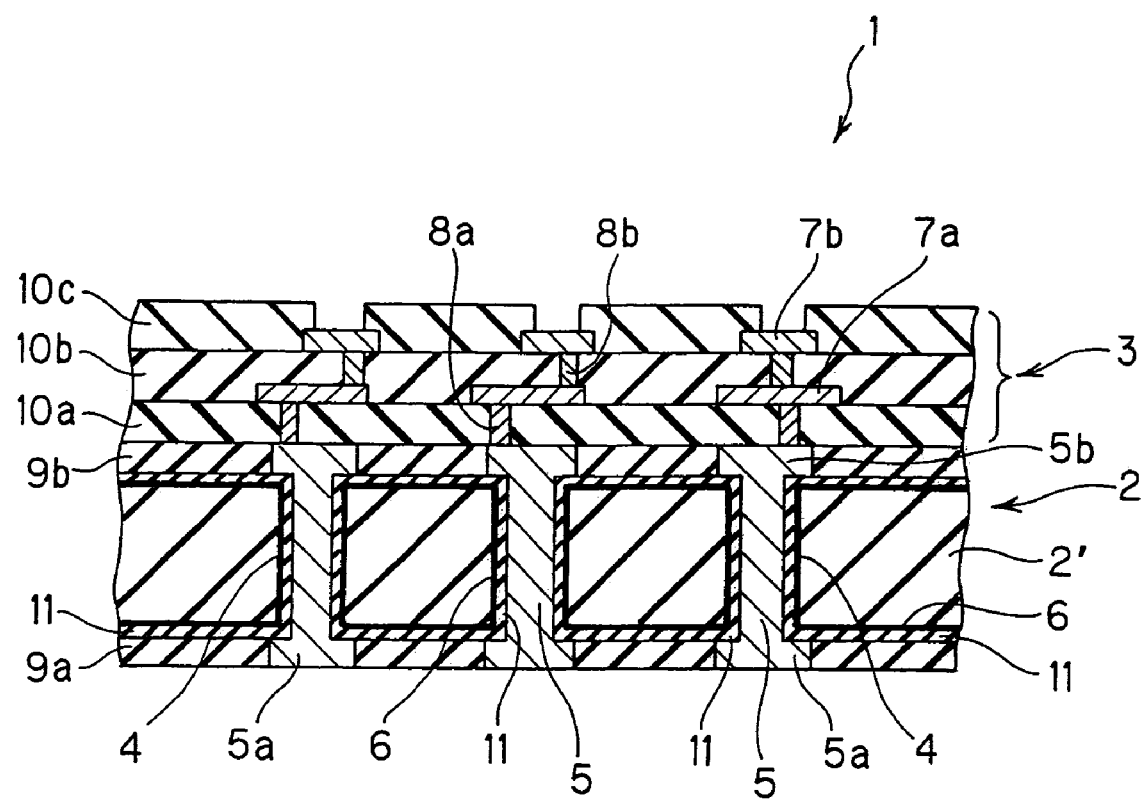
FIG. 2 is a partial longitudinal sectional view exemplarily showing another embodiment of a multilayer wiring board of the present invention.

Further, in the present invention, the opening diameter of the through hole 4 can be set within a range of 10 to 100 μm, preferably 10 to 30 μm. In this case, as shown in FIG. 2, it is preferable to provide a conductive substance diffusion preventing layer 11 on the insulating layer 6 including the inner wall surfaces of the through holes 4. The conductive material 5 is prevented from diffusing into the core board 2 by the conductive substance diffusion preventing layer 11, and therefore, even if the pitch of the through holes 4 is narrowed by reducing the opening diameters, short circuits between the adjacent through holes 4 can be prevented. The foregoing conductive substance diffusion preventing layer 11 has no particular limitation as long as it is a thin film that is fine and can prevent diffusion of conductive substance into the core board 2, and can be formed as a thin film of, for example, titanium nitride, titanium, or chromium. A thickness of the conductive substance diffusion preventing layer 11 can be set, for example, within a range of 10 to 50 nm.

If the opening diameter of the through hole is less than the foregoing range, it becomes difficult to form the through holes, while, if it exceeds the foregoing range, a hindrance is caused on increasing the density of the through holes, or increasing the number of the through holes.

The conductive material 5 filled in the through hole 4 of the core board 2 may be either known conductive paste such as copper paste or silver paste filled therein, or metal such as copper, silver, gold, or nickel filled therein by electrolytic plating. Particularly, if metal is used as the conductive material 5, it is preferable inasmuch as thermal expansion of the conductive material 5 in the through hole 4 is small so that it is possible to prevent concentration of stresses onto wiring etc. provided on the core board.

The through hole 4 in the present invention has a structure wherein the whole inside of the through hole is filled with the conductive material 5, and the conductive material 5 protrudes from the surface of the core member at least on one side thereof. By taking the foregoing structure, it becomes easy to ensure a region of a conductor portion of the through hole 4. Further, by setting diameters of the lands 5a, 5b made of the protrudent conductive material 5 to be larger than the hole diameter of the corresponding through hole filled with the conductive material, wiring connection between wiring boards becomes easy without lowering the wiring density. Further, upon semiconductor chip mounting where solder bumps are formed on the board, it also becomes easy to supply solder to pads. It is preferable that the diameters of the lands 5a, 5b are larger than the opening diameter of the through hole within a range of 20 to 40 μm. Further, the conductive material that protrudes about 10 to 100 μm from the surface of the core member upon filling by plating or paste printing is polished to a protrusion amount of 5 to 15 μm. If the protrudent conductive material is completely flattened, it is possible that the insulating film 6 on the surface of the core member is damaged due to polishing upon the flattening. Therefore, the foregoing 5-15 μm protrudent structure also serves to prevent the insulating layer 6 from being damaged.

In the present invention, it is preferable that a protrudent portion of the conductive material 5 protrudes from the surface of the core board within a range of 5 to 15 μm. This is because, if the protrusion is less than 5 μm, the region of the conductor portion of the through hole can not be sufficiently ensured, while, if it exceeds 15 µm, a hindrance is caused on reducing the thickness of the wiring board.

Depending on necessity, desired wiring (not shown) is provided on one surface or both surfaces of the core board 2 formed with the through holes 4 each filled with the conductive material 5.

A material of the wiring of the core board 2, the wirings 7a, 7b of the buildup wiring layer 3 provided on the core board 2, and the vias 8a, 8b can be a conductive material such as copper, silver, gold, or chromium. Preferably, at least one side of the core board 2 where the buildup wiring layer 3 is provided, is formed as a flat surface using a material having an insulation property. In the illustrated example, electrically insulating layers 9a, 9b are provided for achieving flat surfaces. As a material of the electrically insulating layers 9a, 9b, for example, a photosensitive insulating material that is heat-curable at 250° C., being a solder reflow temperature, or less, is used, and benzocyclobutene resin, cardo resin, or polyimide resin can be cited as a desirable material. On the other hand, as a material of the electrically insulating layers 10a, 10b, 10c of the buildup layer, like the foregoing, benzocyclobutene resin, cardo resin, or polyimide resin, which is a heat-curable photosensitive insulating material, is used as a desirable material.

According to the present invention as described above, the core member of the core board forming the multilayer wiring board is made of the material having a small thermal expansion coefficient, the core board is provided with the plurality of through holes each electrically connected between the front and the back by the use of the conductive material, and the region occupied by the conducting portion due to the through hole is small, and therefore, there is a merit that a space is sufficiently ensured on the side where the buildup wiring layer is formed, and thus the degree of freedom for wiring design is high.

Further, the highly reliable board that has no void portions at the through hole portions and does not induce occurrence of cracks or disconnection due to thermal shock, can be obtained by the relatively inexpensive method.

Second Embodiment of Multilayer Wiring Board

Figure 3:
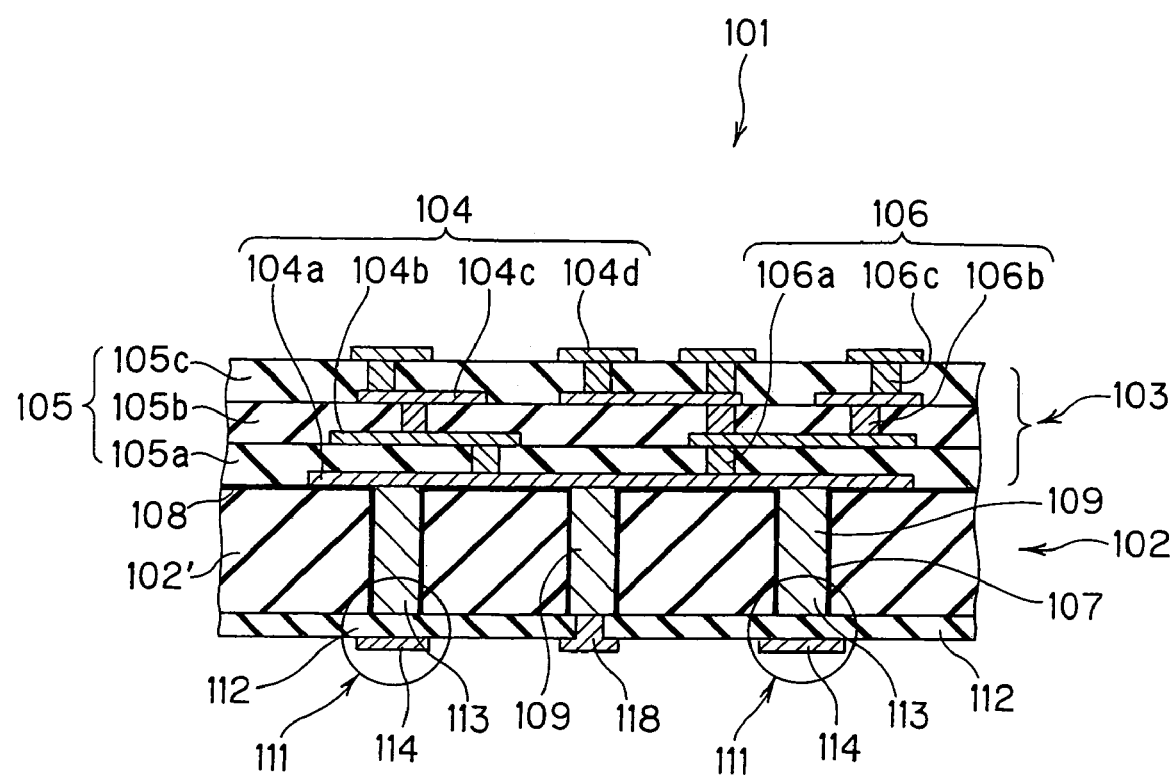
FIG. 3 is a partial longitudinal sectional view exemplarily showing another embodiment of a multilayer wiring board of the present invention.

FIG. 3 is a partial longitudinal sectional view exemplarily showing another embodiment of the multilayer wiring board of the present invention. In FIG. 3, the multilayer wiring board 101 comprises a core board 102, and a multilayer wiring layer 103 in which wirings 104 (104a, 104b, 104c, 104d) and insulating layers 105 (105a, 105b, 105c) are stacked, is formed on one surface of the core board 102. Further, on the other surface of the core board 102, a dielectric layer 112 is provided to form capacitors 111. In the present invention, not only the capacitors but also inductors being other passive component circuits may be provided on the surface where the capacitors 111 are provided.

The core board 102 constituting the multilayer wiring board 101 is provided with a plurality of conductive through holes 107 each electrically connected between the front and the back by a conductive material 109. An insulating layer 108 is provided on the side of the core board 102 where the multilayer wiring layer 103 is formed, and on inner wall surfaces of the through holes 107. In the multilayer wiring layer 103 provided on one surface of the core board 102, the respective wirings 104 are connected by conductive vias 106 (106a, 106b, 106c) through the electrically insulating layers 105, and are further connected to the conductive material 109 within the predetermined through holes 107 of the core board 102. Incidentally, a wiring layer in the multilayer wiring layer 103 is a concept including the wirings 104 and the vias 106.

In the present invention, for ensuring positional accuracy of the fine multilayer wiring layer 103 provided on the multilayer wiring board 101, the core board 102 is made of a material of which a thermal expansion coefficient in XY directions (the plane parallel to the surface of the core board 102) falls within a range of 2 to 20 ppm. For the core member 102', it is possible to select from silicon, ceramics, glass, a glass-epoxy composite, and metal. In the foregoing core member of the core board 102, silicon is preferable for fine processing and suitable for precise through-hole processing. On the other hand, ceramics, glass, and the glass-epoxy composite have a merit that they are relatively low in price, excellent in dimensional stability, and subjected to less deformation in the manufacture processing. As metal, a 42 alloy, tungsten, or the like can be cited. Metal is excellent in electrical conductivity for the board, while, after the processing, an insulation treatment of the surface needs to be implemented sufficiently. Therefore, it is possible to select the foregoing material depending on a desired property.

In the present invention, it is preferable to use the core board 102 in a thickness within a range of 50 to 300 µm. This is because, if the thickness of the core board 102 is less than 50 µm, a mechanical strength becomes insufficient, while, if it exceeds 300 µm, a characteristic of the capacitor 111 is lowered.

When, for example, the core member 102' is silicon, the foregoing insulating layer 108 can be provided by applying thermal oxidation to the core member 102' to form silicon oxide or the like. On the other hand, the insulating layer 108 of silicon oxide, silicon nitride, or the like may be provided on the surface of the core board 102 including the through holes 107 by the use of the vacuum film forming method such as the plasma CVD method. Further, using the application method, the insulating layer 108 can be formed by applying a suspension of silicon oxide or insulating resin such as benzocyclobutene resin, cardo resin, or polyimide resin onto the surface of the core board 102 including the through holes 107 and heat-curing it.

The shape of the through hole 107 of the core board 102 of the present invention may be any of a straight shape with opening diameters thereof on the front and the back being substantially equal to each other, a tapered shape with an opening diameter at one end thereof being larger than an opening diameter at the other end, and so forth.

Preferably, the opening diameter of the through hole 107 falls within a range of 10 to 300 µm. This is because, if the opening diameter of the through hole 107 is less than 10 µm, it becomes difficult to form a deep fine hole and fill the conductive material therein, while, if it exceeds 300 µm, an occupying area of the through hole becomes large, which is not preferable for higher densification.

Figure 4:
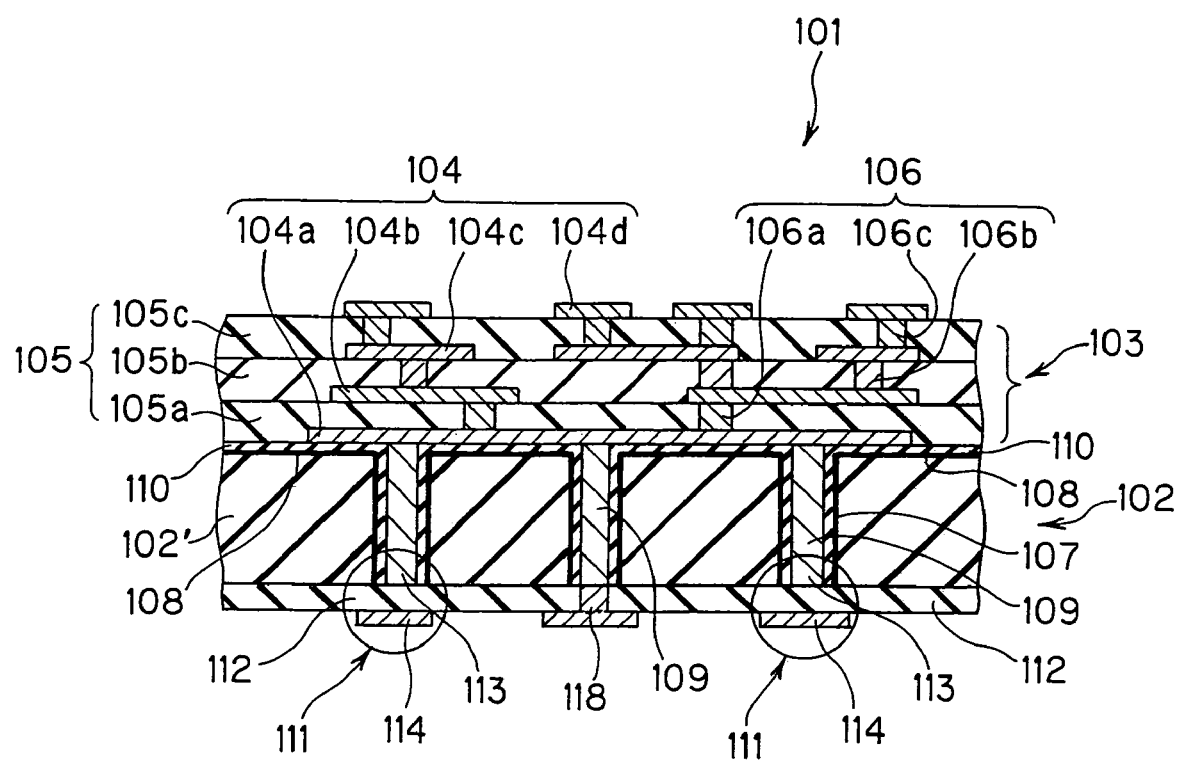
FIG. 4 is a partial longitudinal sectional view exemplarily showing another embodiment of a multilayer wiring board of the present invention.

Further, in the present invention, the opening diameter of the through hole 107 can be set within a range of 10 to 100 µm, preferably 10 to 30 µm. In this case, as shown in FIG. 4, it is preferable to provide a conductive substance diffusion preventing layer 110 on the insulating layer 108 including the inner wall surfaces of the through holes 107. The conductive material 109 is prevented from diffusing into the core board 102 by the conductive substance diffusion preventing layer 110, and therefore, even if the pitch of the through holes 107 is narrowed by reducing the opening diameters, short circuits between the adjacent through holes 107 can be prevented. The foregoing conductive substance diffusion preventing layer 110 has no particular limitation as long as it is a thin film that is fine and can prevent diffusion of conductive substance into the core board 102, and can be formed as a thin film of, for example, titanium nitride, titanium, or chromium. A thickness of the conductive substance diffusion preventing layer 110 can be set, for example, within a range of 10 to 50 µm.

The conductive material 109 used in the conductive through hole 107 of the core board 102 may be either known conductive paste such as copper paste or silver paste filled therein, or metal such as copper, silver, gold, or nickel filled therein by electrolytic plating. Particularly, if metal is used as the conductive material 109, it is preferable inasmuch as thermal expansion of the conductive material in the through hole is small so that it is possible to prevent concentration of stresses onto wiring etc. provided on the core board. When metal is used as the conductive material 109, it is possible to use a method wherein an under conductive thin film is formed on the inner wall of the through hole by the vacuum film forming method such as CVD, or the electroless plating method, then burying plating is carried out by electrolytic plating using a conductive material such as copper, silver, gold, or nickel to provide electrical conductivity.

The capacitor 111 in the present invention uses, as an upper electrode 113, the conductive material 109 filled in the through hole 107, and is provided with a lower electrode 114 via the dielectric layer 112. Therefore, such a state is preferable wherein the through hole 107 at least on the capacitor 111 side is buried under the conductive material 109, and such a state is more preferable wherein the inside of the through hole 107 is all filled up with the conductive material 109.

In the present invention, the direction of a current flow between the upper electrode 113 and the lower electrode 114 is not limited, which shall also apply to the later-described embodiments.

In the present invention, a material of the dielectric layer 112 forming the capacitor 111 is one selected from silicon oxide, silicon nitride, tantalum pentoxide, barium strontium titanate ($SrBaTiO_3$), lead zirconate titanate ($Pb,(Zr,Ti)O_3$), strontium titanate ($SrTiO_3$), aluminum oxide, benzocyclobutene resin, cardo resin, and polyimide resin.

As a thickness of the dielectric layer 112, a film thickness of about 0.05 to several micrometers is used.

A material of the lower electrode 114 of the capacitor 111 provided on the dielectric layer 112, and a wiring layer 118 electrically connected to the through hole 107 is preferably selected from the group below, each formed in a thickness of several micrometers.

one kind of metal among Al, Cr, Cu, Ti, Pt, Ru, Ta, and W
oxide (RuO or the like), nitride (TiN or the like), or alloy of the foregoing metal
multilayer film in optional combination of the foregoing metal, oxide, nitride, and alloy, and polysilicon (two-layer film of Cr/Cu or Ti/Pt, three-layer film of Cr/Cu/Cr, or the like)

As an example of metal alloy, Al containing several % Si or Cu is cited.

On the other hand, a material of the wirings 104 and the vias 106 of the multilayer wiring layer 103 provided on the core board 102 is preferably selected from the group below.

one kind of metal among Al, Cr, Cu, and Ti
nitride (TiN or the like) or alloy of the foregoing metal
multilayer film in optional combination of the foregoing metal, nitride, and alloy (two-layer film of Cr/Cu, three-layer film of Cr/Cu/Cr, or the like)

As an example of metal alloy, Al containing several % Si or Cu is cited.

Further, as a material of the respective electrically insulating layers 105 of the multilayer wiring layer 103, a photosensitive insulating material that is heat-curable at 250° C., being a solder reflow temperature, or less, is used, and benzocyclobutene resin, cardo resin, or polyimide resin can be cited as a desirable material.

Figure 5:
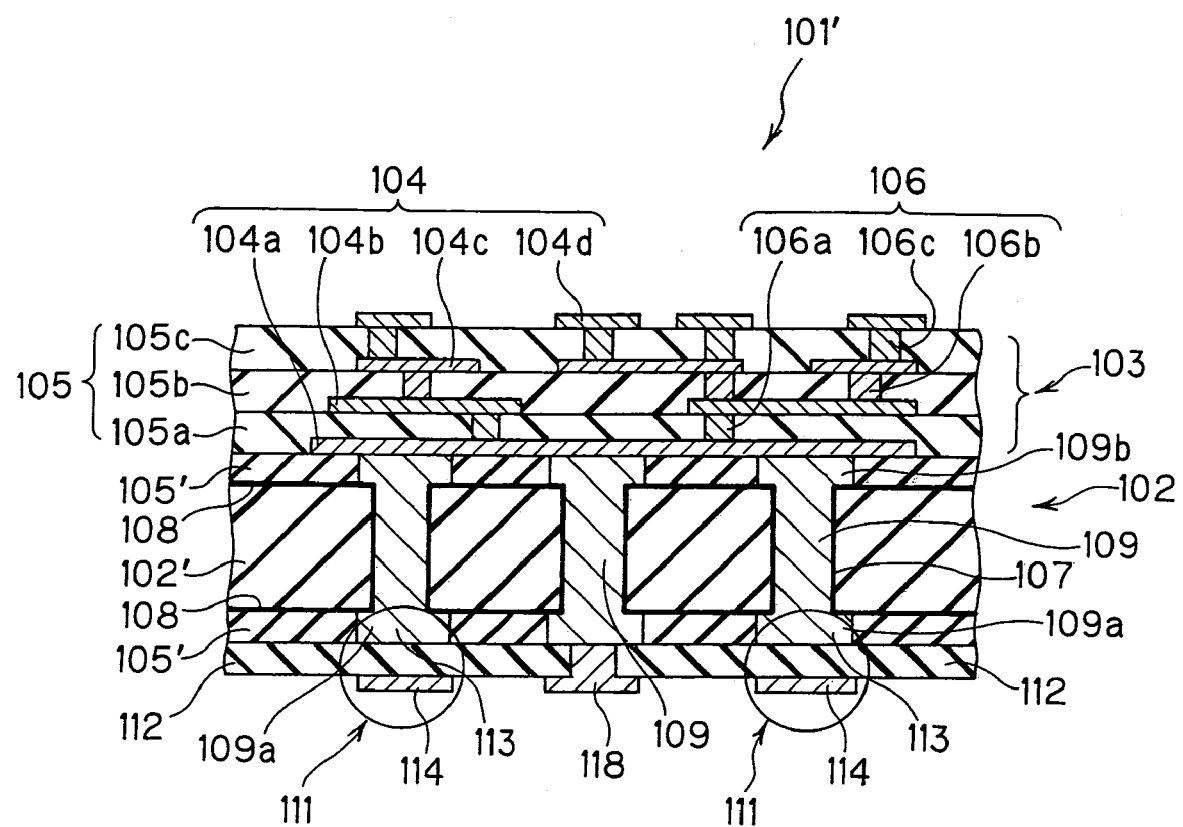
FIG. 5 is a partial longitudinal sectional view exemplarily showing another embodiment of a multilayer wiring board of the present invention.

The multilayer wiring board of the present invention may be one like a multilayer wiring board 101' shown in FIG. 5, wherein a conductive material 109 filled in each through hole 107 protrudes from the surface of a core member 102' at least on one side thereof to form lands 109a, 109b. Preferably, the lands 109a, 109b protrude from the surfaces of the core board within a range of 5 to 15 µm. This is because, if the protrusion is less than 5 µm, the region of the conductor portion of the through hole can not be sufficiently ensured, while, if it exceeds 15 µm, a hindrance is caused on reducing the thickness of the wiring board. Incidentally, in the illustrated example, electrically insulating layers 105' are provided on both sides for achieving flat surfaces. A material of the electrically insulating layers 105' may be the same as that of the foregoing electrically insulating layers 105.

Third Embodiment of Multilayer Wiring Board

Figure 6:
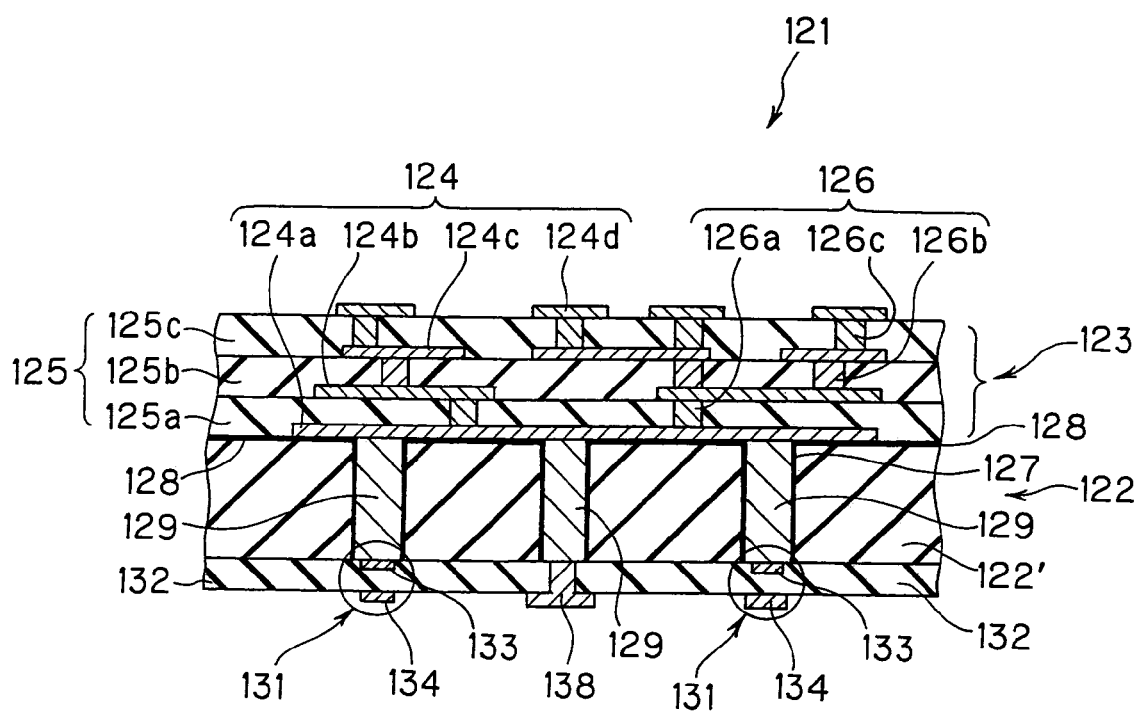
FIG. 6 is a partial longitudinal sectional view exemplarily showing another embodiment of a multilayer wiring board of the present invention.

FIG. 6 is a partial longitudinal sectional view exemplarily showing another embodiment of the multilayer wiring board of the present invention. In FIG. 6, the multilayer wiring board 121 comprises a core board 122, and a multilayer wiring layer 123 in which wirings 124 (124a, 124b, 124c, 124d) and insulating layers 125 (125a, 125b, 125c) are stacked, is formed on one surface of the core board 122. Further, on the other surface of the core board 122, a dielectric layer 132 is provided to form capacitors 131.

In the multilayer wiring layer 123 provided on one surface of the core board 122 constituting the multilayer wiring board 121, the respective wirings 124 are connected by conductive vias 126 (126a, 126b, 126c) through the electrically insulating layers 125, and are further connected to a conductive material 129 within predetermined through holes 127 of the core board 122. Incidentally, a wiring layer in the multilayer wiring layer 123 is a concept including the wirings 124 and the vias 126.

An insulating layer 128 is formed on internal wall surfaces of the through holes 127 and on the side of a core member 122' where the multilayer wiring layer 123 is formed. The core board 122 and the multilayer wiring layer 123 are the same as the core board 102 and the multilayer wiring layer 103 constituting the foregoing multilayer wiring board 101, and detailed description thereof is omitted.

The capacitor 131 of the multilayer wiring board 121 comprises an upper electrode 133 provided on the core board 122 so as to be connected to the conductive material 129 within the through hole 127, and a lower electrode 134 disposed so as to confront the upper electrode 133 via the dielectric layer 132. The foregoing upper electrode 133 is smaller than the through hole 127. However, by disposing an insulating layer at a portion of the core member 122' where the insulating layer 128 is not formed, it is possible to make an area of the upper electrode 133 larger than the through hole 127 to form a capacitor having a large capacitance. Further, the multilayer wiring board 121 is provided with a wiring layer 138 electrically connected to another through hole 127.

A material of the foregoing upper electrode 133, lower electrode 134, and wiring layer 138 can be the same as that of the lower electrode 114 and the wiring layer 118 constituting the foregoing multilayer wiring board 101.

Further, in the multilayer wiring board 121, like in the multilayer wiring board 101 shown in FIG. 4, it is possible to provide a conductive substance diffusion preventing layer on the internal wall surfaces of the through holes 127.

Figure 7:
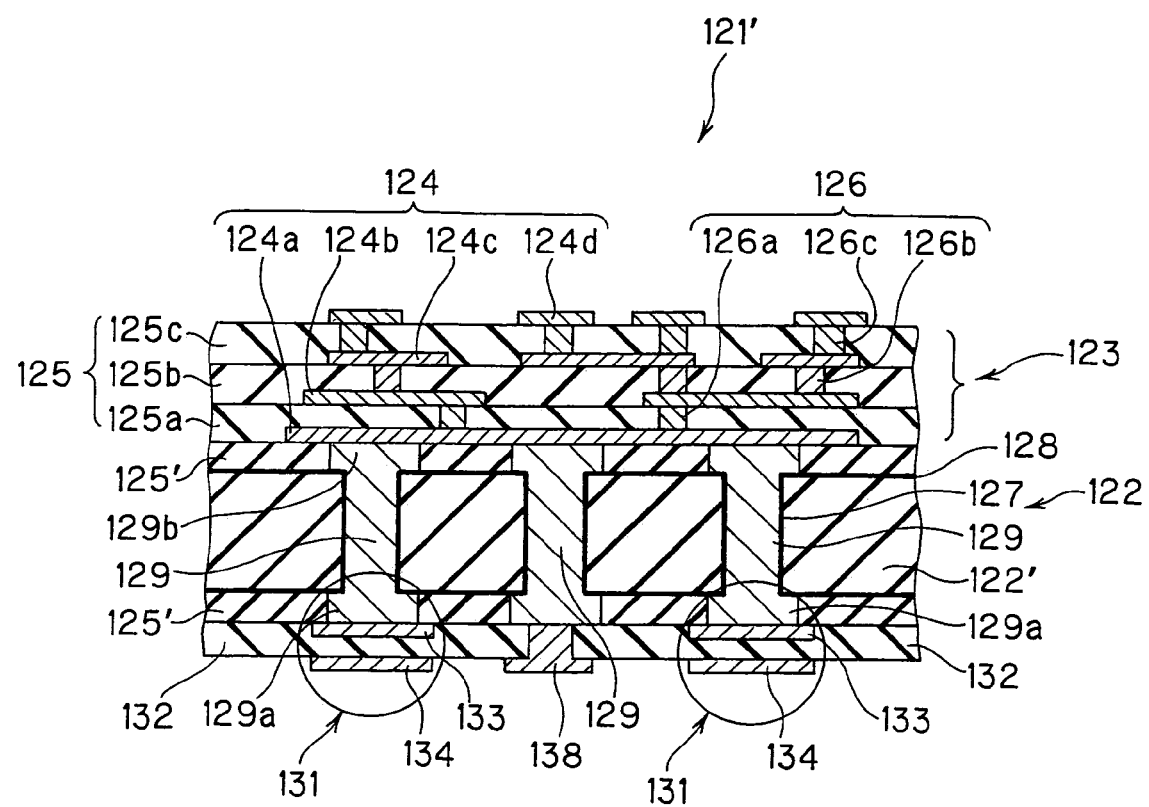
FIG. 7 is a partial longitudinal sectional view exemplarily showing another embodiment of a multilayer wiring board of the present invention.

The multilayer wiring board of the present invention may be one like a multilayer wiring board 121' shown in FIG. 7, wherein a conductive material 129 filled in each through hole 127 protrudes from the surfaces of a core member 122' to form lands 129a, 129b. Preferably, the lands 129a, 129b protrude from the surfaces of the core board within a range of 5 to 15 μm. This is because, if the protrusion is less than 5 μm, the region of the conductor portion of the through hole can not be sufficiently ensured, while, if it exceeds 15 μm, a hindrance is caused on reducing the thickness of the wiring board. Incidentally, in the illustrated example, a core board 122 is provided with electrically insulating layers 125' on both sides thereof for achieving flat surfaces.

Fourth Embodiment of Multilayer Wiring Board

Figure 8:
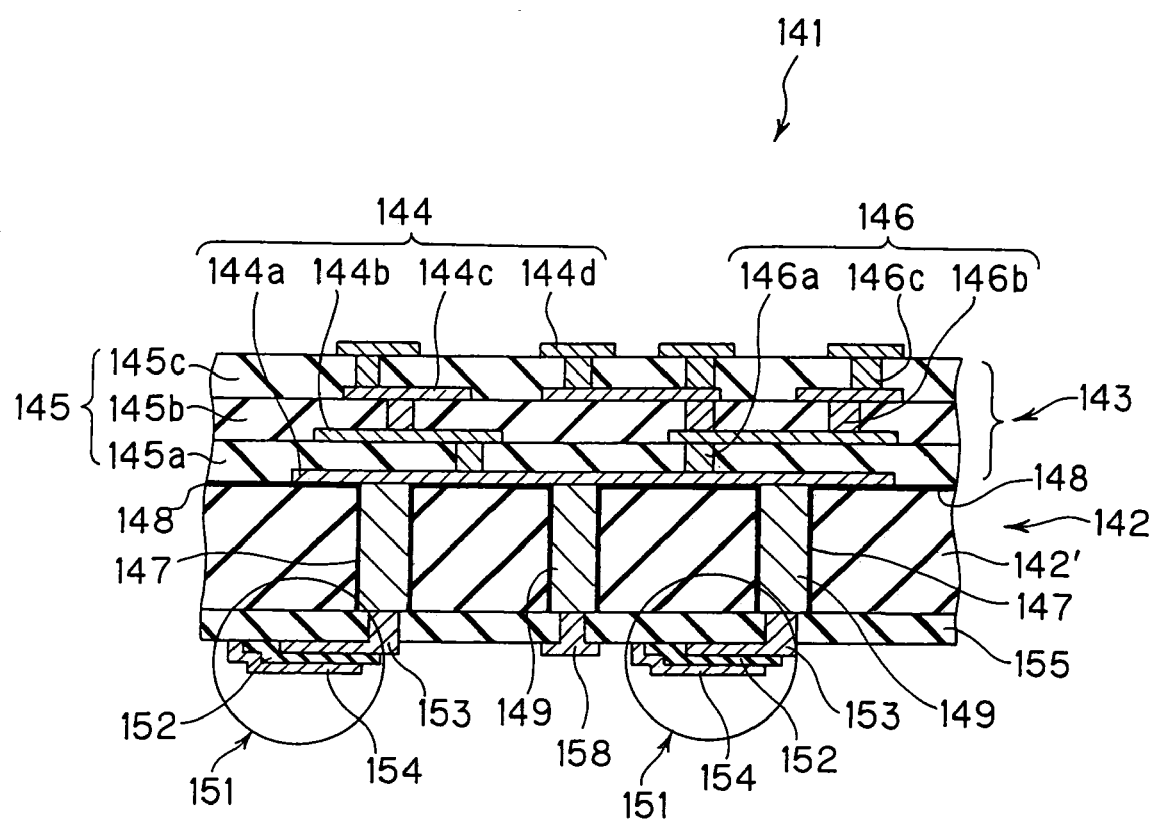
FIG. 8 is a partial longitudinal sectional view exemplarily showing another embodiment of a multilayer wiring board of the present invention.

FIG. 8 is a partial longitudinal sectional view exemplarily showing another embodiment of the multilayer wiring board of the present invention. In FIG. 8, the multilayer wiring board 141 comprises a core board 142, and a multilayer wiring layer 143 in which wirings 144 (144a, 144b, 144c, 144d) and insulating layers 145 (145a, 145b, 145c) are stacked, is formed on one surface of the core board 142. Further, on the other surface of the core board 142, an electrically insulating layer 155 is provided, and capacitors 151 are formed on the electrically insulating layer 155.

In the multilayer wiring layer 143 provided on one surface of the core board 142 constituting the multilayer wiring board 141, the respective wirings 144 are connected by conductive vias 146 (146a, 146b, 146c) through the electrically insulating layers 145, and are further connected to a conductive material 149 within predetermined through holes 147 of the core board 142. Incidentally, a wiring layer in the multilayer wiring layer 143 is a concept including the wirings 144 and the vias 146.

An insulating layer 148 is formed on internal wall surfaces of the through holes 147 and on the side of a core member 142' where the multilayer wiring layer 143 is formed. The core board 142 and the multilayer wiring layer 143 are the same as the core board 102 and the multilayer wiring layer 103 constituting the foregoing multilayer wiring board 101, and detailed description thereof is omitted.

The capacitor 151 of the multilayer wiring board 141 comprises an upper electrode 153 provided on the core board 142 via the electrically insulating layer 155 so as to be connected to the conductive material 149 within the through hole 147, a dielectric layer 152 provided so as to cover at least a part of the upper electrode, and a lower electrode 154 disposed so as to cover at least a part of the dielectric layer 152. Further, the multilayer wiring board 141 is provided with a wiring layer 158 electrically connected to another through hole 147.

A material of the foregoing upper electrode 153, lower electrode 154, and wiring layer 158 can be the same as that of the lower electrode 114 and the wiring layer 118 constituting the foregoing multilayer wiring board 101.

Further, in the multilayer wiring board 141, like in the multilayer wiring board 101 shown in FIG. 4, it is possible to provide a conductive substance diffusion preventing layer on the internal wall surfaces of the through holes 147.

Figure 9:
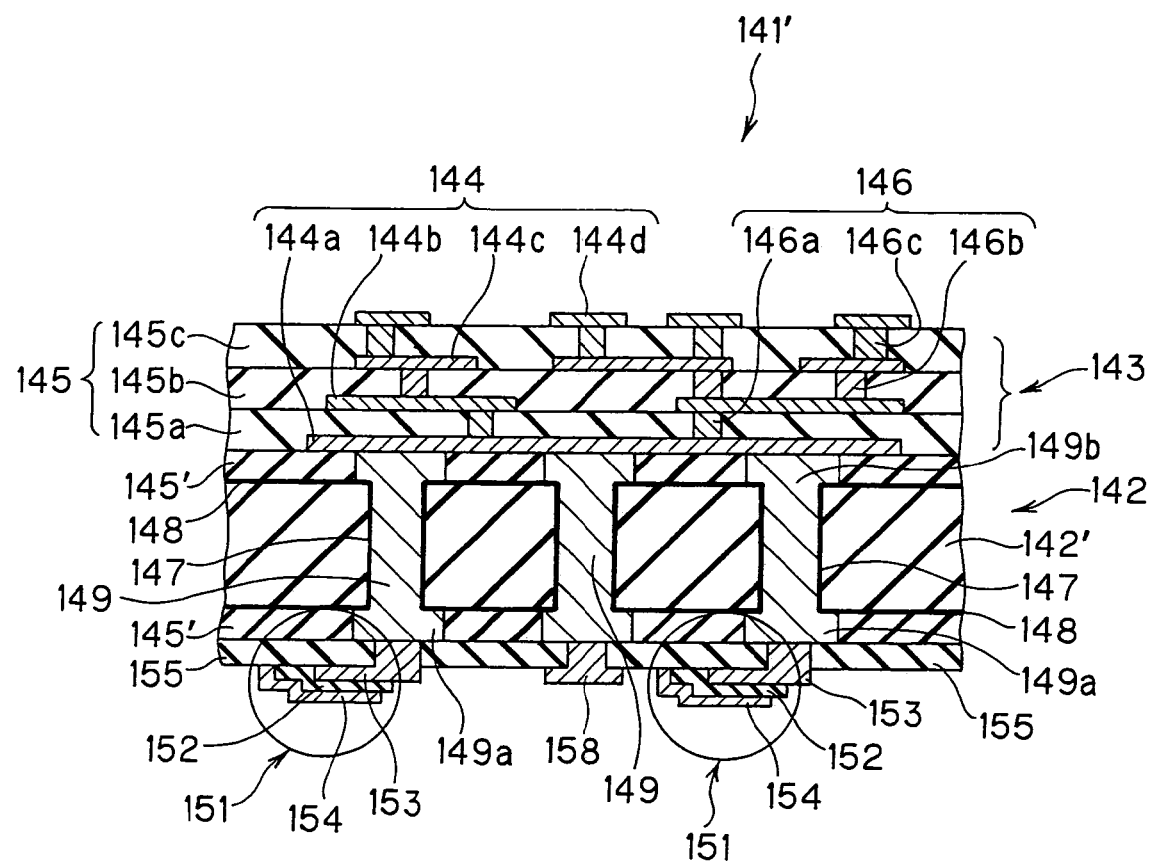
FIG. 9 is a partial longitudinal sectional view exemplarily showing another embodiment of a multilayer wiring board of the present invention.

The multilayer wiring board of the present invention may be one like a multilayer wiring board 141' shown in FIG. 9, wherein a conductive material 149 filled in each through hole 147 protrudes from the surfaces of a core member 142' to form lands 149a, 149b. Preferably, the lands 149a, 149b protrude from the surfaces of the core board within a range of 5 to 15 μm. This is because, if the protrusion is less than 5 μm, the region of the conductor portion of the through hole can not be sufficiently ensured, while, if it exceeds 15 μm, a hindrance is caused on reducing the thickness of the wiring board. Incidentally, in the illustrated example, a core board 142 is provided with electrically insulating layers 145' on both sides thereof for achieving flat surfaces.

Fifth Embodiment of Multilayer Wiring Board

Figure 10:
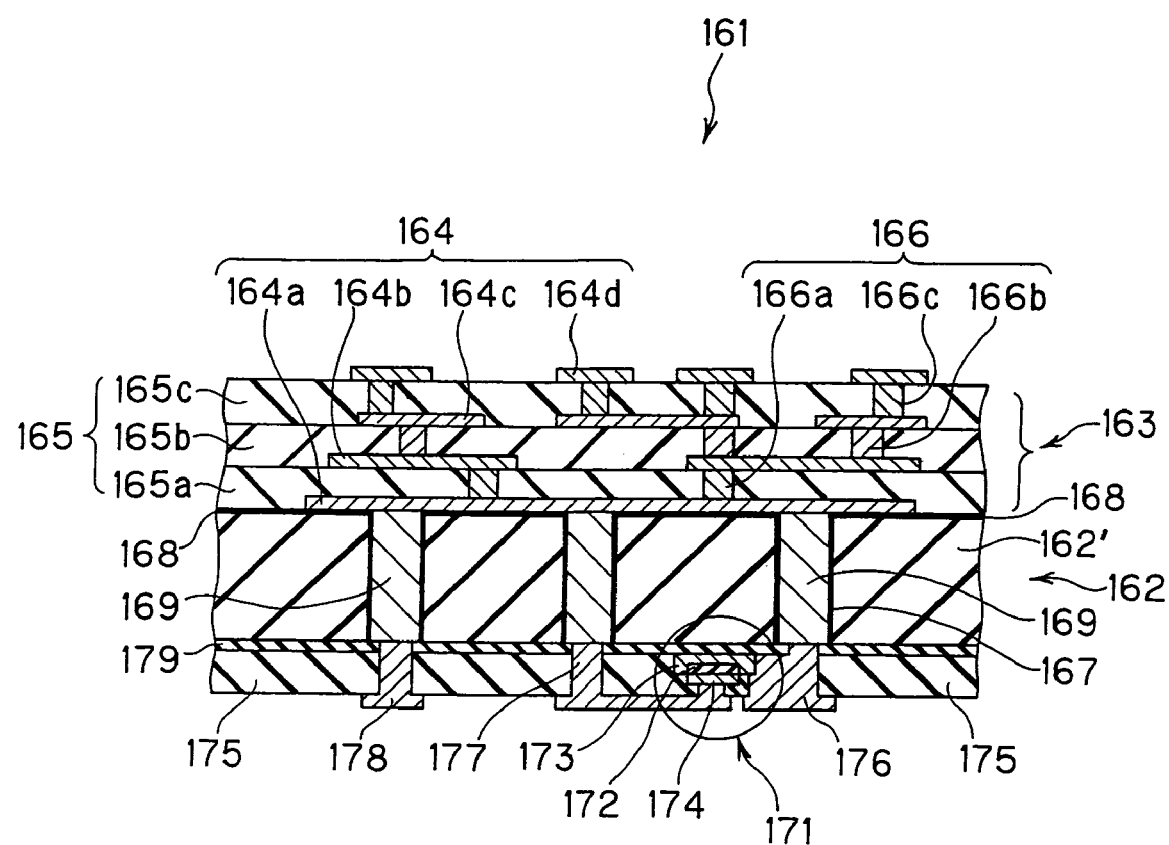
FIG. 10 is a partial longitudinal sectional view exemplarily showing another embodiment of a multilayer wiring board of the present invention.

FIG. 10 is a partial longitudinal sectional view exemplarily showing another embodiment of the multilayer wiring board of the present invention. In FIG. 10, the multilayer wiring board 161 comprises a core board 162, and a multilayer wiring layer 163 in which wirings 164 (164a, 164b, 164c, 164d) and insulating layers 165 (165a, 165b, 165c) are stacked, is formed on one surface of the core board 162. Further, capacitors 171 are formed on the other surface of the core board 162.

In the multilayer wiring layer 163 provided on one surface of the core board 162 constituting the multilayer wiring board 161, the respective wirings 164 are connected by conductive vias 166 (166a, 166b, 166c) through the electrically insulating layers 165, and are further connected to a conductive material 169 within predetermined through holes 167 of the core board 162. Incidentally, a wiring layer in the multilayer wiring layer 163 is a concept including the wirings 164 and the vias 166.

An insulating layer 168 is formed on internal wall surfaces of the through holes 167 and on the side of a core member 162' where the multilayer wiring layer 163 is formed. The core board 162 and the multilayer wiring layer 163 are the same as the core board 102 and the multilayer wiring layer 103 constituting the foregoing multilayer wiring board 101, and detailed description thereof is omitted.

The capacitor 171 of the multilayer wiring board 161 comprises an upper electrode 173 connected to the conductive material 169 within the through hole 167 via a wiring layer 176, a lower electrode 174 confronting the upper electrode 173 via a dielectric layer 172, and a wiring layer 177 connecting the foregoing lower electrode 174 to the conductive material of the adjacent through hole 167. The foregoing upper electrode 173 is disposed on the core member 162' via an insulating layer 179. Further, the multilayer wiring board 161 is provided with a wiring layer 178 electrically connected to another through hole 167.

The foregoing upper electrode 173 is made of anodizable metal, and the foregoing dielectric layer 172 is made of metal oxide obtained by oxidizing anodizable metal. As such anodizable metal, Ta, Al, Ti, W, and the like can be cited.

A material of the foregoing lower electrode 174 and wiring layers 176, 177, 178 can be the same as that of the lower electrode 114 and the wiring layer 118 constituting the foregoing multilayer wiring board 101.

Further, in the multilayer wiring board 161, like in the multilayer wiring board 101 shown in FIG. 4, it is possible to provide a conductive substance diffusion preventing layer on the internal wall surfaces of the through holes 167.

Figure 11:
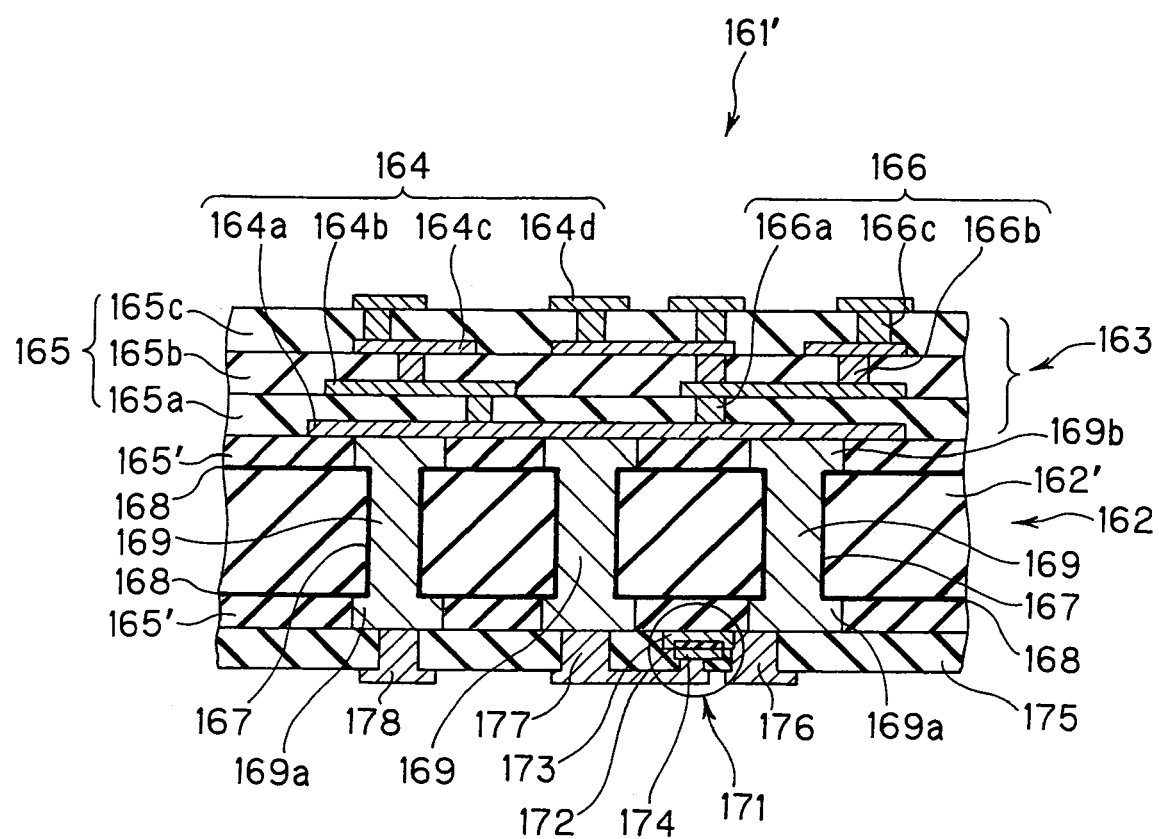
FIG. 11 is a partial longitudinal sectional view exemplarily showing another embodiment of a multilayer wiring board of the present invention.

The multilayer wiring board of the present invention may be one like a multilayer wiring board 161' shown in FIG. 11, wherein a conductive material 169 filled in each through hole 167 protrudes from the surfaces of a core member 162' to form lands 169a, 169b. Preferably, the lands 169a, 169b protrude from the surfaces of the core board within a range of 5 to 15 μm. This is because, if the protrusion is less than 5 μm, the region of the conductor portion of the through hole can not be sufficiently ensured, while, if it exceeds 15 μm, a hindrance is caused on reducing the thickness of the wiring board. Incidentally, in the illustrated example, a core board 162 is provided with electrically insulating layers 165' on both sides thereof for achieving flat surfaces.

As described above, according to the present invention, by forming the capacitor as an internal circuit on one surface of the core board, a distance to the semiconductor chip is shortened so that increase of an impedance following the prolongation of power wiring is not caused, and therefore, switching noise of an LSI can be reduced to make it possible to operate internal circuits stably at high speed, and further, it becomes possible to suppress the increase in chip size.

Further, according to the capacitor built-in multilayer wiring board, since the through hole filled with the conductive material is used as the upper electrode of the capacitor, the capacitor can be flexibly changed according to a change in specification such as a position or a size of the capacitor, and further, since the capacitor is not buried, but is formed on one surface of the core board, it is possible to broaden the width of selection of a material of the capacitor dielectric layer.

Further, in the present invention, the core board constituting the capacitor built-in multilayer wiring board is made of the material having a small thermal expansion coefficient, has the plurality of through holes each electrically connected between the front and the back by the conductive material, and is formed with the multilayer wiring layer on one surface thereof, and the wiring layers are via-formed by the photolithography method and the plating method. Therefore, the wiring with fine line widths and narrow pitches is made possible. Further, since the vias of the multilayer wiring layer can be formed in the stack structure, the high density wiring is made possible.

The multilayer wiring board of the present invention can be reduced in size and weight while possessing high-performance electrical properties owing to the dimensional minimization and higher densification, and thus can be used in various ways.

[Manufacture Method of Multilayer Wiring Board]

Next, multilayer wiring board manufacture methods of the present invention will be described.

First, the multilayer wiring board manufacture methods of the present invention using the multilayer wiring boards shown in FIGS. 1 and 2 as examples will be described as the first to fourth embodiments of the manufacture methods.

FIGS. 12A to 12E and FIGS. 13A to 13E are process diagrams showing the manufacture method of the multilayer wiring board relating to one embodiment of the present invention shown in FIG. 1. Further, FIGS. 15A to 15E and FIGS. 16A to 16D, FIGS. 17A to 17E and FIGS. 18A to 18B, and FIGS. 19A to 19D and FIGS. 20A to 20B are process diagrams showing other embodiments of the manufacture methods of the present invention, respectively.

In the multilayer wiring board manufacture method of the present invention, as described before, a material of which a thermal expansion coefficient in XY directions falls within a range of 2 to 20 ppm, selected from silicon, ceramics, glass, and a glass-ceramics composite, is used as a core member. A thickness of a core board is 50 to 500 μm, an opening diameter of a through hole falls within a range of 10 to 200 μm on the front side of the core member where a semiconductor chip is mounted, and falls within a range of 10 to 175 μm on the back side of the core member, and the opening diameter on the back side is set equal to or less than the opening diameter on the front side. In another case, the opening diameter of the through hole is set within a range of 10 to 100 μm, preferably 10 to 30 μm, and a conductive substance diffusion preventing layer is formed on inner wall surfaces of the through holes.

As a method of forming the through holes in the core member, drilling, laser processing using a carbon dioxide laser or a YAG laser, dry etching, or sandblasting is used depending on a material property of the core member. On the other hand, in terms of capability of forming fine holes, dry etching based on the ICP-RIE (Inductively Coupled Plasma-Reactive Ion Etching) method is preferable, while, in terms of the productivity, sandblasting is preferable. It is also a preferable method to use jointly the ICP-RIE method and the sandblasting method, thereby to use the ICP-RIE method on the side where the opening diameter of the through hole is small, and to use the sandblasting method on the side where the opening diameter is large.

Further, it is also a preferable method wherein, in the through hole forming process, fine holes are formed in the core member, then the core member is polished to form penetrating holes.

Moreover, it is also a preferable method wherein, after polishing the core member to a desired thickness in advance, the core member is polished from one side or both sides to thereby form penetrating holes.

When forming the through holes according to the foregoing processing method, in case of dry etching or sandblasting, there is used a method wherein a mask pattern is formed on the processing surface side of the core member, and the hole forming processing is carried out using the mask pattern as a mask.

First Embodiment of Manufacture Method

Based on FIGS. 12A to 12E and FIGS. 13A to 13E, the first embodiment of the manufacture method of the present invention will be described.

Figure 12A:
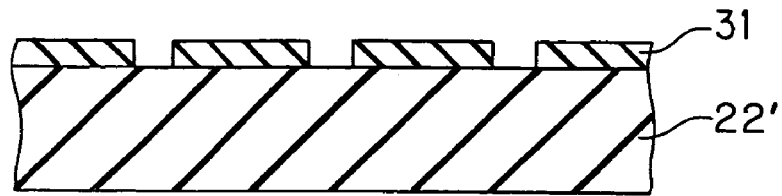
FIGS. 12A to 12E are process diagrams showing an embodiment (embodiment 1) of a manufacture method of the multilayer wiring board of the present invention.

FIGS. 12A to 12E and FIGS. 13A to 13E illustrate the manufacture method suitable for the case where silicon is used for the core member, wherein the through holes are formed by the ICP-RIE method. First, as shown in FIG. 12A, a predetermined mask pattern 31 is formed on one surface of a core member 22' using a mask material.

Figure 12B:
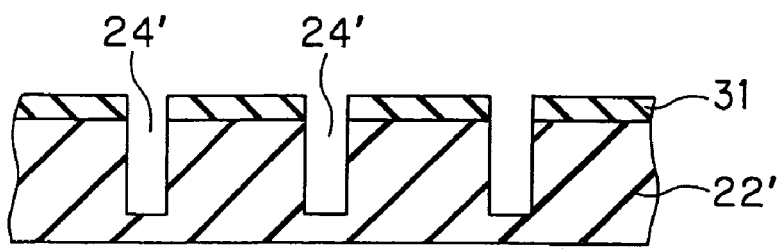

Then, using the mask pattern 31 as a mask, fine holes 24' are formed in the core member 22' to a predetermined depth by the ICP-RIE method (FIG. 12B). As a mask material upon etching, a positive type photoresist using normal novolak resin having dry etching resistance may be used, or a silicon thin film made of silicon oxide, silicon nitride, or the like that can take a large etching selective ratio relative to silicon, or a metal thin film made of titanium, tungsten, aluminum, or the like may be formed in advance, then patterned by the photo-etching method so as to be used as the mask material.

Upon etching, an ICP-RIE device normally put on the market can be used. As etching gas, fluorine gas such as $SF_6$, $CF_4$, $C_2F_6$, $C_3F_8$, or the like can be used. Further, for increasing an etching rate, it is possible to slightly mix oxygen or nitrogen within a range not affecting the mask material.

Figure 12C:
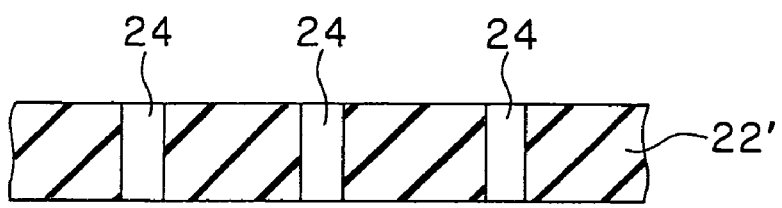

After forming the fine holes 24' in the core member 22' into the predetermined depth, the mask pattern 31 is removed from the core member 22', then the other surface of the core member 22' is polished to thereby expose the fine holes 24' with a predetermined opening diameter on the surfaces of the core member 22' to form through holes 24 (FIG. 12C). Polishing of the core member 22' can be carried out by backgrind, polishing, or the like. In this embodiment, silicon is used as the core member, and the through holes 24 having substantially equal opening diameters on the front and the back are obtained by polishing after trench etching.

Figure 12D:
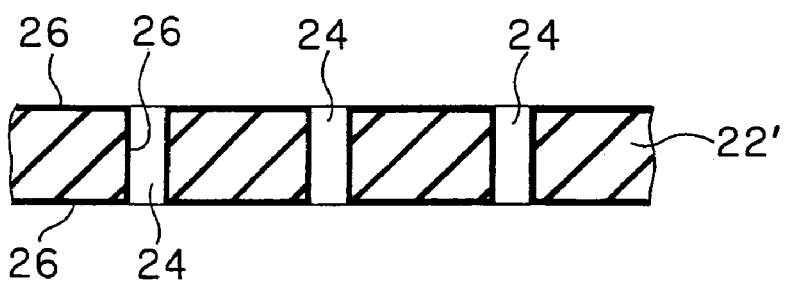

Then, an insulating layer 26 is formed on both surfaces of the core member 22' formed with the through holes 24, and on inner wall surfaces of the through holes (FIG. 12D). When, for example, the core member 22' is silicon, the insulating layer 26 of silicon oxide can be formed on the surfaces of the core member 22' including the through holes 24 by thermal oxidation. On the other hand, the insulating layer of silicon oxide, silicon nitride, or the like can be formed on the surfaces of the core member by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 2, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

After the formation of the insulating layer 26, or after the formation of the insulating layer 26 and the conductive substance diffusion preventing layer, it is possible to form wiring (not shown) on one surface or both surfaces of the core member 22' depending on necessity. As a wiring forming method, either of the subtractive method using etching and the additive method using selective plating can be used. For example, a conductive thin film of aluminum, copper, or the like is formed on one surface of the core member by the vacuum film forming method and, after implementing electrolytic plating to provide a predetermined plating thickness, pattern etching is carried out by the photolithography method to form desired wiring.

Figure 12E:
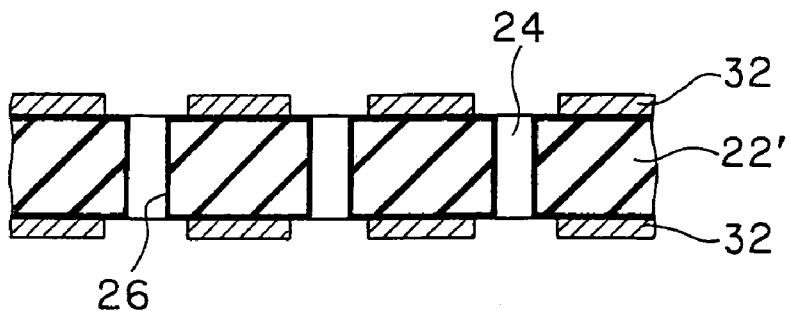

Then, dry films are laminated to the front and the back of the core member 22' as photosensitive resists, then exposed using photomasks having a desired land diameter of the through holes, and developed, thereby to form, on the front and the back of the core member 22', resist patterns 32 exposing the through holes 24 and peripheral portions around opening portions thereof (FIG. 12E).

Figure 13A:
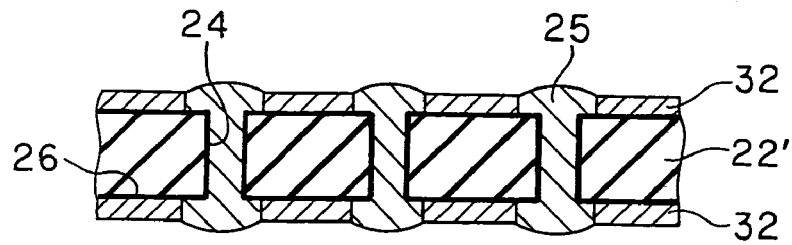
FIGS. 13A to 13E are process diagrams showing the embodiment (embodiment 1) of the manufacture method of the multilayer wiring board of the present invention.

Then, conductive paste is filled into the through holes and opening portions of the resist patterns as a conductive material 25 by the application method such as the screen printing (FIG. 13A). As the conductive paste, it is possible to use conductive paste such as copper paste or silver paste.

Figure 13B:
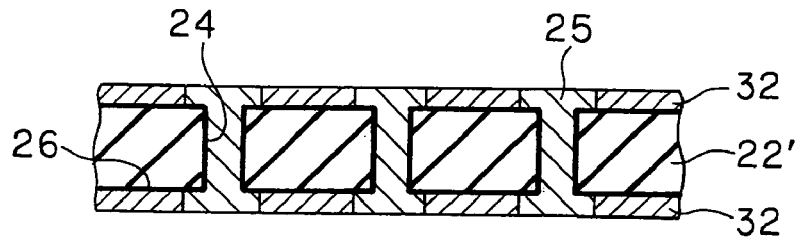

Subsequently, after drying to cure the conductive paste, the conductive material 25 protruding from the surfaces of the resist patterns 32 on both surfaces on the front and the back is polished to be removed so that the surfaces of the conductive material 25 and the surface of each resist pattern 32 form the same plane (FIG. 13B).

Figure 14A:
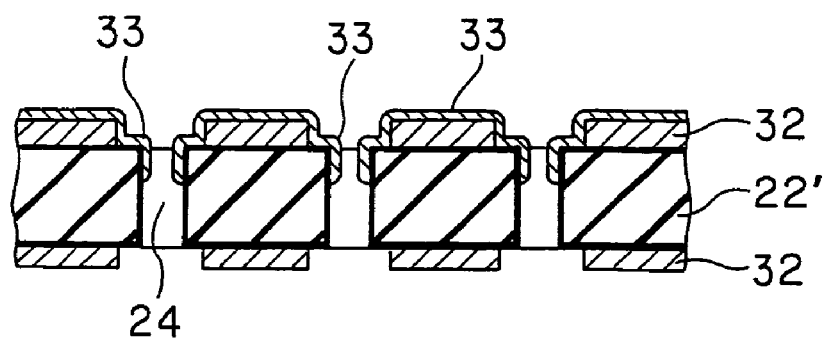
FIGS. 14A to 14B are process diagrams for explaining one example of a method of filling a conductive material into a through hole.
Figure 14B:
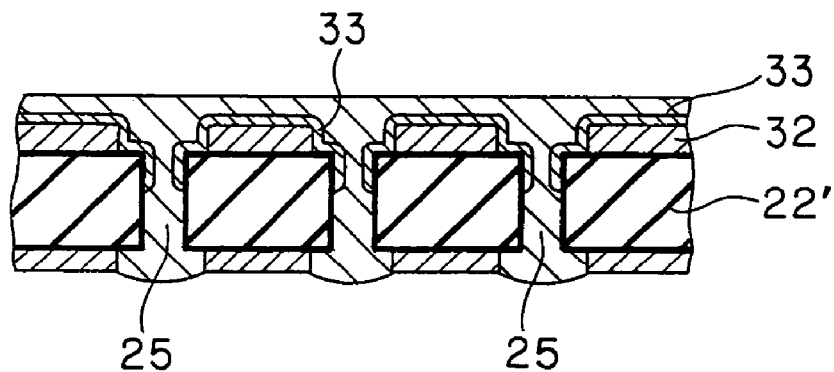

As a method of filling the conductive material 25 into the through holes and the resist pattern opening portions, a method using electrolytic plating may be used other than the forgoing method of filling the conductive paste. For example, as shown in FIG. 14A, an under conductive thin film is formed from one side of the core member 22' by the vacuum film forming method to form a seed layer 33 on portions of the side of the through holes 24 and on the resist pattern opening portions. Thereafter, by electrolytic plating using the seed layer 33, metal is deposited to be filled in the through holes 24 and the resist pattern opening portions (FIG. 14B). Further, as a method of filling the conductive material 25, the following method can be cited. After forming the insulating layer 26 as shown in FIG. 12D, a conductive substance diffusion preventing layer is first formed in the through holes 24. Then, an under conductive thin film is formed on one surface of the core member 22' by the vacuum film forming method, thereby to form a seed layer 33 on one surface of the core member 22' and portions in the through holes 24. Then, as shown in FIG. 12E, resist patterns 32 are formed on the front and the back of the core member 22'. Thereafter, by electrolytic plating using the foregoing seed layer 33, metal is deposited to be filled in the through holes 24 and the resist pattern opening portions.

As the foregoing seed layer 33, a conductive film of copper or the like having a thickness of 0.05 to 0.5 μm is desirable.

Figure 13C:
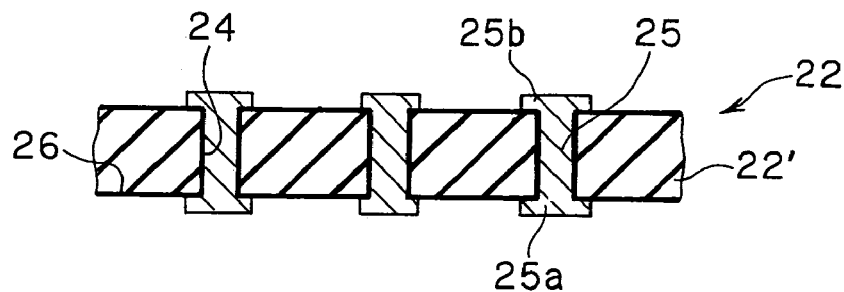
Figure 13D:
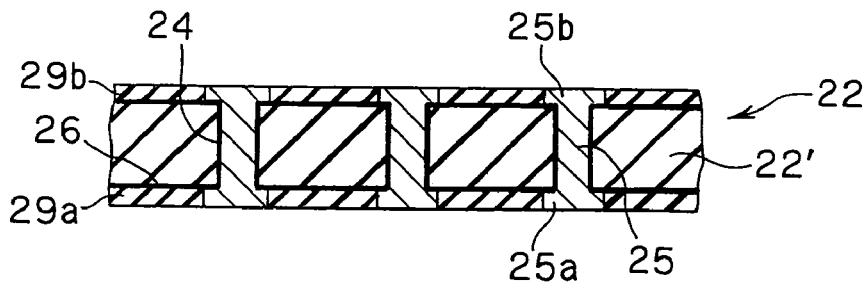

Then, the resists 32 are peeled off to form a core board 22 having lands 25a, 25b of a desired diameter formed by the conductive material 25 on the front and the back of the core board 22, and having the through holes 24 filled with the conductive material 25 (FIG. 13C). A height of the lands 25a, 25b formed by the conductive material protruding from the through hole is defined by a resist thickness of the dry film resist, while the land diameter is defined by a size of the mask pattern. When filling the conductive material 25 in the through holes 24 by plating, the conductive material 25 is allowed to protrude from the surfaces of the resists 32. In this case, polishing may be carried out to cause the surface of each resist 32 and the surfaces of the conductive material 25 to form the same plane, or the conductive material may be polished to a desired protrusion height (5 to 15 μm) after the removal of the resists 32.

In the manufacture method of the present invention, the dry film resists also serve to provide an effect to prevent a problem that, upon drying to cure the conductive paste, the wiring layers formed of copper, aluminum, or the like and provided on the surfaces of the core member 22' in the previous process are oxidized.

Then, electrically insulating layers 29a, 29b are formed on one surface or both surfaces of the core board 22 so as to also serve as flattening layers (13D). The electrically insulating layers 29a, 29b are each formed by, for example, patterning photosensitive resin such as benzocyclobutene resin, cardo resin, or polyimide resin by the photolithography method.

Then, on the land 29b side (the side opposite to the semiconductor chip mounting side) of the core board 22, a buildup wiring layer is formed via the electrically insulating layer.

First, photosensitive resin, which will be an electrically insulating layer, is applied, by the spinner application method or the like, onto the core board 22 flattened by the electrically insulating layer 29b, then exposed using a photomask for formation of vias, and developed to thereby form a pattern, then the resin is cured by a heat treatment to form an electrically insulating layer 30a. As the photosensitive resin, benzocyclobutene resin, cardo resin, or polyimide resin, for example, can be cited as a preferable material.

Then, wiring is formed by the semi-additive method. Specifically, a conductive thin film layer for plating base is formed on the whole surface of the patterned electrically insulating layer 30a by the vacuum film forming method such as the sputtering method. The conductive thin film layer is made of metal such as copper, silver, or nickel, and can be formed in a thickness of, for example, about 0.1 to 0.5 μm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 to 10 μm is used. Subsequently, a conductor such as copper, silver, or gold is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by flash etching to thereby obtain wiring layers having desired vias 28a and wirings 27a.

Figure 13E:
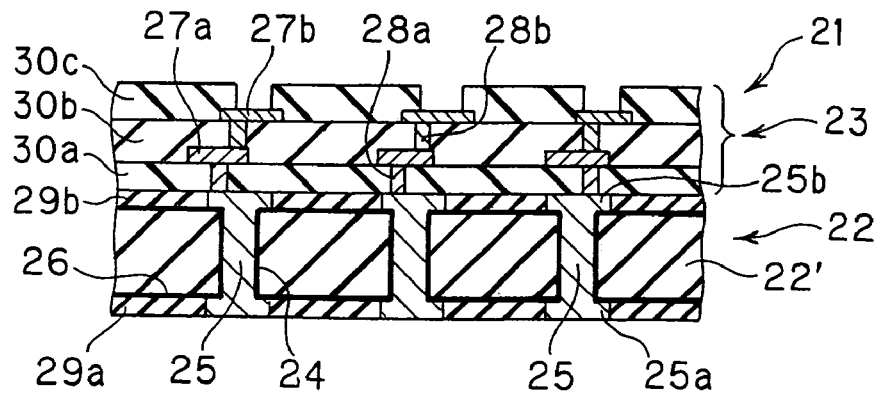

When forming multilayer wirings, they can be formed by repeating the foregoing process. Specifically, the next electrically insulating layer is formed, and then the next vias and wirings are formed (FIG. 13E). FIG. 13E shows a buildup wiring layer 23 in the state where an insulating layer 30c is formed on the surfaces of wirings 27b.

As shown in FIG. 13E, a multilayer wiring board 21 of the present invention manufactured as described above has the structure wherein the conductive material 25 protrudes from the surfaces of the core member, and is provided with the buildup wiring layer 23 on the land 29b side (the side opposite to the semiconductor chip mounting side) of the core board 22.

In the multilayer wiring board manufacture method of the present invention, since the vias and the wiring layers forming the buildup wiring layer are formed by the plating method, it is possible to stably form fine wiring patterns.

Further, in the multilayer wiring board manufacture method of the present invention, since the through holes each having the small opening diameter are formed, the wiring can be highly densified, the degree of freedom for wiring design of the high density structure can be further increased, and it is advantageous for forming the high density wiring.

Second Embodiment of Manufacture Method

FIGS. 15A to 15E and FIGS. 16A to 16D illustrate the case wherein through holes are formed by the sandblasting method, wherein a predetermined mask pattern 51 is formed on one surface of a core member 42' for a core board (FIG. 15A), and fine holes 44' each having a predetermined size are formed in the core member 42' by sandblasting using the mask pattern 51 as a mask (15B). In the present invention, the holes are not formed into penetrating holes, and the sandblasting is stopped in the stage where the perforation reaches a predetermined depth.

Figure 15A:
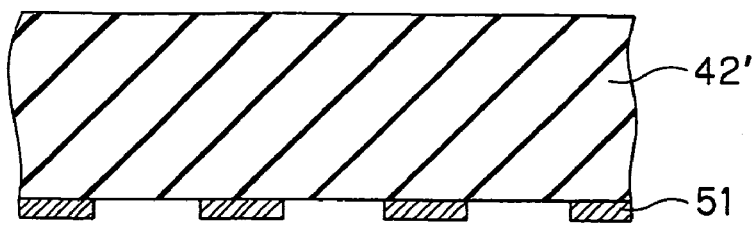
FIGS. 15A to 15E are process diagrams showing an embodiment (embodiment 2) of a manufacture method of the multilayer wiring board of the present invention.
Figure 15B:
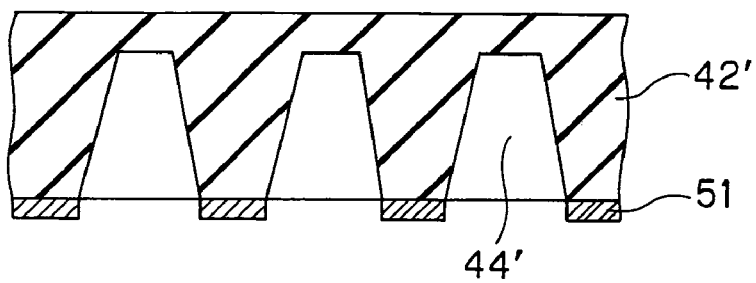
Figure 15C:
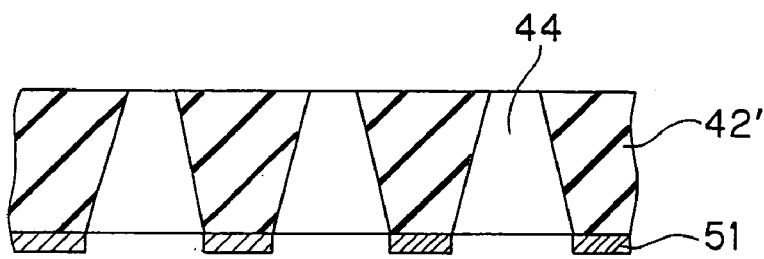

Then, the other surface of the core member is polished to expose the fine holes 44' to thereby obtain through holes 44, and further obtain a desired thickness of the core member (FIG. 15C). Polishing of the core member can be implemented by a polishing machine or the like. In case of the sandblasting, since the through holes are each tapered, it is possible, by polishing to a predetermined thickness, to expose each fine hole with a predetermined opening diameter to form the through hole.

After the formation of the through holes 44, an insulating layer (not shown) is formed on both surfaces of the core member 42' and on inner wall surfaces of the through holes 44. When, for example, the core member 42' is silicon, the insulating layer of silicon oxide can be formed on the surfaces of the core member 42' including the through holes 44 by thermal oxidation. On the other hand, the insulating layer of silicon oxide, silicon nitride, or the like can be formed on the surfaces of the core member by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 2, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

After the formation of the insulating layer as described above, or after the formation of the insulating layer and the conductive substance diffusion preventing layer, it is possible to form wiring (not shown) on one surface or both surfaces of the core member 42' depending on necessity. As a wiring forming method, either of the subtractive method using etching and the additive method using selective plating can be used. For example, a conductive thin film of aluminum, copper, or the like is formed on one surface of the core member by the vacuum film forming method and, after implementing electrolytic plating to form a plating film of a predetermined thickness, pattern etching is carried out by the photolithography method to form desired wiring.

Figure 15D:
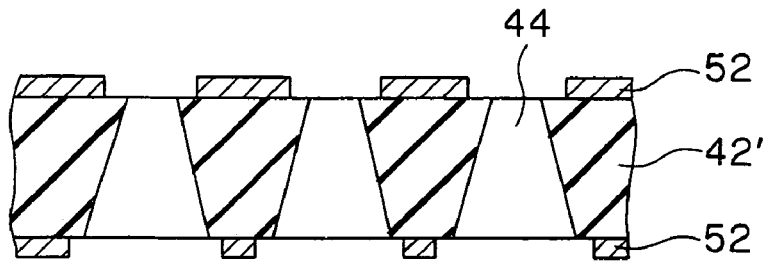

Then, dry films are laminated to the front and the back of the core member 42' as photosensitive resists, then exposed using photomasks having desired land diameters of the through holes, and developed, thereby to form, on the front and the back of the core member 42', resist patterns 52 exposing the through holes 44 and peripheral portions around opening portions thereof (FIG. 15D).

Figure 15E:
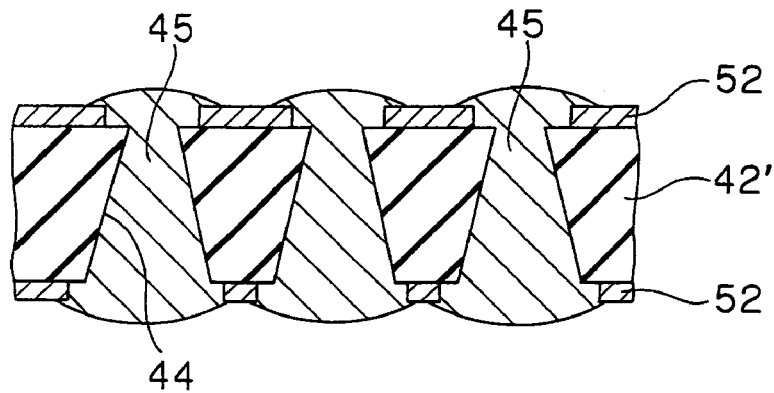

Then, conductive paste is filled into the through holes 45 and opening portions of the resist patterns 52 as a conductive material 45 by the application method such as the screen printing (FIG. 15E). As the conductive paste, it is possible to use conductive paste such as copper paste or silver paste.

Figure 16A:
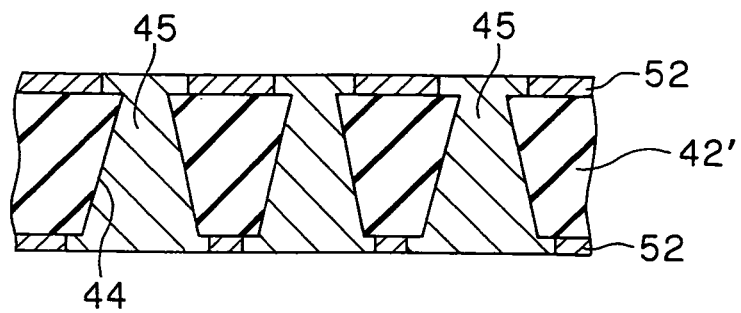
FIGS. 16A to 16D are process diagrams showing the embodiment (embodiment 2) of the manufacture method of the multilayer wiring board of the present invention.

Subsequently, after drying to cure the conductive paste, the conductive material 45 protruding from the surfaces of the resist patterns 52 on the front and the back is polished to be removed so that the surfaces of the conductive material 45 and the surface of each resist pattern 52 form the same plane (FIG. 16A). On the other hand, it is also possible to first remove the resist patterns 52, and then polish the conductive material 45 to a desired protrusion height (5 to 15 μm).

As a method of filling the conductive material 45 into the through holes and the resist pattern opening portions, the method of filling by electrolytic plating using the seed layer as described in the foregoing first embodiment can be used other than the forgoing method of filling the conductive paste.

When the through holes are formed by the sandblasting method, since the through holes are each tapered, adhesion of the conductive material 25 to the inner wall surfaces of the through holes from the side of the core member 42' where the opening diameter is large, becomes easy, and therefore, the yield of the through hole conduction establishing process is improved, and a time is shortened, so that stable manufacturing and reduction in manufacturing cost are made possible.

Figure 16B:
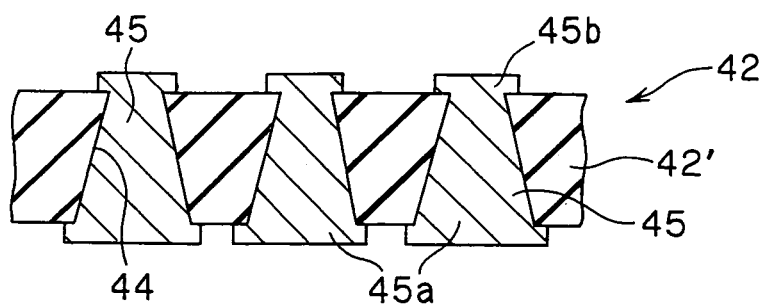

Then, the resist patterns 52 are peeled off to form a core board 42 having desired lands 45a, 45b formed by the conductive material 45 on the front and the back of the core member 42', and having the through holes 44 filled with the conductive material 45 (FIG. 16B). A height of the lands 45a, 45b formed by the conductive material protruding from the through hole is defined by a resist thickness of the dry film resist, while the land diameters are defined by sizes of the mask patterns.

Figure 16C:
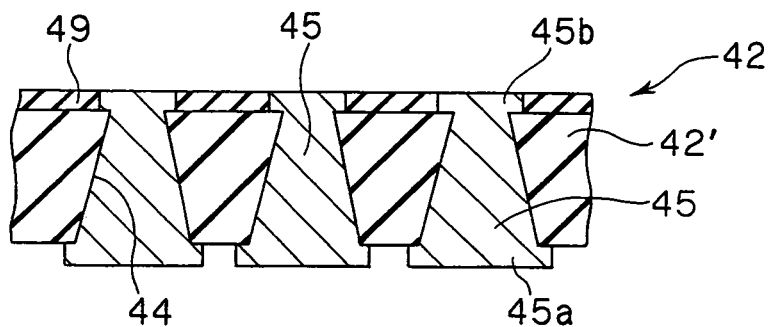

Then, an electrically insulating layer is formed on one surface or both surfaces of the core board 42 so as to also serve as a flattening layer. FIG. 16C shows an example wherein an insulating layer 49 is provided on the side where the opening diameter of the through hole 44 is small. The insulating layer 49 is formed by, for example, patterning photosensitive resin such as benzocyclobutene resin, cardo resin, or polyimide resin by the photolithography method.

Then, on the side of the core board 42 where the opening diameter of the through hole 44 is small, a buildup wiring layer is formed via the electrically insulating layer.

First, photosensitive resin, which will be an electrically insulating layer, is applied onto the flattened core board 42 by the spinner application method or the like, then exposed using a photomask for formation of vias, and developed to thereby form a pattern, then the resin is cured by heat curing to form an electrically insulating layer 50a. As the photosensitive resin, benzocyclobutene resin, cardo resin, or polyimide resin, for example, can be cited as a preferable material.

Then, a wiring layer is formed by the semi-additive method. Specifically, a conductive thin film layer for plating base is formed on the whole surface of the patterned electrically insulating layer 50a by the vacuum film forming method such as the sputtering method. The conductive thin film layer is made of metal such as copper, silver, or nickel, and is formed in a thickness of, for example, about 0.1 to 0.5 µm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 to 10 µm is used. Subsequently, a conductor such as copper, silver, or gold is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by flash etching to thereby obtain a wiring layer having desired vias 48a and wirings 47a.

Figure 16D:
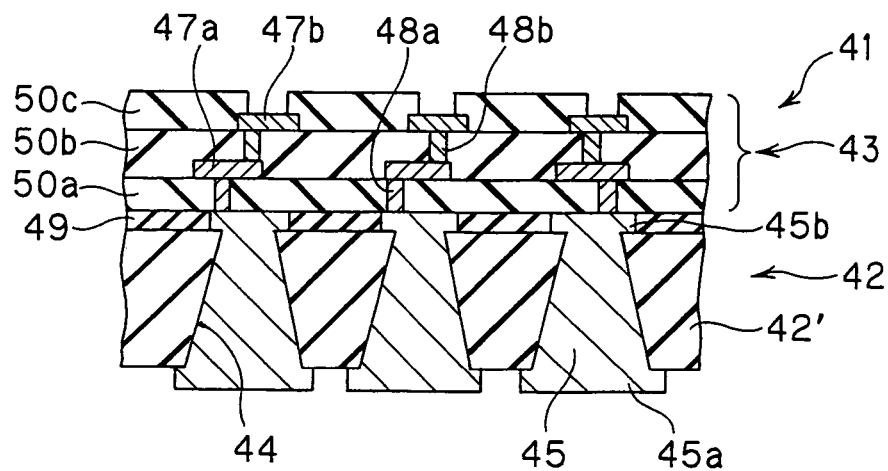

When forming multilayer wirings, they can be formed by repeating the foregoing process. Specifically, the next electrically insulating layer is formed, and then the next vias and wirings are formed. FIG. 16D shows a buildup wiring layer 43 in the state where an insulating layer 50c is formed on the surfaces of wirings 47b.

As shown in FIG. 16D, a multilayer wiring board 41 of the present invention manufactured as described above has the structure wherein the conductive material 45 protrudes from the surfaces of the core board, and is provided with the buildup wiring layer 43 on the side of the core board where the opening diameter of the through hole 44 is small.

In the multilayer wiring board manufacture method of the present invention, since the vias and the wiring layers of the buildup wiring layer are formed by the plating method, it is possible to stably form fine wiring patterns.

Further, in the multilayer wiring board manufacture method of the present invention, since the buildup wiring layer 43 is provided on the side where the opening diameter of the through hole is small, the wiring can be highly densified, the degree of freedom for wiring design of the high density structure can be further increased, and it is advantageous for forming the high density wiring.

Third Embodiment of Manufacture Method

FIGS. 17A to 17E and FIGS. 18A to 18B are process diagrams showing another embodiment of the multilayer wiring board manufacture method of the present invention, wherein the ICP-RIE method and the sandblasting method are jointly used.

Figure 17A:
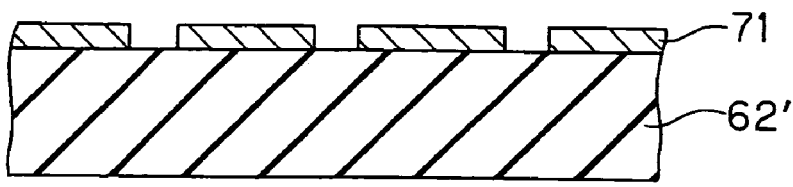
FIGS. 17A to 17E are process diagrams showing an embodiment (embodiment 3) of a manufacture method of the multilayer wiring board of the present invention.

In the multilayer wiring board manufacture method, a core member for a core board is first polished on both surfaces thereof to have a predetermined thickness, thereafter, a mask pattern 71 with a predetermined pattern is formed on one surface of the core member 62' having the predetermined thickness (FIG. 17A). The core member can use the same material as the foregoing 22' and 42'. Polishing of the core member can be carried out by backgrind, polishing, or the like, and a thickness of the core member 62' after the polishing can be set taking into consideration a thickness of the core board to be produced.

Figure 17B:
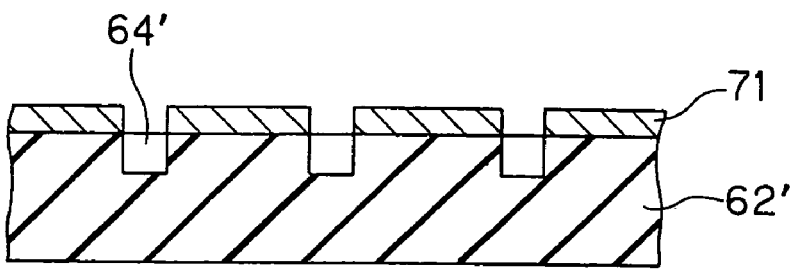

Then, using the mask pattern 71 as a mask, fine holes 64' are formed in the core member 62' to a predetermined depth by the ICP-RIE method (FIG. 17B). As a mask material upon etching, a positive type photoresist using normal novolak resin having dry etching resistance may be used or, when the core member is silicon, a silicon thin film made of silicon oxide, silicon nitride, or the like that can take a large etching selective ratio relative to silicon, or a metal thin film made of titanium, tungsten, aluminum, or the like may be formed in advance, then patterned by the photoetching method so as to be used as the mask material.

Upon etching, like in the first embodiment, an ICP-RIE device normally put on the market can be used. When the core member is silicon, fluorine gas such as $SF_6$, $CF_4$, $C_2F_6$, $C_3F_8$, or the like can be used as etching gas.

Figure 17C:
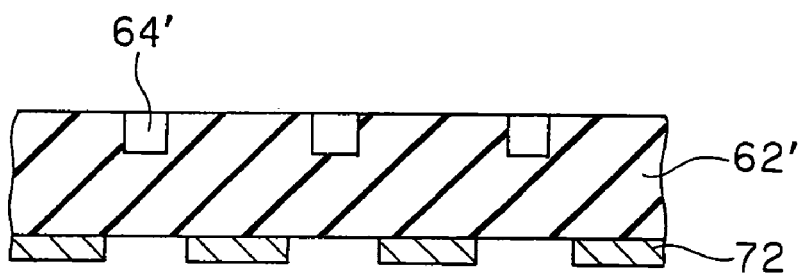

Then, the mask pattern 71 is peeled off, and a mask pattern 72 having opening portions larger than those of the foregoing mask pattern 71 is provided on the other surface of the core member so as to be matched in position to the fine holes 64' on the back (FIG. 17C).

Figure 17D:
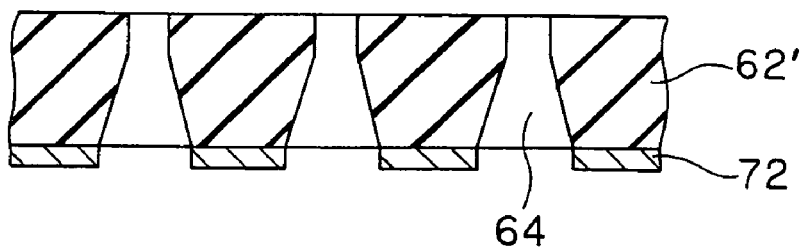

Subsequently, fine holes each having a predetermined size are, by sandblasting, formed in the core member 62' using the mask pattern 72 as a mask so as to penetrate to be joined to the fine holes 64', thereby forming through holes 64 (FIG. 17D).

In this embodiment, the description has been given about the method wherein the fine holes are first formed by the ICP-RIE method, then the through holes are formed by the sandblasting method. However, such a method is also possible that the order is reversed so that the sandblasting is first carried out, then the holes are made through by the ICP-RIE.

In the manufacture method of the present invention, the fine holes are formed by the ICP-RIE method on the side of the core member where a buildup wiring layer is formed, while the perforation processing is carried out by the sandblasting method on the other side of the core member, so that a through hole forming time is largely shortened, and yet, the fine holes can be formed.

Figure 17E:
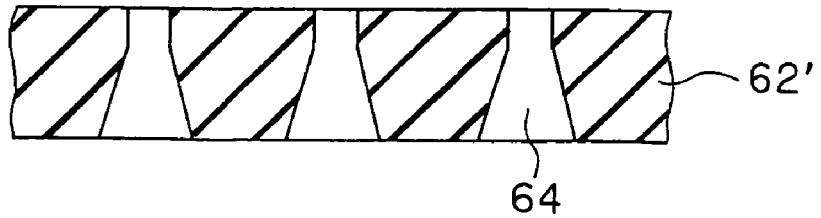

After the formation of the through holes 64, the mask pattern 72 is peeled off (FIG. 17E).

When the core member is silicon being semiconductor, after the formation of the through holes 64, an insulating layer (not shown) is formed on both surfaces of the core member 62' and on inner wall surfaces of the through holes 64. When, for example, the core member 62' is silicon, the insulating layer of silicon oxide can be formed on the surfaces of the core member 62' including the through holes 64 by thermal oxidation. On the other hand, the insulating layer of silicon oxide, silicon nitride, or the like can be formed on the surfaces of the core member by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 2, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

After the formation of the insulating layer as described above, or after the formation of the insulating layer and the conductive substance diffusion preventing layer, it is possible to form wiring (not shown) on one surface or both surfaces of the core member 62' depending on necessity. As a wiring forming method, either of the subtractive method using etching and the additive method using selective plating can be used. For example, a conductive thin film of aluminum, copper, or the like is formed on one surface of the core member by the vacuum film forming method and, after implementing electrolytic plating to form a plating film of a predetermined thickness, pattern etching is carried out by the photolithography method to form desired wiring.

Then, like in the foregoing first and second embodiments, dry films are laminated to the front and the back of the core member 62' as photosensitive resists, then exposed using photomasks having desired land diameters of the through holes, and developed, thereby to form, on the front and the back of the core member, resist patterns exposing the through holes 64 and peripheral portions around opening portions thereof. Then, conductive paste is filled into the through holes and opening portions of the resist patterns as a conductive material 65 by the application method such as the screen printing. As the conductive paste, it is possible to use conductive paste such as copper paste or silver paste.

Subsequently, after drying to cure the conductive paste, the conductive material 65 protruding from the surfaces of the resist patterns on the front and the back is polished to be removed so that the surfaces of the conductive material 65 and the surface of each resist pattern form the same plane.

As a method of filling the conductive material 65 into the through holes and the resist pattern opening portions, the method of filling by electrolytic plating using the seed layer as described in the foregoing first embodiment can be used other than the forgoing method of filling the conductive paste.

Figure 18A:
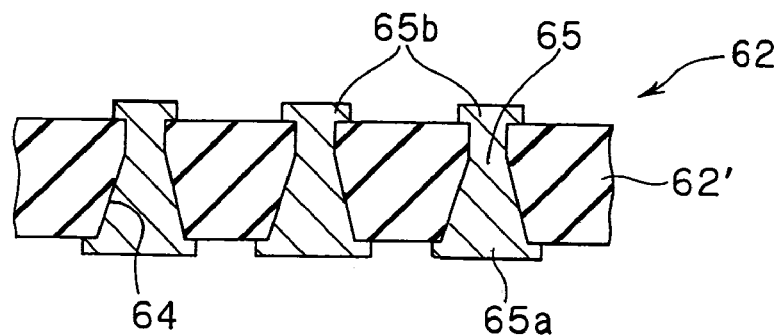
FIGS. 18A to 18B are process diagrams showing the embodiment (embodiment 3) of the manufacture method of the multilayer wiring board of the present invention.

Then, the resist patterns are peeled off to form a core board 62 having lands 65a, 65b of desired diameters formed by the conductive material 65 on the front and the back of the core board 62, and having the through holes 64 filled with the conductive material 65 (FIG. 18A).

Figure 18B:
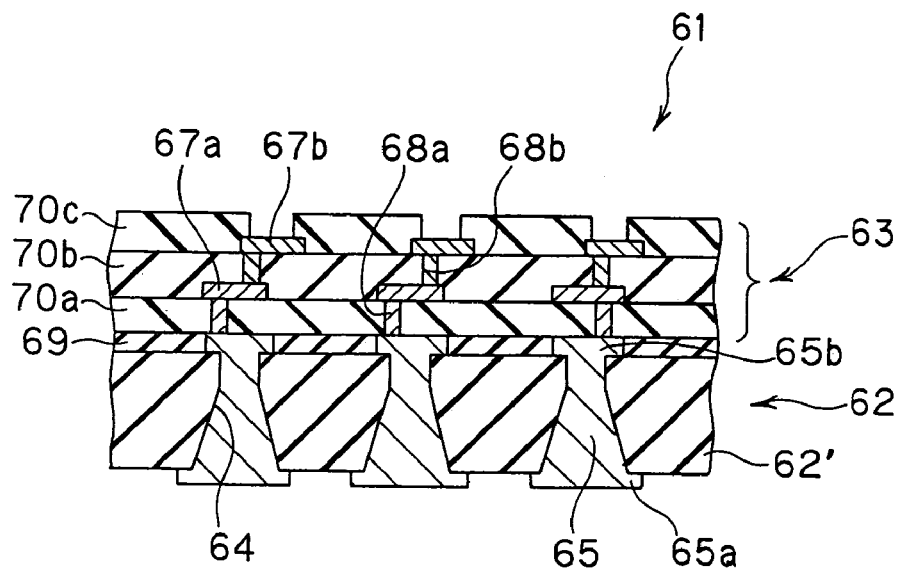

Then, an electrically insulating layer is formed on one surface or both surfaces of the core board 62 so as to also serve as a flattening layer. FIG. 18B shows an example wherein an electrically insulating layer 69 is formed on one surface of the core board 62. The electrically insulating layer 69 is formed by, for example, patterning photosensitive resin such as benzocyclobutene resin, cardo resin, or polyimide resin by the photolithography method.

Then, on the side of the core board 62 where the opening diameter of the through hole 64 is small, a buildup wiring layer 63 is formed via the electrically insulating layer by the semi-additive method like in the first and second embodiments. Specifically, a patterned electrically insulating layer 70a is formed, and a conductive thin film layer for plating base is formed on the whole surface of the electrically insulating layer 70a by the vacuum film forming method such as the sputtering method. The conductive thin film layer is made of metal such as copper, silver, or nickel, and is formed in a thickness of, for example, about 0.1 to 0.5 μm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 to 10 μm is used. Subsequently, a conductor such as copper, silver, or gold is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by flash etching to thereby obtain wiring layers having desired vias 68a and wirings 67a.

When forming multilayer wirings, they can be formed by repeating the foregoing process. Specifically, the next electrically insulating layer is formed, and then the next vias and wirings are formed (FIG. 18B). FIG. 18B shows a buildup wiring layer 63 in the state where an insulating layer 70c is formed on the surfaces of wirings 67b.

As shown in FIG. 18B, a multilayer wiring board 61 of the present invention manufactured as described above has the structure wherein the conductive material 65 protrudes from the surfaces of the core member, and is provided with the buildup wiring layer 63 on the side of the core board 62 where the opening diameter of the through hole 64 is small.

In the multilayer wiring board manufacture method of the present invention, since the vias and the wiring layers of the buildup wiring layer are formed by the plating method, it is possible to stably form fine wiring patterns.

Further, in the multilayer wiring board manufacture method of the present invention, since the buildup wiring layer 63 is provided on the side where the opening diameter of the through hole is small, the wiring can be highly densified, the degree of freedom for wiring design of the high density structure can be further increased, and it is advantageous for forming the high density wiring.

Fourth Embodiment of Manufacture Method

FIGS. 19A to 19D and FIGS. 20A to 20B are process diagrams showing another embodiment of the multilayer wiring board manufacture method of the present invention, which is a method of first providing electrically insulating layers.

Figure 19A:
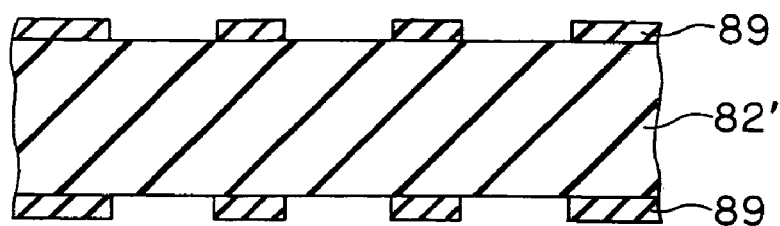
FIGS. 19A to 19D are process diagrams showing an embodiment (embodiment 4) of a manufacture method of the multilayer wiring board of the present invention.

In the multilayer wiring board manufacture method of the present invention, electrically insulating layers 89 are first formed on both surfaces of a core member 82' for a core board at portions other than through hole forming regions (FIG. 19A). As the electrically insulating layers 89, thin films of silicon oxide, silicon nitride, or the like may be formed on the surfaces of the core member 82' using the vacuum film forming method such as the plasma CVD method, and then formed into patterns by photoetching. On the other hand, resin such as benzocyclobutene resin, cardo resin, or polyimide resin being photosensitive insulating resin may be applied to the surfaces of the core member 82', patterned by the photolithography method, and then heat-cured, thereby forming the electrically insulating layers 89.

Figure 19B:
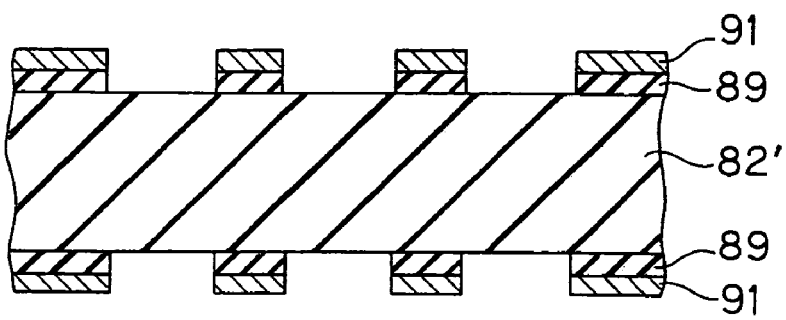

Next, resist patterns 91 are formed, using dry film resists or the like, on both surfaces of the core member 82' at portions other than the through hole forming regions so as to cover the foregoing electrically insulating layers 89 (FIG. 19B).

Figure 19C:
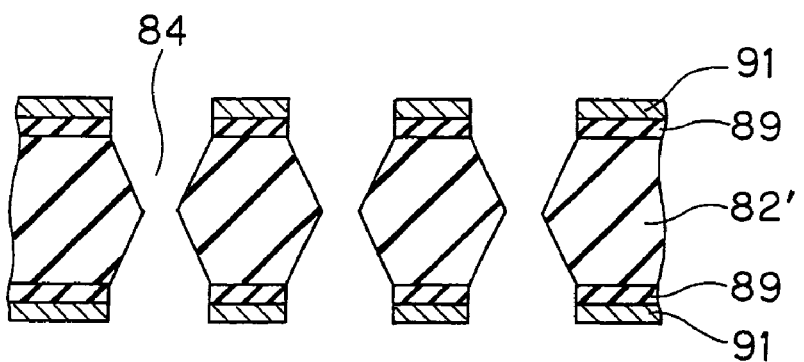

Then, opening portions of the resist patterns 91 are sandblasted from one surface or both surfaces of the core member 82' to form through holes 84 (FIG. 19C). Since a perforation processing time is reduced to half by carrying out sandblasting from both surfaces, the both-surface sandblasting is more preferable. Sizes of upper and lower opening portion inlets of the through hole 84 can be defined to desired sizes by the resist patterns 91.

After forming the through holes 84 as described above, an insulating layer (not shown) may be formed on inner wall surfaces of the through holes 84. As this insulating layer, an insulating layer of silicon oxide, silicon nitride, or the like can be formed on the surfaces of the core member by the use of, for example, the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 2, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

Figure 19D:
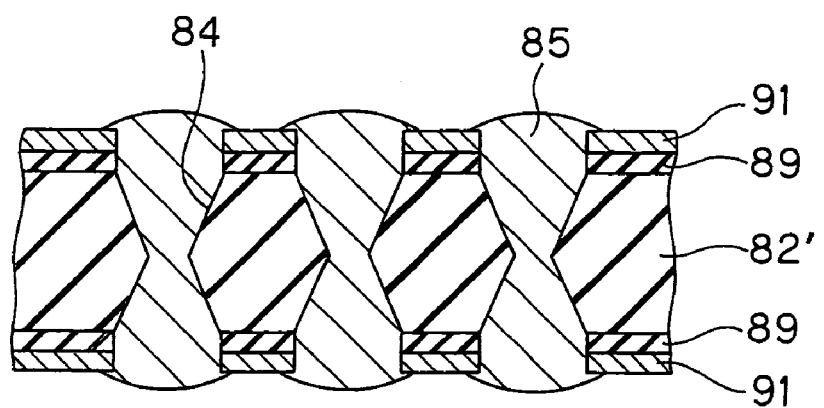

Then, conductive paste is filled into the through holes 84 and opening portions of the electrically insulating layers 89 and the resist patterns 91 as a conductive material 85 by the application method such as the screen printing (FIG. 19D). As the conductive paste, it is possible to use conductive paste such as copper paste or silver paste.

Figure 20A:
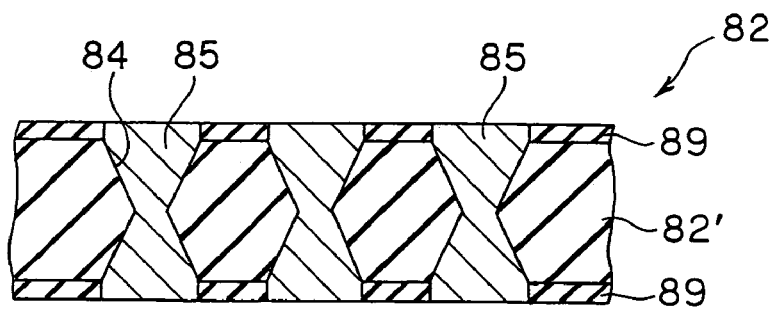
FIGS. 20A to 20B are process diagrams showing the embodiment (embodiment 4) of the manufacture method of the multilayer wiring board of the present invention.

Subsequently, after drying to cure the conductive paste, the resists 91 are peeled off, and the conductive material 85 protruding from the surfaces of the electrically insulating layers 89 on both surfaces on the front and the back is polished on both sides thereof to be removed so that the surfaces of the conductive material 85 and the surface of each electrically insulating layer 89 form the same plane. Thereby, regions other than the through holes 84 filled with the conductive material 85 are covered with the electrically insulating layers 89 to form a core board 82 having the front and back sides each forming the same flat plane (FIG. 20A).

As a method of filling the conductive material 85 into the through holes 84 and the opening portions of the electrically insulating layers 89 and the resist patterns 91, the method of filling by electrolytic plating using the seed layer as described in the foregoing first embodiment can be used other than the forgoing method of filling the conductive paste.

Then, on one surface of the core board 82, a buildup wiring layer is formed via an electrically insulating layer by the semi-additive method like in the first, second and third embodiments. The electrically insulating layer is formed by, for example, patterning photosensitive resin such as benzocyclobutene resin, cardo resin, or polyimide resin by the photolithography method. Specifically, a patterned electrically insulating layer 90a is formed, and a conductive thin film layer for plating base is formed on the whole surface of the electrically insulating layer 90a by the vacuum film forming method such as the sputtering method. The conductive thin film layer is made of metal such as copper, silver, or nickel, and is formed in a thickness of, for example, about 0.1 to 0.5 μm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 μm to 10 μm is used. Subsequently, a conductor such as copper, silver, or gold is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by flash etching to thereby obtain wiring layers having desired vias 88a and wirings 87a.

Figure 20B:
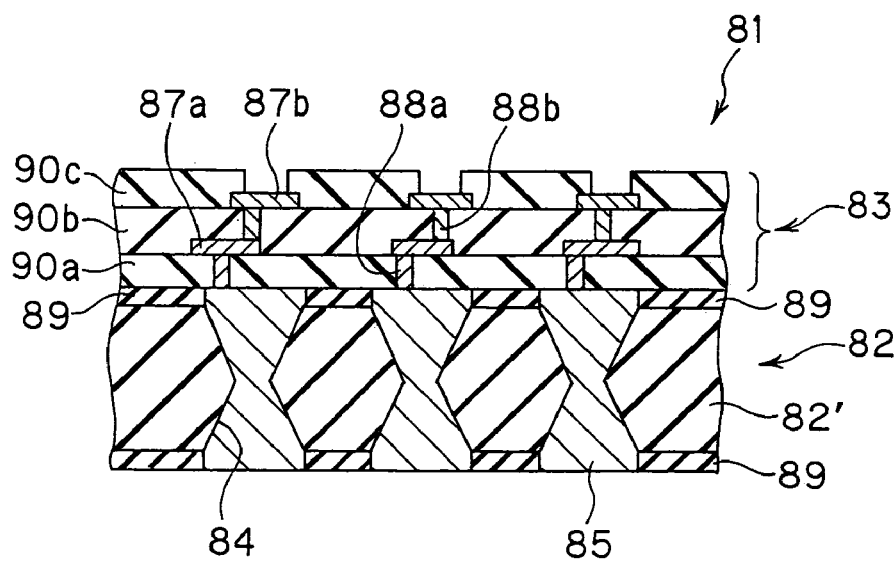

When forming multilayer wirings, they can be formed by repeating the foregoing process. Specifically, the next electrically insulating layer is formed, and then the next vias and wirings are formed (FIG. 20B). FIG. 20B shows a buildup wiring layer 83 in the state where an insulating layer 90c is formed on the surfaces of wirings 87b.

As shown in FIG. 20B, a multilayer wiring board 81 of the present invention manufactured as described above has a merit that since the surfaces of the conductive material 85 filled in the through holes 84 and the surface of each electrically insulating layer 89 form the substantially same flat plane, there are no steps so that a flattening process is not required.

In the foregoing manufacture method of the present invention, since a diameter of a land provided at the opening portion of the through hole can be desirably and fully ensured, it has a merit that wiring connection between wiring boards following reduction in through hole diameter for the high density mounting is facilitated, and semiconductor chip mounting where solder bumps are formed on the board is also facilitated.

Further, in the buildup wiring layer constituting the multilayer wiring board of the present invention, the wiring layers (vias and wiring patterns) are formed by the photolithography method and the plating method, and therefore, the wiring with fine line widths and narrow pitches is made possible. Further, since the vias of the multilayer wiring can be formed in the stack structure, the high density wiring is made possible.

Further, the multilayer wiring board of the present invention can be reduced in size and weight while possessing high-performance electrical properties owing to the dimensional minimization and higher densification, and thus can be used in various ways.

Next, the multilayer wiring board manufacture methods of the present invention using the capacitor built-in multilayer wiring boards shown in FIGS. 3 to 11 as examples will be described as the fifth to tenth embodiments of the manufacture methods.

In the multilayer wiring board manufacture method of the present invention, a material of which a thermal expansion coefficient in XY directions falls within a range of 2 to 20 ppm, selected from silicon, ceramics, glass, a glass-epoxy composite, and metal is used as a core member. A thickness of a core board is preferably used within a range of 50 to 300 μm, and an opening diameter of a through hole is preferably set within a range of 10 to 300 μm. In the present invention, a fine hole represents a hole in the state where it does not penetrate the core member, while a through hole represents, as is normally used, a hole in the state where it penetrates the core board.

As a method of forming fine holes in the core member, drilling, laser processing using a carbon dioxide laser or a YAG laser, dry etching, or sandblasting is used depending on a material property of the core member. On the other hand, in terms of capability of forming the fine holes, dry etching based on the ICP-RIE (Inductively Coupled Plasma-Reactive Ion Etching) method is preferable, while, in terms of the productivity, sandblasting is preferable.

When forming the fine holes according to the foregoing processing method, in case of dry etching or sandblasting, there is used a method wherein a mask pattern is formed on the processing surface side of the core member, and the perforation processing is carried out using the mask pattern as a mask.

Fifth Embodiment of Manufacture Method

FIGS. 21A to 21D and FIGS. 22A to 22D are process diagrams showing the manufacture method of the multilayer wiring board relating to one embodiment of the present invention shown in FIG. 3, which is a manufacture method that is suitable when silicon is used for a core board.

Figure 21A:
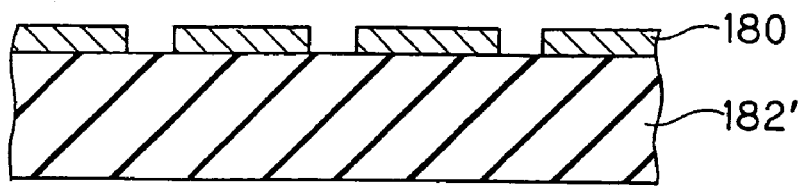
FIGS. 21A to 21D are process diagrams showing an embodiment (embodiment 5) of a manufacture method of the multilayer wiring board of the present invention.
Figure 21B:
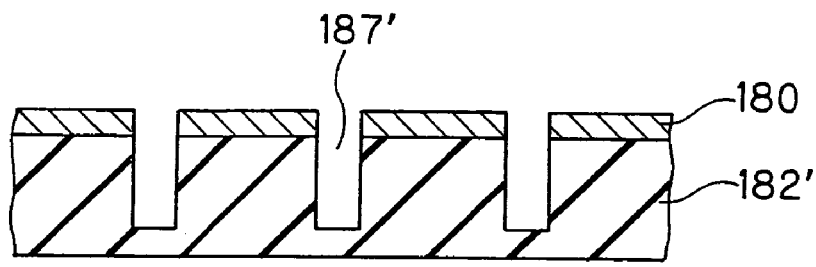

A predetermined mask pattern 180 is formed on one surface of a core member 182', which will be a core board, using a mask material (FIG. 21A). Then, using the mask pattern 180 as a mask, fine holes 187' are formed in the core member 182' to a predetermined depth by the ICP-RIE method (FIG. 21B). As a mask material upon etching, a positive type photoresist using normal novolak resin having dry etching resistance may be used, or a silicon thin film made of silicon oxide, silicon nitride, or the like that can take a large etching selective ratio relative to silicon, or a metal thin film made of titanium, tungsten, or the like may be formed in advance, then patterned by the photoetching method so as to be used as the mask material.

Upon etching, an ICP-RIE device normally put on the market can be used. As etching gas, fluorine gas such as $SF_6$, $CF_4$, $C_2F_6$, $C_3F_8$, or the like can be used. Further, for increasing an etching rate, it is possible to slightly mix oxygen or nitrogen within a range not affecting the mask material.

After perforating the core member 182' to the predetermined depth to form the fine holes 187', the mask pattern 180 is removed from the core member 182'.

Figure 21C:
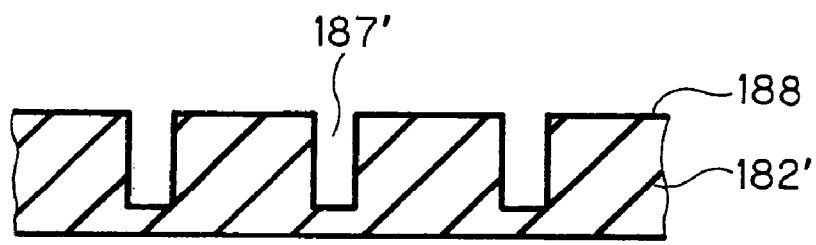

After forming the fine holes 187' as described above, when the core member 182' is silicon or metal being a conductor, an insulating layer 188 is formed on inner wall surfaces of the fine holes 187' and the whole surfaces of the core member 182' on the front and the back thereof (FIG. 21C).

For example, when the core member 182' is silicon, the insulating layer of silicon oxide can be formed on the surfaces of the core member 182' including the fine holes 187' by thermal oxidation. On the other hand, the insulating layer of silicon oxide, silicon nitride, or the like can be formed on the surfaces of the core member 182' by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 4, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

Figure 21D:
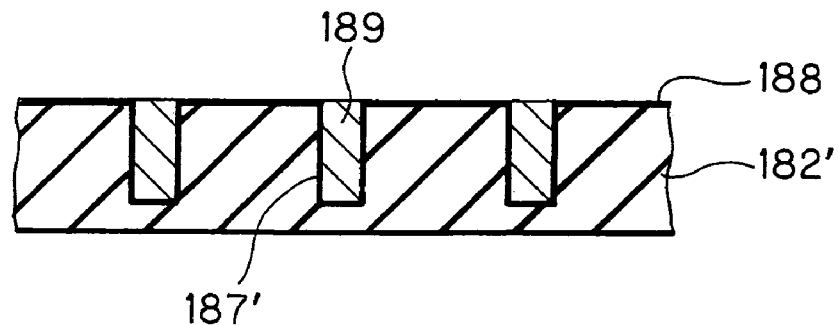

Then, as shown in FIG. 21D, a conductive material 189 is filled into the fine holes 187'. As the conductive material 189 filled into the fine holes 187', conductive paste such as copper paste or silver paste can be used. The filling into the fine holes 23 is performed by the screen printing or the like, then, by carrying out a heat treatment, electrical conductivity can be given. On the other hand, an under conductive thin film may be formed on the inner walls of the fine holes 23 by the vacuum film forming method such as sputtering or deposition, or the electroless plating method so as to serve as a seed layer, then, using the seed layer as a power feed layer, burying plating may be carried out by electrolytic plating using a conductive material such as copper, silver, gold, or nickel to provide the conductive fine holes.

Figure 22A:
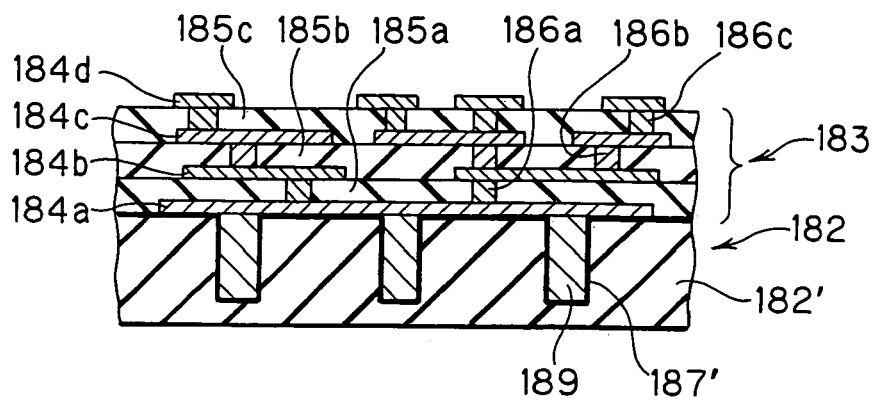
FIGS. 22A to 22D are process diagrams showing the embodiment (embodiment 5) of the manufacture method of the multilayer wiring board of the present invention.

Then, a multilayer wiring layer 183 is formed on one surface of a core board 182 (FIG. 22A). As the forming process of the multilayer wiring layer 183, either of the subtractive method using etching and the additive method using selective plating can be used.

For example, at the outset, a first wiring layer 184a is formed on the core member 182', subsequently, photosensitive resin, which will be an insulating layer, is applied by the spinner application method or the like, then exposed using a photomask for formation of vias 186a, and developed to thereby form a pattern, then the resin is cured by heat curing to form a first insulating layer 185a. As the photosensitive resin, benzocyclobutene resin, cardo resin, or polyimide resin, for example, can be cited as a preferable material.

Then, wiring is formed by the semi-additive method. Specifically, a conductive thin film layer for plating base is formed on the whole surface of the patterned insulating layer by the vacuum film forming method such as the sputtering method. The conductive thin film layer is made of metal such as Al, Cu, or Cr, and is formed in a thickness of, for example, about 0.1 to 0.5 μm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 to 10 μm is used. Subsequently, a conductor such as Cu is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by soft etching to thereby obtain a second wiring layer having desired vias 186a and wirings 184b.

When forming multilayer wirings, they can be formed by repeating the foregoing process. Specifically, a next insulating layer 185b is formed, and then next vias 186b and a third wiring layer 184c are formed (FIG. 22A). FIG. 22A shows a buildup multilayer wiring layer 183 composed of three insulating layers.

Figure 22B:
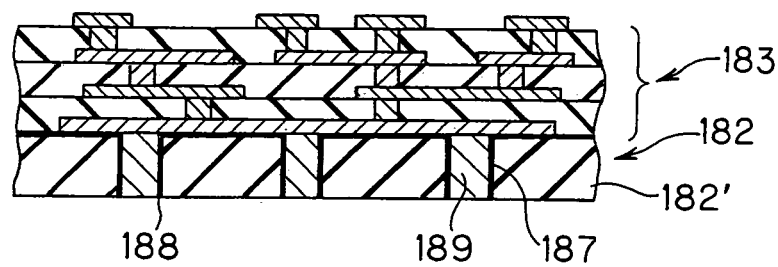

Then, the other surface of the core member 182' is polished to expose the fine holes 187' to thereby obtain through holes 187 having the conductive material 189, and further obtain the core board 182 with a desired thickness (FIG. 22B). Polishing of the core member can be carried out by backgrind, polishing, or the like using a polishing machine or the like. In case of sandblasting, since the through holes are each tapered, by setting the side where a hole diameter is small, as a polishing surface and by polishing to a predetermined thickness, it is possible to expose each fine hole with a predetermined opening diameter so that through holes each having a conductive layer made of the filled conductive material can be formed.

Figure 22C:
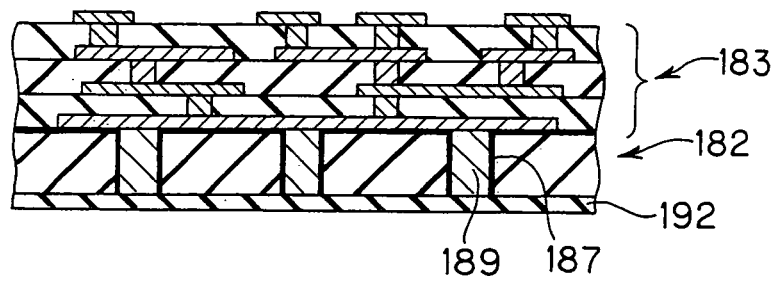

Then, a dielectric layer 192, which will be a capacitor material, is formed on the polished core board 182 (FIG. 22C). The dielectric layer 192 can be obtained by forming a film of silicon oxide or silicon nitride by CVD, or by forming a film of tantalum pentoxide, barium strontium titanate (Sr- BaTiO$_3$), lead zirconate titanate (Pb, (Zr,Ti)O$_3$), strontium titanate (SrTiO$_3$), or aluminum oxide by vacuum deposition or sputtering with masking, or by forming a film thereof by the sol-gel method, or by forming a film of benzocyclobutene resin, cardo resin, or polyimide resin. The dielectric layer 192 is formed, at portions thereof on the through holes 187 that will be connected to wiring layers in the next process, with opening portions in advance by a method such as the photolithography method or the masking deposition method.

Figure 22D:
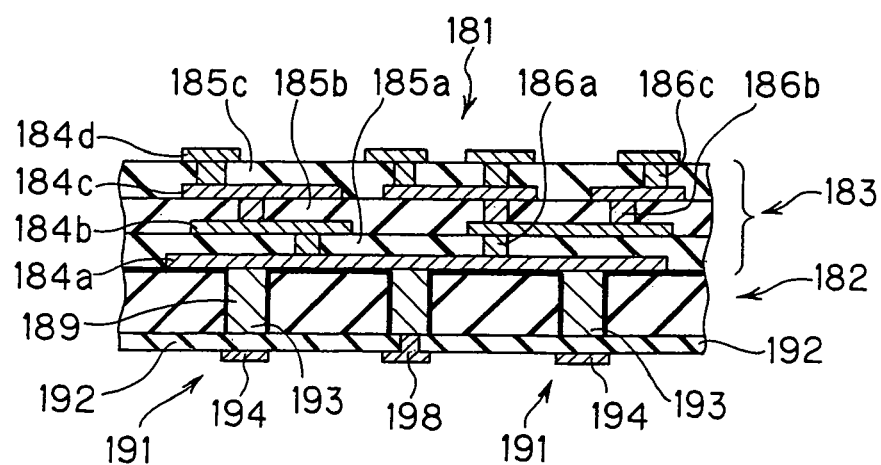

Then, the predetermined through holes for which the opening portions are formed in the dielectric layer 192, are provided with wiring layers 198, while the through holes for which the opening portions are not provided, are provided with lower electrodes 194 via the dielectric layer 192. Thereby, there are formed capacitors 191 each having an upper electrode 193 being the conductive material 189 filled in the through hole 187, and having a lower electrode 194 via the dielectric layer 192, and there is obtained a multilayer wiring board 181 having the multilayer wiring layer 183 and the built-in capacitors 191 on the core board 182 (FIG. 22D).

Incidentally, a material of the foregoing lower electrode 194 and wiring layer 198 can be the same as that of the lower electrode 114 and the wiring layer 118 described in the foregoing multilayer wiring board.

Sixth Embodiment of Manufacture Method

Figure 23A:
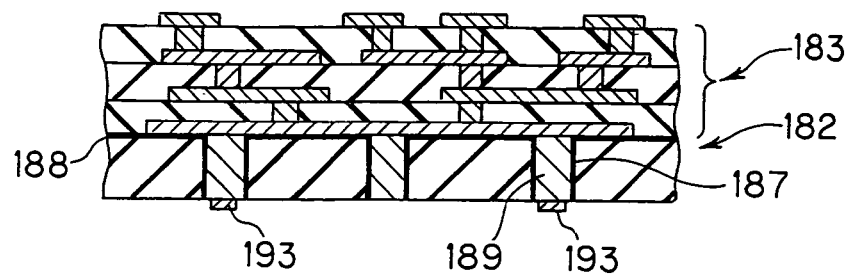
FIGS. 23A to 23C are process diagrams showing an embodiment (embodiment 6) of a manufacture method of the multilayer wiring board of the present invention.
Figure 23B:
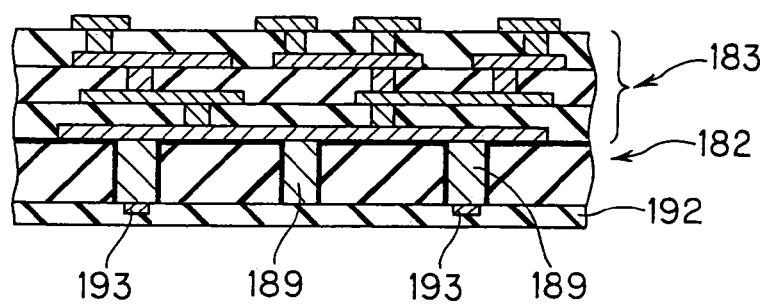
Figure 23C:
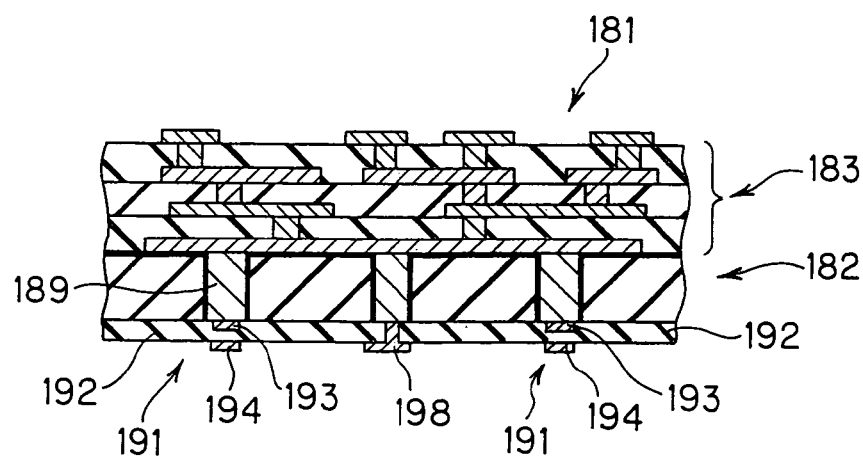

FIGS. 23A to 23C are process diagrams showing the manufacture method of the multilayer wiring board relating to one embodiment of the present invention shown in FIG. 6, which is a manufacture method that is suitable when silicon is used for a core board.

In this embodiment, the processes up to the production of a core board 182 formed with a multilayer wiring layer 183 on one surface thereof are carried out in the same manner as those (FIGS. 21A to 22B) in the foregoing fifth embodiment.

Then, upper electrodes 193 are formed on the polished core board 182 so as to be connected to a conductive material 189 within through holes 187 located at positions where capacitors are formed (FIG. 23A). The upper electrode 193 is set smaller than the through hole 187. However, by forming a new insulating layer on a polished surface of a core member 182' (a surface not formed with an insulating layer 188) shown in FIG. 22B, the upper electrode 193 can be made larger than the through hole 187. Then, a dielectric layer 192, which will be a capacitor material, is formed on the core board 182 so as to cover the foregoing upper electrodes 193 (FIG. 23B). The dielectric layer 192 can be obtained by forming a film of silicon oxide or silicon nitride by CVD, or by forming a film of tantalum pentoxide, barium strontium titanate (SrBaTiO$_3$), lead zirconate titanate (Pb, (Zr,Ti)O$_3$), strontium titanate (SrTiO$_3$), or aluminum oxide by vacuum deposition or sputtering with masking, or by forming a film thereof by the sol-gel method, or by forming a film of benzocyclobutene resin, cardo resin, or polyimide resin. The dielectric layer 192 is formed, at portions thereof on the through holes 187 that will be connected to wiring layers in the next process, with opening portions in advance by a method such as the photolithography method or the masking deposition method.

Then, the predetermined through holes for which the opening portions are formed in the dielectric layer 192, are provided with wiring layers 198, while the through holes for which the opening portions are not provided, are provided with lower electrodes 194 via the dielectric layer 192, thereby to form capacitors 191. Thereby, there is obtained a multilayer wiring board 181 having the multilayer wiring layer 183 and the built-in capacitors 191 on the core board 182 (FIG. 23C).

Incidentally, a material of the foregoing upper electrode 193, lower electrode 194, and wiring layer 198 can be the same as that of the lower electrode 114 and the wiring layer 118 described in the foregoing multilayer wiring board.

Seventh Embodiment of Manufacture Method

Figure 24A:
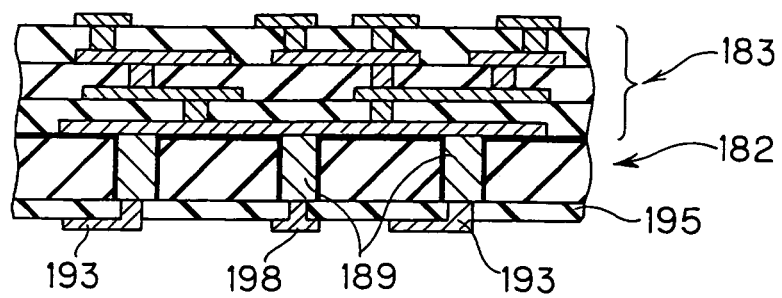
FIGS. 24A to 24C are process diagrams showing an embodiment (embodiment 7) of a manufacture method of the multilayer wiring board of the present invention.
Figure 24B:
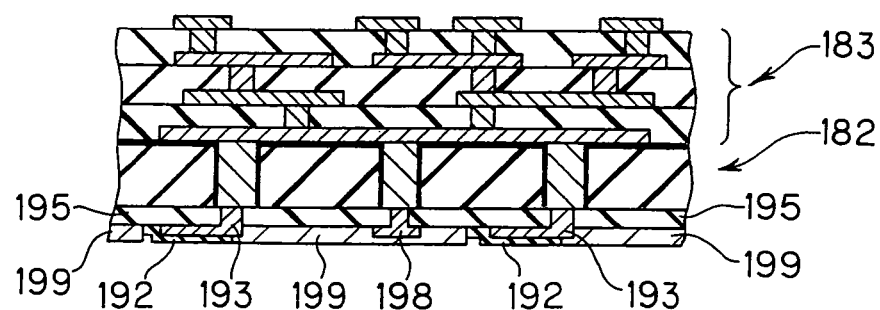
Figure 24C:
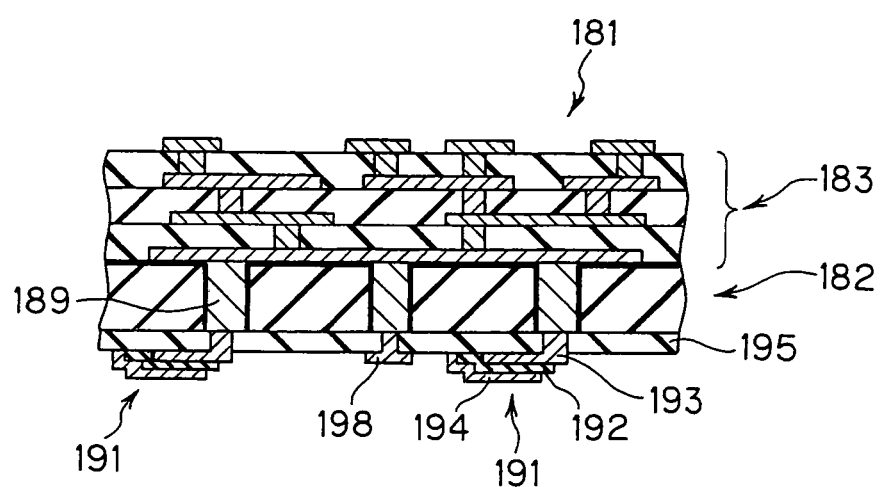

FIGS. 24A to 24C are process diagrams showing the manufacture method of the multilayer wiring board relating to one embodiment of the present invention shown in FIG. 8, which is a manufacture method that is suitable when silicon is used for a core board.

Also in this embodiment, the processes up to the production of a core board 182 formed with a multilayer wiring layer 183 on one surface thereof are carried out in the same manner as those (FIGS. 21A to 22B) in the foregoing fifth embodiment.

Then, upper electrodes 193 are formed on the polished core board 182 via an electrically insulating layer 195 so as to be connected to a conductive material 189 within through holes 187 located at positions where capacitors are formed, while wiring layers 198 are formed on through holes 187 located at positions where no capacitors are formed (FIG. 24A). The electrically insulating layer 195 can be formed by applying photosensitive resin, which will be the insulating layer, by the spinner application method or the like, exposing it using a photomask for formation of the upper electrodes 193 and the wiring layers 198, developing it to thereby form a pattern, then curing the resin by heat curing. As the photosensitive resin, benzocyclobutene resin, cardo resin, or polyimide resin, for example, can be cited as a preferable material.

Then, a resist pattern 199 is formed so as to expose desired positions of the foregoing upper electrodes 193 and core board 182, to thereby form dielectric layers 192, which will be a capacitor material, at the exposed portions (FIG. 24B). The dielectric layer 192 can be obtained by forming a film of silicon oxide or silicon nitride by CVD, or by forming a film of tantalum pentoxide, barium strontium titanate (SrBaTiO$_3$), lead zirconate titanate (Pb, (Zr,Ti)O$_3$), strontium titanate (SrTiO$_3$), or aluminum oxide by vacuum deposition or sputtering with masking, or by forming a film thereof by the sol-gel method, or by forming a film of benzocyclobutene resin, cardo resin, or polyimide resin.

Then, the resist pattern 199 is removed, and a resist pattern for lower electrodes is provided to form lower electrodes 194 on the dielectric layers 192, thereby to form capacitors 191. Thereby, there is obtained a multilayer wiring board 181 having the multilayer wiring layer 183 and the built-in capacitors 191 on the core board 182 (FIG. 24C).

Incidentally, a material of the foregoing upper electrode 193, lower electrode 194, and wiring layer 198 can be the same as that of the lower electrode 114 and the wiring layer 118 described in the foregoing multilayer wiring board.

Eighth Embodiment of Manufacture Method

FIGS. 25A to 25C and FIGS. 26A to 26C are process diagrams showing the manufacture method of the multilayer wiring board relating to one embodiment of the present invention shown in FIG. 10, which is a manufacture method that is suitable when silicon is used for a core board.

Also in this embodiment, the processes up to the production of a core board 182 formed with a multilayer wiring layer 183 on one surface thereof are carried out in the same manner as those (FIGS. 21A to 22B) in the foregoing fifth embodiment.

Figure 25A:
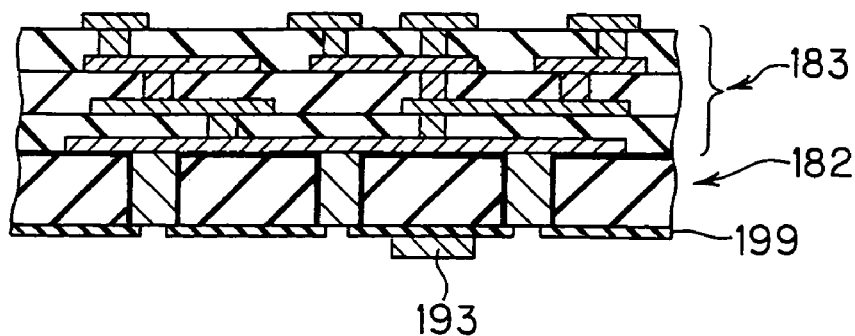
FIGS. 25A to 25C are process diagrams showing an embodiment (embodiment 8) of a manufacture method of the multilayer wiring board of the present invention.
Figure 25B:
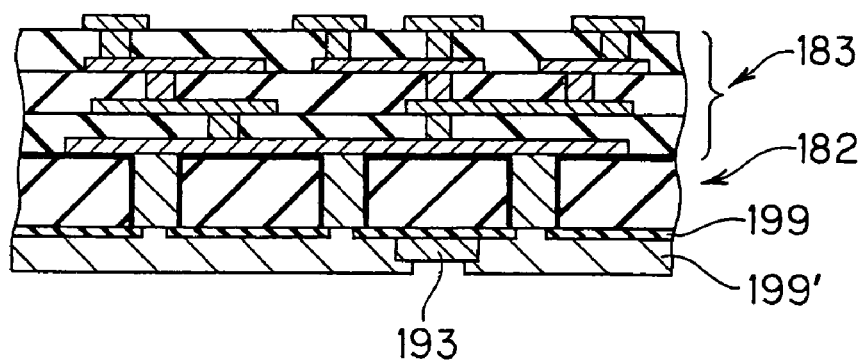
Figure 25C:
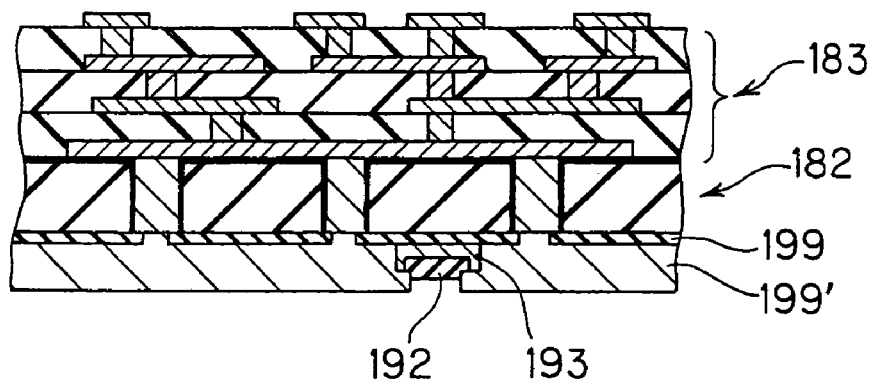
Figure 26A:
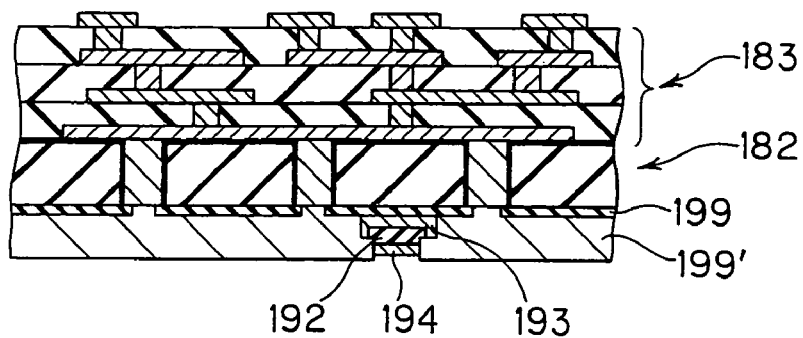
FIGS. 26A to 26C are process diagrams showing the embodiment (embodiment 8) of the manufacture method of the multilayer wiring board of the present invention.

Then, an insulating layer 199 is formed on the polished core board 182. This insulating layer 199 is formed with desired openings so as to expose a conductive material 189 within through holes 187. Then, anodizable metal layers are formed on the insulating layer 199, thereby forming upper electrodes 193 (FIG. 25A). As anodizable metal, Ta, Al, Ti, W, or the like can be cited. A thickness of the upper electrode 193 can be set within a range of, for example, 0.1 to 10 μm. Then, a resist pattern 199' is formed on the insulating layer 199 so as to expose desired portions (potions where dielectric layers are formed) of the upper electrodes 193 (FIG. 25B). Thereafter, anodic oxidation is applied to the upper electrodes 193. Thereby, dielectric layers 192 of metal oxide are formed on the upper electrodes 193 (FIG. 25C). A thickness of the dielectric layer 192 can be set within a range of 0.05 to 1 μm. Conditions of anodic oxidation can be suitably set taking into account a thickness of the dielectric layer 192 to be formed, a material of the upper electrode 193, and so on. Then, lower electrodes 194 are formed on the dielectric layers 192 (FIG. 26A).

Figure 26B:
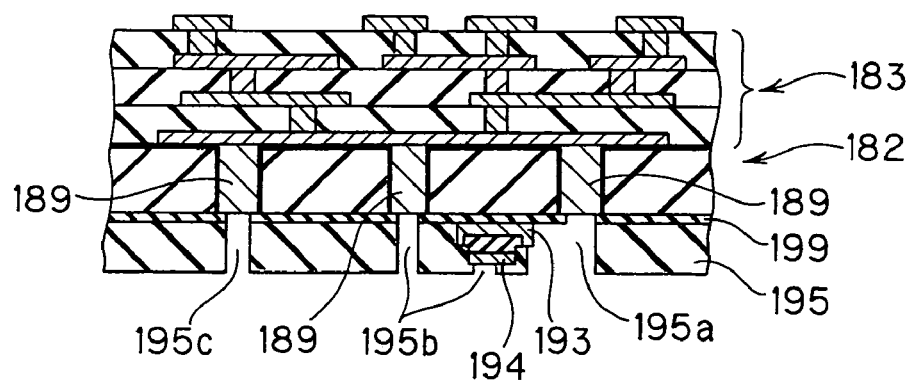

Then, the resist pattern 199' is removed, and an electrically insulating layer 195 is formed which is provided with opening portions 195a for wiring formation each for connecting the conductive material 189 within the desired through hole and the upper electrode 193 to each other, opening portions 195b for wiring formation each for connecting the conductive material 189 within the adjacent through hole and the lower electrode 194 to each other, and opening portions 195c each for forming a wiring layer on the through hole 187 located at a position where a capacitor is not formed (FIG. 26B).

The electrically insulating layer 195 can be formed by applying photosensitive resin, which will be the insulating layer, by the spinner application method or the like, exposing it using a photomask for formation of the upper electrodes 193 and the wiring layers 198, developing it to thereby form a pattern, then curing the resin by heat curing. As the photosensitive resin, benzocyclobutene resin, cardo resin, or polyimide resin, for example, can be cited as a preferable material.

Figure 26C:
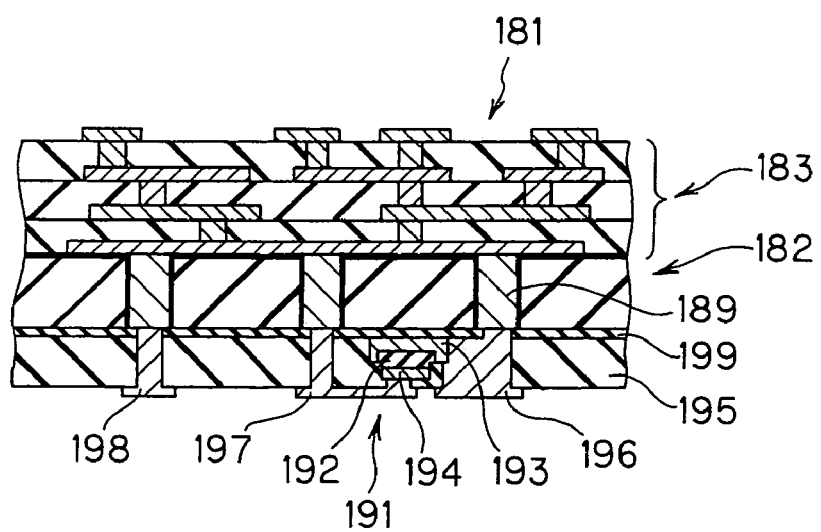

Then, wiring layers 196, 197, 198 are disposed so that capacitors 191 are formed. Thereby, there is obtained a multilayer wiring board 181 having the multilayer wiring layer 183 and the built-in capacitors 191 on the core board 182 (FIG. 26C).

Incidentally, a material of the foregoing lower electrode 194, and wiring layers 196, 197, 198 can be the same as that of the lower electrode 114 and the wiring layer 118 described in the foregoing multilayer wiring board.

FIGS. 27A to 27C and FIGS. 28A to 28B are process diagrams showing another manufacture method of the multilayer wiring board relating to one embodiment of the present invention shown in FIG. 10, which is a manufacture method that is suitable when silicon is used for a core board.

Also in this embodiment, the processes up to the production of a core board 182 formed with a multilayer wiring layer 183 on one surface thereof are carried out in the same manner as those (FIGS. 21A to 22B) in the foregoing fifth embodiment.

Figure 27A:
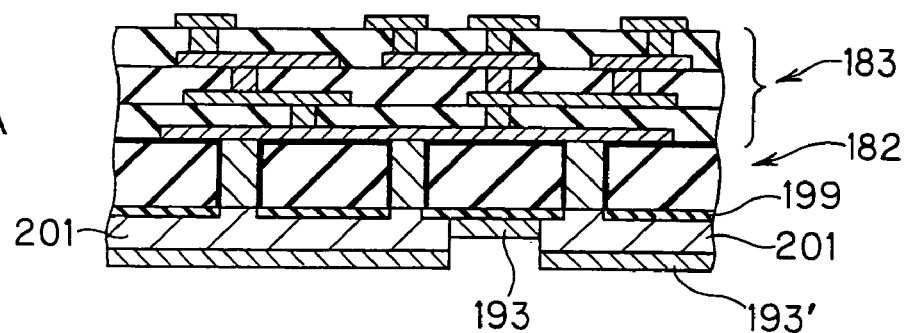
FIGS. 27A to 27C are process diagrams showing the embodiment (embodiment 8) of the manufacture method of the multilayer wiring board of the present invention.

Then, an insulating layer 199 is formed on the polished core board 182. This insulating layer 199 is formed with desired openings so as to expose a conductive material 189 within through holes 187. Then, a resist pattern 201 having opening portions for formation of upper electrodes is formed on the insulating layer 199, and an anodizable metal layer 193' is formed on the resist pattern 201 by the vacuum film forming method to thereby form upper electrodes 193 on the insulating layer 199 at portions thereof exposed to the foregoing opening portions (FIG. 27A). As anodizable metal, Ta, Al, Ti, W, or the like can be cited. A thickness of the upper electrode 193 can be set within a range of, for example, 0.1 to 10 μm.

Figure 27B:
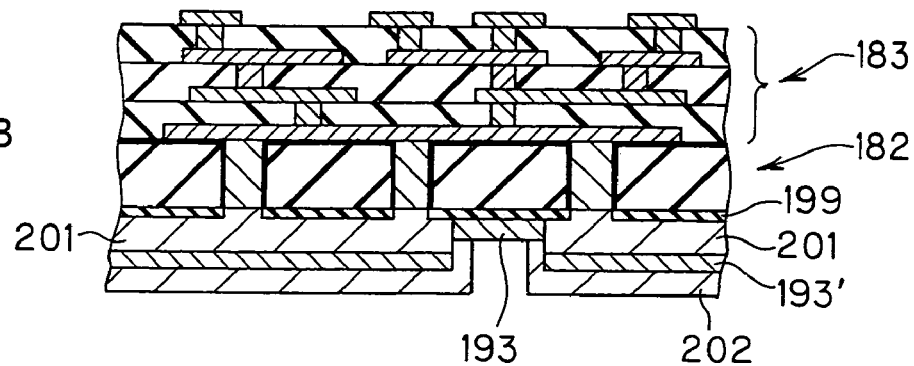
Figure 27C:
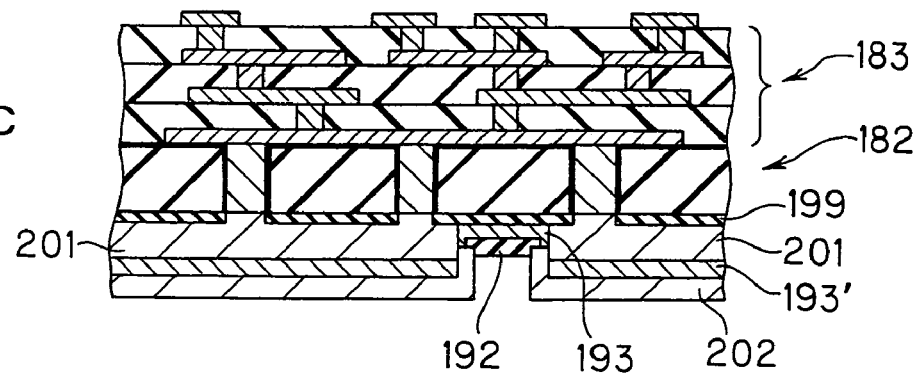

Then, a resist pattern 200 is formed on the metal layer 193' so as to expose desired portions (potions where dielectric layers are formed) of the upper electrodes 193 (FIG. 27B). Thereafter, anodic oxidation is applied to the upper electrodes 193. Thereby, dielectric layers 192 of metal oxide are formed on the upper electrodes 193 (FIG. 27C). A thickness of the dielectric layer 192 can be set within a range of 0.05 to 1 μm. Conditions of anodic oxidation can be suitably set taking into account a thickness of the dielectric layer 192 to be formed, a material of the upper electrode 193, and so on.

Figure 28A:
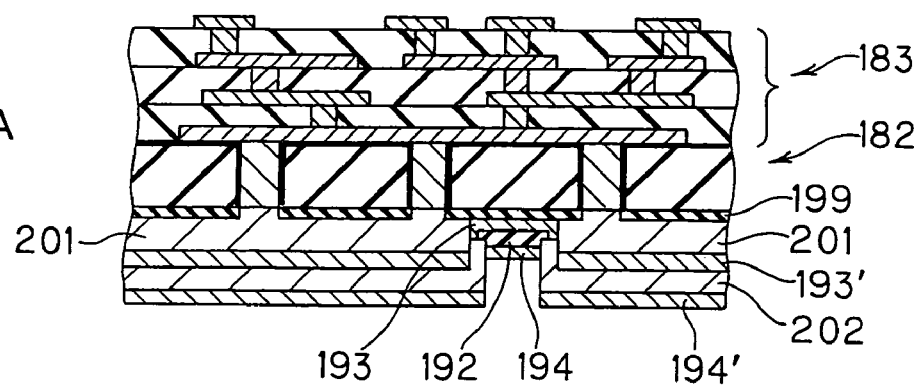
FIGS. 28A to 28B are process diagrams showing the embodiment (embodiment 8) of the manufacture method of the multilayer wiring board of the present invention.
Figure 28B:
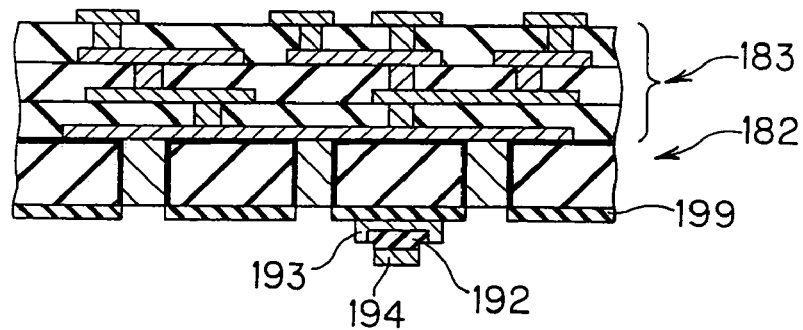

Then, a metal layer 194' is formed on the resist pattern 202 by the vacuum film forming method to thereby form lower electrodes 194 on the dielectric layers 192 (FIG. 28A). Then, by peeling off the resist pattern 201, the metal layer 193', the resist pattern 202, and the metal layer 194', which are unnecessary, are simultaneously removed (lifted off). Thereby, stacked bodies each composed of the upper electrode 193, the dielectric layer 192, and the lower electrode 194 are disposed at desired positions of the insulating layer 199 (FIG. 28B). Thereafter, through the same processes as those in FIG. 26B as described above, there is obtained a multilayer wiring board 181 having the multilayer wiring layer 183 and the built-in capacitors 191 on the core board 182 (FIG. 26C).

Incidentally, a material of the foregoing lower electrode 194 (metal layer 194') can be the same as that of the lower electrode 114 and the wiring layer 118 described in the foregoing multilayer wiring board.

Ninth Embodiment of Manufacture Method

FIGS. 29A to 29D and FIGS. 29A to 29D illustrate the case wherein through holes are formed by the sandblasting method, wherein a predetermined mask pattern 210 is formed on one surface of a core member 212' for a core board (FIG. 29A), and fine holes 217' are each formed in the core member 212' to a predetermined depth by sandblasting using the mask pattern 210 as a mask (29B).

Figure 29A:
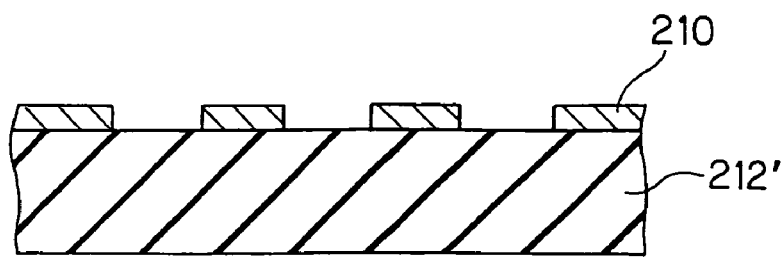
FIGS. 29A to 29D are process diagrams showing an embodiment (embodiment 9) of a manufacture method of the multilayer wiring board of the present invention.
Figure 29B:
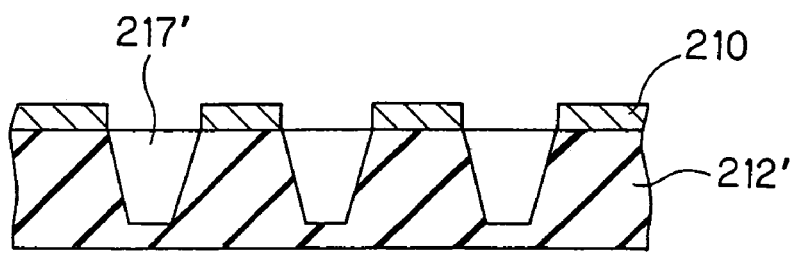
Figure 29C:
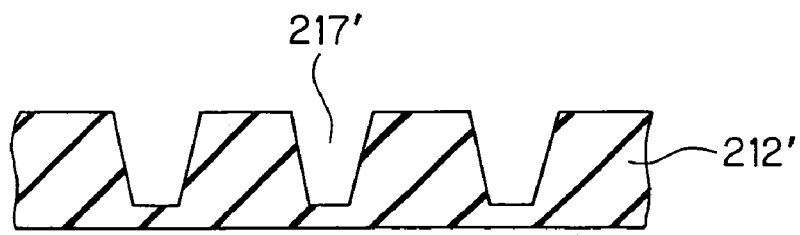

Then, the mask pattern 210 is removed from the core member 212' (FIG. 29C). In this embodiment, description will be given about a case, as an example, wherein glass being an insulator is used for the core member 212'.

Figure 29D:
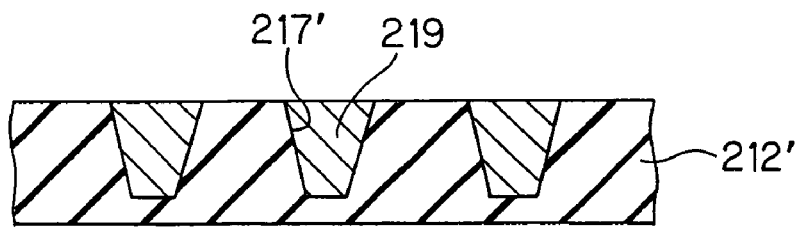

Then, a conductive material 219 is filled into the fine holes 217' (FIG. 29D). As the conductive material 219 filled into the fine holes, conductive paste such as copper paste or silver paste can be used. The filling into the fine holes is performed by the screen printing or the like, then, by carrying out a heat treatment, electrical conductivity can be given. On the other hand, an under conductive thin film may be formed on inner walls of the fine holes by the vacuum film forming method such as sputtering or deposition, or the electroless plating method, then, using this under conductive layer as a seed layer, a conductive material such as copper, silver, gold, or nickel may be deposited by electrolytic plating to provide conductive portions.

When the fine holes are formed by the sandblasting method, since the fine holes are each tapered, adhesion of the conductive material to the inner wall surfaces of the fine holes from the side where the opening diameter is large, becomes easy, and therefore, the yield of the process for giving electrical conductivity to the fine holes, i.e. the through holes, is improved, and a time is shortened, so that stable manufacturing and reduction in manufacturing cost are made possible.

Before filling the conductive material 219 into the fine holes, an insulating layer may be formed on the inner wall surfaces of the fine holes and on one surface or both surfaces of the core member. For example, when the core member is silicon being a semiconductor material, a silicon oxide film or a silicon nitride film can be formed on the surface of the core member using the thermal oxidation method, or the vacuum film forming method such as the CVD method, or the sputtering method. On the other hand, when the core member is a conductor such as metal, using the application method, an insulating layer can be formed at required portions by applying a suspension of silicon oxide or insulating resin such as benzocyclobutene resin, cardo resin, or polyimide resin onto the surface of the core member and heat-curing it.

Figure 30A:
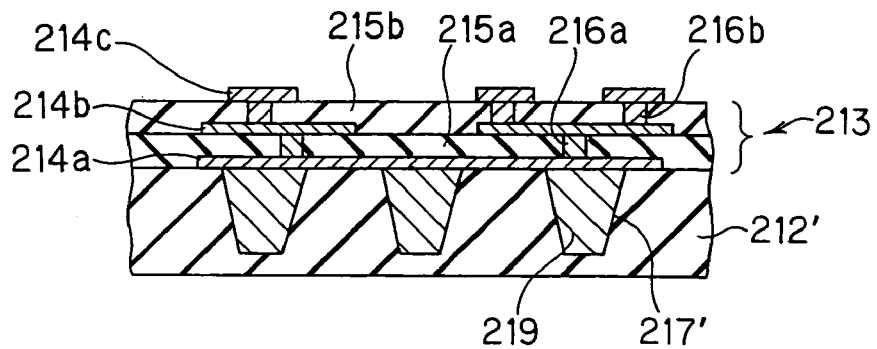
FIGS. 30A to 30D are process diagrams showing the embodiment (embodiment 9) of the manufacture method of the multilayer wiring board of the present invention.

Then, as shown in FIG. 30A, a multilayer wiring layer 213 is formed on the side of the core member 212' where the conductive material 219 is filled in the fine holes 217'. As the forming process of the multilayer wiring layer 213, either of the subtractive method using etching and the additive method using selective plating can be used.

For example, at the outset, a first wiring layer 214a is formed on the core member 212', subsequently, photosensitive resin, which will be an insulating layer, is applied by the spinner application method or the like, then exposed using a photomask for formation of vias 216a, and developed to thereby form a pattern, then the resin is cured by heat curing to form a first insulating layer 215a. As the photosensitive resin, benzocyclobutene resin, cardo resin, or polyimide resin, for example, can be cited as a preferable material.

Then, wiring is formed by the semi-additive method. Specifically, a conductive thin film layer for plating base is formed on the whole surface of the patterned insulating layer by the vacuum film forming method such as the sputtering method. The conductive thin film layer is made of metal such as Al, Cu, or Cr, and is formed in a thickness of, for example, about 0.1 to 0.5 µm.

Subsequently, a photosensitive resist for plating is spinner-applied, then exposed using a photomask having a wiring pattern, and developed to thereby form a resist pattern. A thickness of the resist pattern differs depending on desired plating metal thickness and line width, pitch, and plating metal, but about 1 to 10 µm is used. Subsequently, a conductor such as Cu is plated onto resist opening portions in a thickness of several micrometers by electrolytic plating, thereby to form plated metal layers.

Then, the resist is peeled off, and the unnecessary conductive thin film layer for plating base that is exposed at portions other than those portions subjected to electrolytic plating, is removed by soft etching to thereby obtain a second wiring layer having desired vias 216a and wirings 214b.

When forming multilayer wirings, they can be formed by repeating the foregoing process. Specifically, a next insulating layer 215b is formed, and then next vias 216b and a third wiring layer 214 are formed (FIG. 30A). FIG. 30A shows a buildup multilayer wiring layer 213 composed of two insulating layers.

Figure 30B:
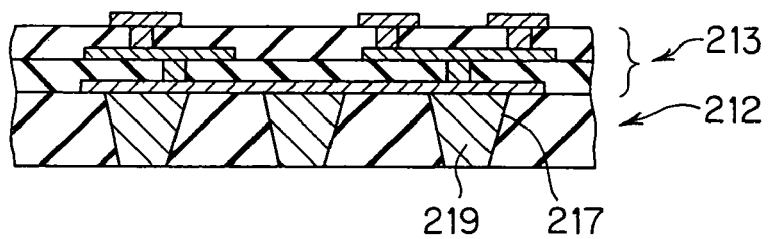
Figure 30C:
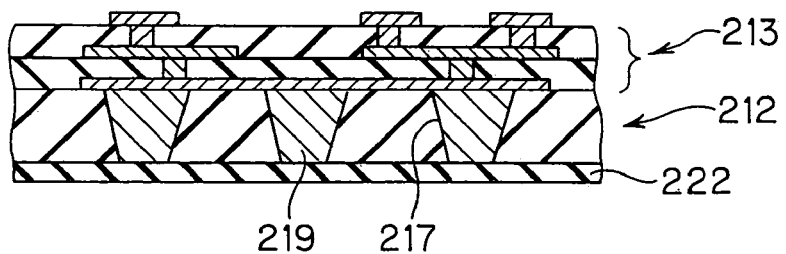

Then, the other surface of the core member 212' is polished to expose the fine holes 217' to thereby obtain through holes 217 having the conductive material 219, and further obtain the core board 212 with a desired thickness (FIG. 30B). Polishing of the core member can be carried out by backgrind, polishing, or the like using a polishing machine or the like. In case of sandblasting, since the fine holes, i.e. the through holes, are each tapered, it is possible to expose them with a predetermined opening diameter to thereby form the through holes each having the conductive material.

Then, a dielectric layer 222, which will be a capacitor material, is formed on the polished core board 212. The dielectric layer 222 can be obtained by forming a film of silicon oxide or silicon nitride by CVD, or by forming a film of tantalum pentoxide, barium strontium titanate ($SrBaTiO_3$), lead zirconate titanate ($Pb,(Zr,Ti)O_3$), strontium titanate ($SrTiO_3$), or aluminum oxide by vacuum deposition or sputtering with masking, or by forming a film thereof by the sol-gel method, or by forming a film of benzocyclobutene resin, cardo resin, or polyimide resin. The dielectric layer 222 is formed, at portions thereof on the through holes 217 that will be connected to wiring layers in the next process, with opening portions in advance by a method such as the photolithography method or the masking deposition method.

Figure 30D:
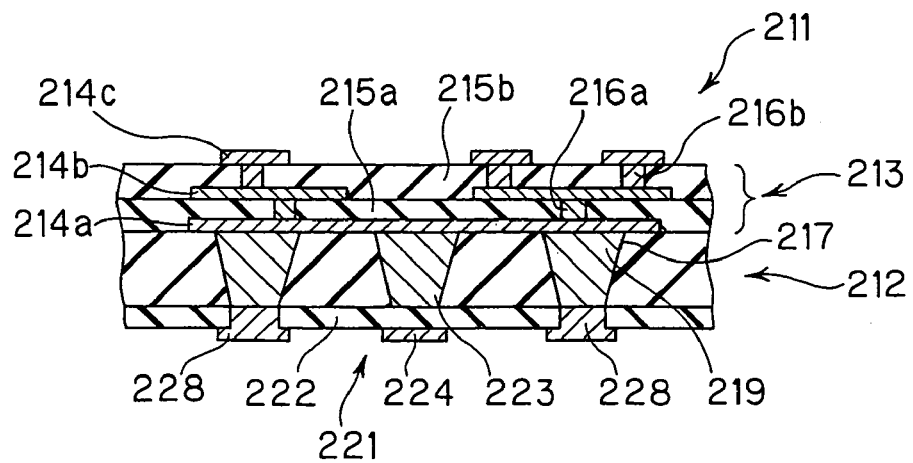

Then, the predetermined through holes for which the opening portions are formed in the dielectric layer 222, are provided with wiring layers 228, while the through holes for which the opening portions are not provided, are provided with lower electrodes 224 via the dielectric layer 222, thereby to form capacitors 221. Thereby, there is obtained a multilayer wiring board 211 having the multilayer wiring layer 213 and the built-in capacitors 221 on the core board 212 (FIG. 30D).

Incidentally, the processes up to the production of the core board 212 formed with the multilayer wiring layer 213 on one surface thereof may be carried out in the same manner as in the foregoing ninth embodiment, thereafter, the capacitors may be formed using the same methods as those of the foregoing sixth to eighth embodiments. Thereby, it is possible to manufacture multilayer wiring boards of modes as shown in FIGS. 6, 8, and 10.

Tenth Embodiment of Manufacture Method

Based on FIGS. 31A to 31E and FIGS. 32A to 32D, another embodiment of the manufacture method of the present invention will be described.

FIGS. 31A to 31E and FIGS. 32A to 32D are process diagrams showing the manufacture method of the multilayer wiring board relating to one embodiment of the present invention shown in FIG. 5, which is a manufacture method that is suitable when silicon is used for a core board.

Figure 31A:
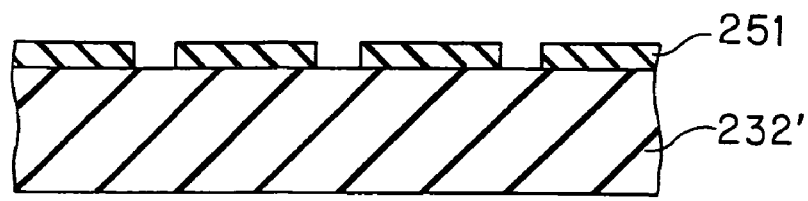
FIGS. 31A to 31E are process diagrams showing an embodiment (embodiment 10) of a manufacture method of the multilayer wiring board of the present invention.

First, as shown in FIG. 31A, a predetermined mask pattern 251 is formed on one surface of a core member 232' using a mask material.

Figure 31B:
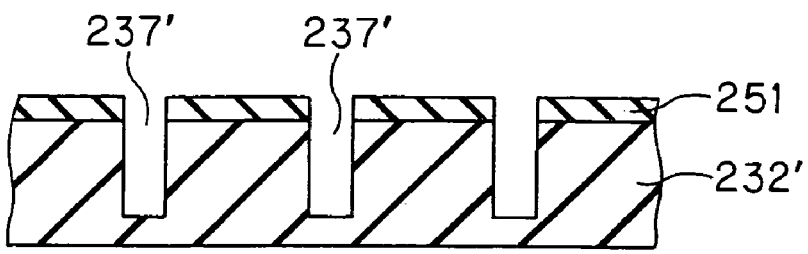

Then, using the mask pattern 251 as a mask, fine holes 237' are formed in the core member 232' to a predetermined depth by the ICP-RIE method (FIG. 31B). As a mask material upon etching, a positive type photoresist using normal novolak resin having dry etching resistance may be used, or a silicon thin film made of silicon oxide, silicon nitride, or the like that can take a large etching selective ratio relative to silicon, or a metal thin film made of titanium, tungsten, or the like may be formed in advance, then patterned by the photoetching method so as to be used as the mask material.

Upon etching, an ICP-RIE device normally put on the market can be used. As etching gas, fluorine gas such as $SF_6$, $CF_4$, $C_2F_6$, $C_3F_8$, or the like can be used. Further, for increasing an etching rate, it is possible to slightly mix oxygen or nitrogen within a range not affecting the mask material.

Figure 31C:
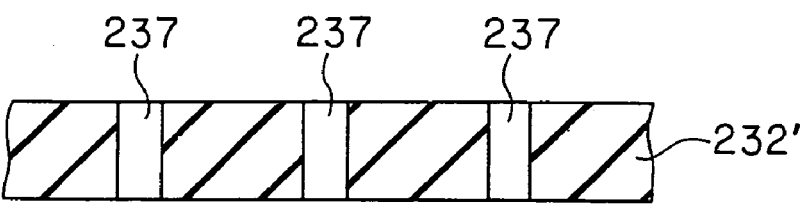

After forming the fine holes 237' in the core member 232' into the predetermined depth as described above, the mask pattern 251 is removed from the core member 232', then the other surface of the core member 232' is polished to thereby expose the fine holes 237' with a predetermined opening diameter on the surfaces of the core member 232' to form through holes 237 (FIG. 31C). Polishing of the core member 232' can be carried out by backgrind, polishing, or the like. In this embodiment, silicon is used as the core member, and the through holes 237 having substantially equal opening diameters on the front and the back are obtained by polishing after trench etching.

Figure 31D:
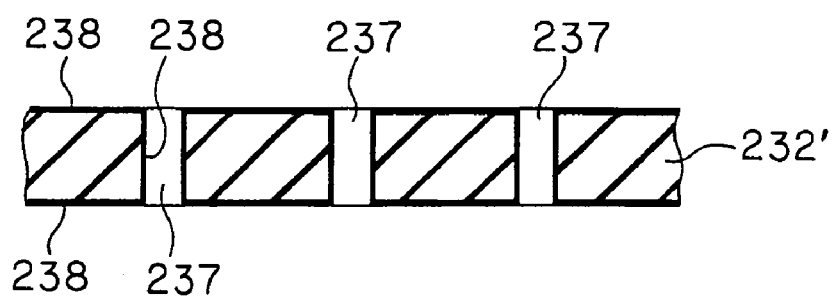

An insulating layer 238 is formed on both surfaces of the core member 232' formed with the through holes 237, and on inner wall surfaces of the through holes (FIG. 31D). When, for example, the core member 232' is silicon, the insulating layer 238 of silicon oxide can be formed on the surfaces of the core member 232' including the through holes 237 by thermal oxidation. On the other hand, the insulating layer of silicon oxide, silicon nitride, or the like can be formed on the surfaces of the core member by the use of the vacuum film forming method such as the plasma CVD method. Further, using the application method, the insulating layer can be formed by applying a suspension of silicon oxide or insulating resin such as benzocyclobutene resin, cardo resin, or polyimide resin onto the surfaces of the core member and heat-curing it.

On the other hand, as shown in FIG. 4, in manufacturing the multilayer wiring board having the conductive substance diffusion preventing layer, the conductive substance diffusion preventing layer can be formed by, for example, MO-CVD (Metal Organic-Chemical Vapor Deposition) or the sputtering method. The conductive substance diffusion preventing layer can be in the form of a thin film of titanium nitride, titanium, chromium, or the like, and a thickness of about 10 to 50 nm is desirable.

Figure 31E:
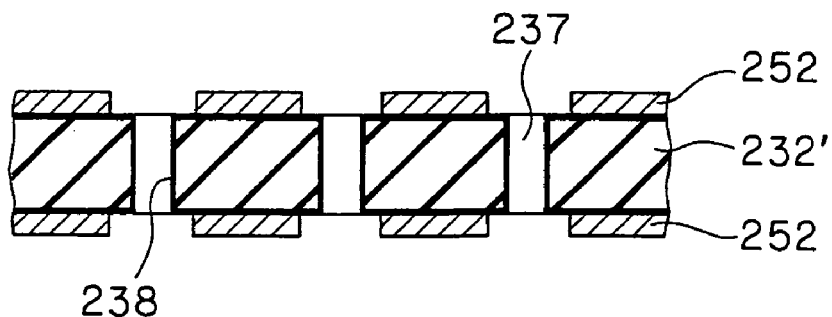

After the formation of the insulating layer 238, or after the formation of the insulating layer 238 and the conductive substance diffusion preventing layer, dry films are laminated to the front and the back of the core member 232' as photosensitive resists, then exposed using photomasks having a desired land diameter of the through holes, and developed, thereby to form, on the front and the back of the core member 232', resist patterns 252 exposing the through holes 237 and peripheral portions around opening portions thereof (FIG. 31E).

Figure 32A:
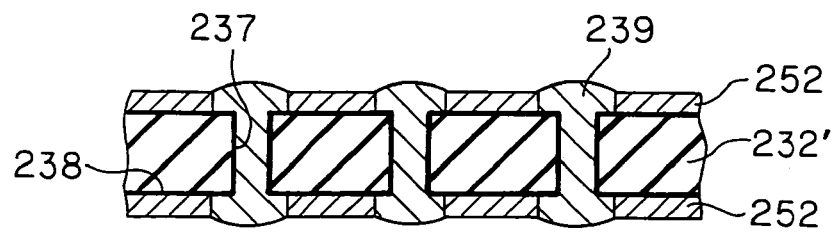
FIGS. 32A to 32D are process diagrams showing the embodiment (embodiment 10) of the manufacture method of the multilayer wiring board of the present invention.

Then, conductive paste is filled into the through holes and opening portions of the resist patterns as a conductive material 239 by the application method such as the screen printing (FIG. 32A). As the conductive paste, it is possible to use conductive paste such as copper paste or silver paste.

Figure 32B:
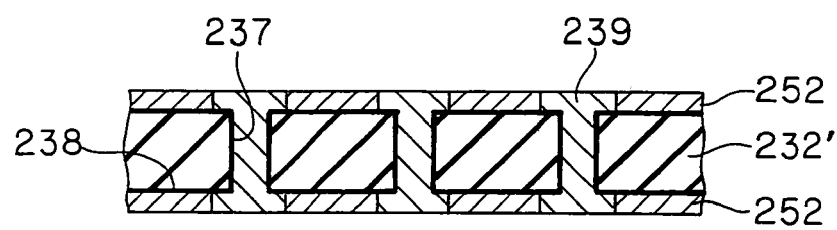

Subsequently, after drying to cure the conductive paste, the conductive material 239 protruding from the surfaces of the resist patterns 252 on both surfaces on the front and the back is polished to be removed so that the surfaces of the conductive material 239 and the surface of each resist pattern 252 form the same plane (FIG. 32B).

As a method of filling the conductive material 239 into the through holes and the resist pattern opening portions, a method using electrolytic plating may be used other than the forgoing method of filling the conductive paste. For example, an under conductive thin film is formed from one side of the core member 232' by the vacuum film forming method to form a seed layer on portions of the side of the through holes 237 and on the resist pattern opening portions. Thereafter, by electrolytic plating using the seed layer, metal is deposited to be filled in the through holes 237 and the resist pattern opening portions. As the seed layer, a conductive film of copper or the like having a thickness of 0.1 to 0.4 μm is desirable.

Figure 32C:
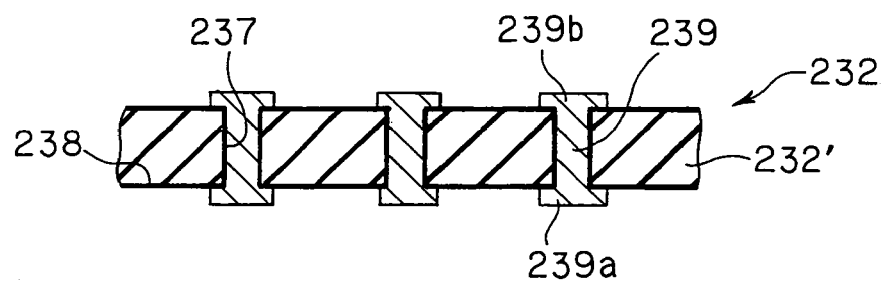
Figure 32D:
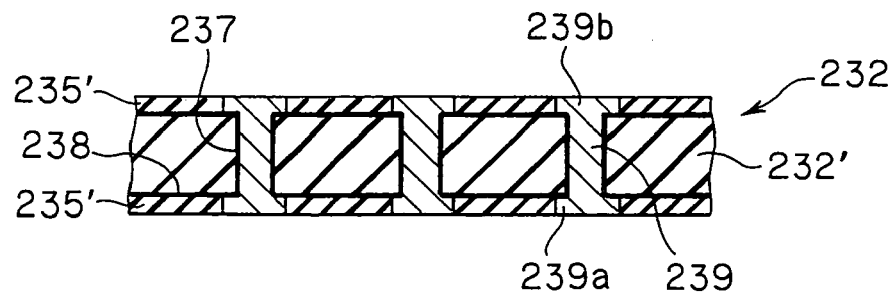

Then, the resists 252 are peeled off to form a core board 232 having lands 239$a$, 239$b$ of a desired diameter formed by the conductive material 239 on the front and the back of the core member 232', and having the through holes 237 filled with the conductive material 239 (FIG. 32C). A height of the lands 239$a$, 239$b$ formed by the conductive material protruding from the through hole is defined by a resist thickness of the dry film resist, while the land diameter is defined by a size of the mask pattern.

In the manufacture method of the present invention, the dry film resists also serve to provide an effect to prevent a problem that, upon drying to cure the conductive paste, the wiring layers formed of copper, aluminum, or the like and provided on the surfaces of the core member 232' in the previous process are oxidized.

Subsequently, an electrically insulating layer 235' is formed on one surface or both surfaces of the core board 232 so as to also serve as a flattening layer (32D). The electrically insulating layer 235' is formed by, for example, patterning photosensitive resin such as benzocyclobutene resin, cardo resin, or polyimide resin by the photolithography method.

Then, a multilayer wiring layer is formed on one surface of the core board 232. Such a multilayer wiring layer can be formed according to the method described in the foregoing fifth embodiment of the manufacture method.

Then, by forming capacitors on the other surface of the core board 232, formed with the multilayer wiring layer, according to the foregoing method shown in FIGS. 22C and 22D, the multilayer wiring board 101' of the present invention shown in FIG. 5 can be manufactured.

On the other hand, by forming capacitors on the other surface of the core board 232, formed with the multilayer wiring layer as described above, according to the foregoing method shown in FIGS. 23A to 23C, the multilayer wiring board 121' of the present invention shown in FIG. 7 can be manufactured.

Further, by forming capacitors on the other surface of the core board 232, formed with the multilayer wiring layer as described above, according to the foregoing method shown in FIGS. 24A to 24C, the multilayer wiring board 141' of the present invention shown in FIG. 9 can be manufactured.

Further, by forming capacitors on the other surface of the core board 232, formed with the multilayer wiring layer as described above, according to the foregoing method shown in FIGS. 23A to 25C and FIGS. 26A to 26C, the multilayer wiring board 161' of the present invention shown in FIG. 11 can be manufactured.

According to the manufacture method of the capacitor built-in multilayer wiring board of the present invention as described above, there is obtained the manufacture method of the capacitor built-in multilayer wiring board, wherein since the conductive through hole filled with the conductive material is used as the upper electrode for the capacitor, the upper electrode forming process becomes unnecessary, further, since the dielectric layer for the capacitor also serves as the insulating layer, the process of providing the insulating layer on the surface of the core board becomes unnecessary, so that the manufacturing process for the circuit board with the built-in capacitor is shortened to improve the manufacturing yield. Further, there is obtained the manufacture method of the capacitor built-in multilayer wiring board, wherein, by providing the upper electrode on the core board so as to be connected to the conductive material filled in the through hole, it is possible to flexibly change the position and size of the capacitor depending on a change in specification, so that the manufacturing process for the circuit board with the built-in capacitor is shortened to improve the manufacturing yield. There is obtained the manufacture method of the capacitor built-in multilayer wiring board, wherein anodizable metal is used as the upper electrode and, when the surface thereof is anodized to serve as a dielectric layer, further simplification of the process is enabled to improve the manufacturing yield.

Now, the present invention will be described in further detail showing more specific examples.

EXAMPLE 1

A silicon board having a thickness of 625 μm was prepared as a core member, and a silicon nitride film having a thickness of 5 μm was formed on one surface of the core member by the plasma CVD method. Then, a positive type photoresist (OFPR-800 by Tokyo Ohka Kogyo Co., Ltd.) was applied to the silicon nitride film, then exposed by a photomask for through hole formation and developed, thereby to form a resist pattern. Then, using $CF_4$ as etching gas, silicon nitride exposed from the resist pattern was dry etched, then the resist was peeled off by a special peeling liquid, so that a mask pattern of silicon nitride was formed. The mask pattern was formed with circular openings having a diameter of 100 μm and arranged at a pitch of 150 to 500 μm.

Subsequently, using $SF_6$ as etching gas, silicon exposed from the silicon nitride film mask pattern was trench etched to a depth of 350 μm by the use of an ICP-RIE device.

Then, adhesive tape was stuck to the fine hole side, and the silicon board was ground to a thickness of 300 μm by a diamond grinder to change the fine holes into penetrating through holes. In this embodiment, substantially vertical through holes were obtained.

Then, the silicon board formed with the through holes was subjected to a thermal oxidation treatment, so that an insulating layer composed of a silicon oxide film and a silicon nitride film was formed on the surface of the core member including inner walls of the through holes.

Then, on this insulating layer, a conductive substance diffusion preventing layer made of titanium nitride and having a thickness of 10 nm was formed by MO-CVD (Metal Organic-Chemical Vapor Deposition) using plasma.

Then, conductive thin films of copper were formed on both surfaces of the core member by sputtering, then electrolytic plating was carried out to provide a predetermined plating thickness, thereafter, pattern etching was applied thereto by the photolithography method to form desired wiring.

Then, dry films were laminated to the front and the back of the core member as photosensitive resists, then exposed by photomasks having a desired through hole land diameter of 150 μm, and developed to thereby form, on the front and the back of the core member, resist patterns exposing the through holes and peripheral portions around opening portions thereof.

Then, conductive paste of copper was filled into the through holes and opening portions of the resist patterns by screen printing.

Subsequently, after drying (170° C., 20 minutes) to cure the conductive paste, the conductive paste protruding from the surfaces of the resists on the front and the back was polished on both sides to be removed, so that the surfaces of the conductive paste and the surface of each resist formed the same plane.

Then, the resists were peeled off. Thereby, a core board was obtained which had, on the front and the back thereof, lands formed of the conductive paste and each having a desired diameter, and had the through holes filled with the conductive paste. In the core board, the through hole diameter was approximately 100 μm on both the front and the back, the front and the back were electrically connected by the conductive paste, and the lands of the through holes filled with the conductive paste each had a land diameter of 150 μm, and a height of 10 μm from the surface of the core member on both the front and the back.

Then, electrically insulating layers were formed for causing the polished surfaces of the core board to be flat surfaces. The electrically insulating layer was formed by patterning a benzocyclobutene resin composition (CYCLOTENE 4042 manufactured by The Dow Chemical Company) as photosensitive resin.

On the core board flattened by the electrically insulating layer, a photosensitive benzocyclobutene resin composition, which would become an electrically insulating layer of a buildup layer, was applied by the spinner application method. Thereafter, an applied film was exposed using a photomask for via formation, developed to form a pattern, then the resin was cured by heat curing to thereby to form an electrically insulating layer.

Then, a conductive thin film layer for plating base was formed on the whole surface of the board by sputtering. The conductive thin film layer was formed of copper in a thickness of about 0.5 μm.

Subsequently, a liquid resist for plating (LA900 manufactured by Tokyo Ohka Kogyo Co., Ltd.) was spinner-applied, then exposed using a photomask for first layer wiring pattern formation and developed, thereby to form a resist pattern having a thickness of 5 μm. Then, copper was plated in a thickness of 4 μm onto opening portions of the resist by electrolytic plating.

Then, the resist was peeled off, and the unnecessary conductive thin film layer for plating base that was exposed at portions other than those portions subjected to electrolytic plating, was removed by flash etching. Thereby, a first wiring layer having desired vias and wiring patterns was obtained.

A second wiring layer was formed similarly, and a patterned electrically insulating layer was provided thereon. Thereby, there was obtained a multilayer wiring board having the core board using the silicon board as the core member, and the buildup wiring layer provided on one side of the core board.

EXAMPLE 2

A glass board having a thickness of 400 μm was prepared as a core member, and a photosensitive dry film resist (APR manufactured by Asahi Kasei Corporation) was laminated onto one surface of the core member, then exposed by a photomask for through hole formation, and developed, thereby to form a mask pattern. The mask pattern was formed with circular openings having a diameter of 150 μm and arranged at a pitch of 300 to 500 μm.

Then, using this mask pattern as a mask, the core member was formed with fine holes by the sandblasting method. This fine hole had an opening diameter of 150 μm, a depth of 300 μm, and an inner diameter at a bottom portion of 80 μm, and had a tapered shape. Subsequently, the mask pattern was removed from the core member by acetone.

Then, adhesive tape was stuck to the fine hole perforation side of the core member, and the core member was ground to a thickness of 300 μm by a diamond grinder to change the fine holes into penetrating through holes. A through hole diameter at a portion penetrated by the grinding was 100 μm.

Then, dry films were laminated to the front and the back of the core member as photosensitive resists. These photosensitive resists were exposed using photomasks having patterns of through hole land portions, and developed, thereby to form resist patterns exposing the through holes and peripheral portions around opening portions thereof, on the front and the back of the core member. The opening portions of the resist patterns determined diameters of lands, wherein the opening portion on the semiconductor chip mounting side was 200 μm, and the opening portion on the opposite side was 120 μm.

Then, conductive paste of copper was filled into the through holes and opening portions of the resist patterns by screen printing.

Subsequently, after drying (170° C., 20 minutes) to cure the conductive paste, the conductive paste protruding from the surfaces of the resists on the front and the back was polished on both sides to be removed, so that the surfaces of the conductive paste and the surface of each resist formed the same plane.

Then, the resists were peeled off. Thereby, a core board was obtained which had, on the front and the back thereof, lands formed of the conductive paste and each having a desired diameter, and had the through holes filled with the conductive paste. In the core board, the front and the back were electrically connected by the conductive paste, and the lands of the through holes filled with the conductive paste had a diameter of 200 μm on the front layer side on the semiconductor chip mounting side, a diameter of 120 μm on the back layer side on the opposite side, and a height of 10 μm from the surface of the core member on both the front and the back.

Then, electrically insulating layers were formed for causing the polished surfaces of the core board to be flat surfaces. The electrically insulating layer was formed by patterning a benzocyclobutene resin composition (CYCLOTENE 4042 manufactured by The Dow Chemical Company) as photosensitive resin.

On the core board flattened by the electrically insulating layer, a photosensitive benzocyclobutene resin composition, which would become an electrically insulating layer of a buildup layer, was applied. Then, an applied film was exposed using a photomask for via formation, developed to form a pattern, then the resin was cured by heat curing to thereby to form an electrically insulating layer.

Then, a conductive thin film layer for plating base was formed on the whole surface of the board by sputtering. The conductive thin film layer was formed of copper in a thickness of 0.5 μm.

Subsequently, a liquid resist for plating (LA900 manufactured by Tokyo Ohka Kogyo Co., Ltd.) was spinner-applied, then exposed using a photomask having a first layer wiring pattern, and developed, thereby to form a resist pattern having a thickness of 5 μm. Then, copper was plated in a thickness of 4 μm onto opening portions of the resist by electrolytic plating.

Then, the resist was peeled off, and the unnecessary conductive thin film layer for plating base that was exposed at portions other than those portions subjected to electrolytic plating, was removed by flash etching to thereby obtain a first wiring layer having desired vias and wiring patterns.

A second wiring layer was formed similarly, and a patterned electrically insulating layer was provided thereon. Thereby, there was obtained a multilayer wiring board using the glass board as the core member, and having the buildup wiring layer on one side of the core board.

EXAMPLE 3

A silicon board having a thickness of 300 μm was prepared as a core member, and a silicon nitride film having a thickness of 5 μm was formed on one surface of the core member by the plasma CVD method. Then, a positive type photoresist (OFPR-800 by Tokyo Ohka Kogyo Co., Ltd.) was applied to the silicon nitride film, then exposed by a photomask for through hole formation, and developed, thereby to form a resist pattern. Then, using $CF_4$ as etching gas, silicon nitride exposed from the resist pattern was dry etched, then the resist was peeled off by a special peeling liquid, so that a mask pattern of silicon nitride was formed. The mask pattern was formed with circular openings having a diameter of 100 μm and arranged at a pitch of 150 to 500 μm.

Subsequently, using $SF_6$ as etching gas, silicon exposed from the silicon nitride film mask pattern was trench etched to a depth of 250 μm to form fine holes by the use of an ICP-RIE device.

Then, the silicon board formed with the fine holes was subjected to a thermal oxidation treatment to form an insulating layer composed of a silicon oxide film and a silicon nitride film on the surface of the core member including inner wall surfaces of the fine holes.

Then, on this insulating layer, a conductive substance diffusion preventing layer made of titanium nitride and having a thickness of 10 nm was formed by MO-CVD (Metal Organic-Chemical Vapor Deposition) using plasma.

Then, copper paste was applied and filled into the fine holes by the screen printing method, then was subjected to a curing treatment (170° C., 20 minutes). Thereafter, the copper paste protruding from the surface of the core member was polished to be removed to thereby obtain the core member wherein the surface of the core member and the paste filled in the fine holes formed the same plane. In this core member, an opening diameter of the fine hole was 100 μm, and the inside of the fine hole was filled with the conductive material.

Then, a buildup multilayer wiring layer was formed on one surface of the core member by the semi-additive method. Specifically, a two-layer film of Cr/Cu with a thickness of about 0.5 μm was formed on the whole surface of the board as a conductive thin film layer by sputtering, then a liquid resist for plating (LA900 manufactured by Tokyo Ohka Kogyo Co., Ltd.) was spinner-applied, then exposed using a photomask for a first layer wiring pattern, and developed, thereby to form a resist pattern having a thickness of 5 μm. Then, Cu was plated in a thickness of 4 μm onto opening portions of the resist by electrolytic plating. Thereafter, the unnecessary Cr/Cu layer was removed by soft etching to form a first wiring layer.

Then, a photosensitive benzocyclobutene resin composition (CYCLOTENE 4042 manufactured by The Dow Chemical Company) was patterned to be formed as an insulating layer, then a conductive thin film layer for plating base was formed on the whole surface of the board by sputtering. The conductive thin film layer was formed of Cu in a thickness of about 0.5 μm.

Subsequently, a liquid resist for plating (LA900 manufactured by Tokyo Ohka Kogyo Co., Ltd.) was applied, then exposed using a photomask for a second layer wiring pattern, and developed, thereby to form a resist pattern having a thickness of 5 μm. Then, Cu was plated in a thickness of 4 μm onto opening portions of the resist by electrolytic plating.

Then, the resist was peeled off, and the unnecessary conductive thin film layer for plating base that was exposed at portions other than those portions subjected to electrolytic plating, was removed by soft etching to thereby obtain a second wiring layer having desired vias and wiring patterns.

A third wiring layer was formed similarly, and a patterned insulating layer was provided thereon to form a buildup multilayer wiring layer.

Then, adhesive tape was stuck to the side where the multilayer wiring layer was formed, and the silicon board was ground to a thickness of 200 μm by a diamond grinder to expose the fine holes, thereby to change them into penetrating through holes. In this embodiment, substantially vertical through holes filled with the conductive material were obtained.

Then, desired positions (opening portions of the through holes to be connected to wiring layers) on the core board on the polished side were masked, and a film of $SrBaTiO_3$ was formed by sputtering using an RF magnetron sputtering device and annealed. Thereby, a dielectric layer was formed except at the opening portions of the through holes to be connected to the wiring layers. Subsequently, a thin film (0.2 μm in thickness) of Cu was formed on the dielectric layer by sputtering, and further, Cu was subjected to electrolytic plating to obtain a thickness of 3 μm. This Cu film was patterned by the photolithography method. Thereby, the wiring layers connected to the conductive material in the through holes and lower electrodes were formed. Thereby, there was obtained a multilayer wiring board having capacitors each comprising an upper electrode being the conductive material in the through hole not opened, and the lower electrode via the dielectric layer.

Then, an electrical property of the multilayer wiring board according to the manufacture method of the present invention was examined, and it was confirmed that, by using the built-in capacitors as decoupling capacitors, switching noise was able to be largely reduced without lowering the mounting density, as compared with the case where capacitors were externally attached as electronic components.

EXAMPLE 4

A glass board having a thickness of 300 μm was prepared as a core member, and a photosensitive dry film resist (OR-DYL manufactured by Tokyo Ohka Kogyo Co., Ltd.) was laminated onto one surface of the core member, then exposed using a photomask for through hole formation, and developed, thereby to form a mask pattern. The mask pattern was formed with circular openings having a diameter of 150 μm and arranged at a pitch of 300 to 500 μm.

Then, using this mask pattern as a mask, the core member was formed with fine holes by the sandblasting method. This fine hole had an opening diameter of 150 μm, a depth of 250 μm, and an inner diameter at a bottom portion of 80 μm, and had a tapered shape. Subsequently, the mask pattern was removed from the core member by acetone.

Then, copper paste was filled into the fine holes of the core member by the screen printing method, then was subjected to a heat treatment at 170° C. for 20 minutes, thereafter, the copper paste cured and protruding from the surface of the core member was polished to be removed so that the surfaces of the copper paste and the surface of the core member formed the same surface.

Then, like in Example 3, a buildup multilayer wiring layer was formed on one surface of the core board by the semi-additive method.

Then, adhesive tape was stuck to the side where the multilayer wiring layer was formed, and the glass board was ground to a thickness of 200 μm by a diamond grinder to expose the fine holes, thereby to change them into penetrating through holes. In this embodiment, tapered through holes filled with the conductive material were obtained.

Then, on the core member on the polished side, a photosensitive benzocyclobutene resin composition (CYCLO-TENE 4042 manufactured by The Dow Chemical Company) was applied as a dielectric layer by the spinner application method. Then, it was exposed and developed to form a pattern using a desired photomask, thereafter, the resin was cured by heat curing. Thereby, an insulating layer having openings for forming wiring layers to be connected to the conductive material of the through holes, was formed.

Then, a conductive thin film layer for plating base was formed on the whole surface of the board by sputtering. The conductive thin film layer was formed of Cu in a thickness of about 0.2 μm.

Subsequently, a liquid resist for plating (LA900 manufactured by Tokyo Ohka Kogyo Co., Ltd.) was spinner-applied, then exposed using a photomask having a wiring pattern, and developed, thereby to form a resist pattern having a thickness of 5 μm. Then, Cu was plated in a thickness of 3 μm onto opening portions of the resist by electrolytic plating.

Then, the resist was peeled off, and the unnecessary conductive thin film layer for plating base that was exposed at portions other than those portions subjected to electrolytic plating, was removed by soft etching. Thereby, there was obtained a multilayer wiring board having the wiring layers connected to the conductive material in the through holes, and having capacitors each comprising an upper electrode being the conductive material in the through hole not opened, and a lower electrode via the dielectric layer.

An electrical property of the multilayer wiring board according to the manufacture method of the present invention was examined and, like in Example 3, it was confirmed that, by using the built-in capacitors as decoupling capacitors, switching noise was able to be largely reduced.

EXAMPLE 5

Like in Example 1, a core board flattened by electrically insulating layers was prepared.

Then, like in Example 3, a buildup multilayer wiring layer was formed on one surface of the core board.

Then, desired positions (opening portions of the through holes to be connected to wiring layers) on the other surface of the core board were masked, and a film of $SrBaTiO_3$ was formed by sputtering using an RF magnetron sputtering device and annealed. Thereby, a dielectric layer was formed except at the opening portions of the through holes to be connected to the wiring layers. Subsequently, a thin film (0.2 μm in thickness) of Cu was formed on the dielectric layer by sputtering, and further, Cu was subjected to electrolytic plating to obtain a thickness of 3 μm. This Cu film was patterned by the photolithography method. Thereby, the wiring layers connected to the through holes and lower electrodes were formed. Thereby, there was obtained a multilayer wiring board having capacitors each comprising an upper electrode being the conductive material in the through hole not opened, and the lower electrode via the dielectric layer.

Then, an electrical property of the multilayer wiring board according to the manufacture method of the present invention was examined, and it was confirmed that, by using the built-in capacitors as decoupling capacitors, switching noise was able to be largely reduced without lowering the mounting density, as compared with the case where capacitors were externally attached as electronic components.

INDUSTRIAL APPLICABILITY

It is applicable to semiconductor devices, various electronic devices, and the like that are required to be small in size and highly reliable.

The invention claimed is:

1. A manufacture method of a multilayer wiring board comprising a core board, and a wiring layer and an electrically insulating layer that are stacked on one surface or both surfaces of said core board, said manufacture method comprising:

forming through holes in a core member used for said core board, said core member having a thermal expansion coefficient in XY directions that falls within a range of 2 to 20 ppm, and selected from silicon, ceramics, glass, and a glass-epoxy composite;

masking, after forming said through holes, both surfaces of said core member other than said through holes and land forming regions using resists;

filling, after the masking, a conductive material into said through holes and said land forming regions, then polishing both surfaces of said core member, and then peeling off said resists to form said core board;

forming an electrically insulating layer at predetermined portions of said core board after the filling, polishing, and peeling off; and forming wiring layers on one surface or both surfaces of said core board via said electrically insulating layer after the forming the electrically insulating layer.

2. The manufacture method of a multilayer wiring board according to claim 1, wherein the filling the conductive material comprises either forming a conductive film in said through holes from one surface of said core member by a vacuum film forming method so as to serve as a seed layer and, using said seed layer, depositing metal and filling in said through holes by electrolytic plating, or forming a conductive substance diffusion preventing layer in said through holes by an MO-CVD method, then forming conductive film in said through holes from one surface of said core member by a vacuum film forming method so as to serve as a seed layer and, using said seed layer, depositing metal and filling in said through holes by electrolytic plating.

3. The manufacture method of a multilayer wiring board according to claim 1, wherein the filling the conductive material fills conductive paste.

4. The manufacture method of a multilayer wiring board according to claim 1, wherein, after forming the through holes, further comprising forming a conductive substance diffusion preventing layer on inner wall surfaces of said through holes.

5. The manufacture method of a multilayer wiring board according to claim 4, wherein the forming said conductive substance diffusion preventing layer comprises an MO-CVD method.

6. The manufacture method of a multilayer wiring board according to claim 1, wherein the forming said through holes comprises an ICP-RIE method or a sandblasting method.

7. The manufacture method of a multilayer wiring board according to claim 1, wherein the forming said through holes uses an ICP-RIE method on the side where an opening diameter of said through hole is small, and uses a sandblasting method on the side where the opening diameter is large.

8. The manufacture method of a multilayer wiring board according to claim 1, wherein the forming said through holes forms fine holes in the core member, then polishes the core member to form penetrating holes.

9. The manufacture method of a multilayer wiring board according to claim 1, wherein the forming said through holes polishes the core member to a desired thickness, then grinds the core member from one surface or both surfaces thereof by a sandblasting method to form penetrating holes.

* * * * *